(12) United States Patent
Okita et al.

(10) Patent No.: US 12,478,997 B2
(45) Date of Patent: Nov. 25, 2025

(54) SUBSTRATE PROCESSING METHOD AND SUBSTRATE PROCESSING APPARATUS

(71) Applicant: SCREEN Holdings Co., Ltd., Kyoto (JP)

(72) Inventors: Yuji Okita, Kyoto (JP); Hideji Naohara, Kyoto (JP); Hiroaki Kakuma, Kyoto (JP); Tatsuya Masui, Kyoto (JP); Yuichi Deba, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 431 days.

(21) Appl. No.: 17/924,644

(22) PCT Filed: May 12, 2021

(86) PCT No.: PCT/JP2021/018027
§ 371 (c)(1),
(2) Date: Nov. 10, 2022

(87) PCT Pub. No.: WO2021/241228
PCT Pub. Date: Dec. 2, 2021

(65) Prior Publication Data
US 2023/0241634 A1 Aug. 3, 2023

(30) Foreign Application Priority Data
May 27, 2020 (JP) ................ 2020-092559

(51) Int. Cl.
*B05B 12/08* (2006.01)
*B05B 13/02* (2006.01)
*B08B 3/02* (2006.01)

(52) U.S. Cl.
CPC ............ *B05B 12/084* (2013.01); *B05B 13/02* (2013.01); *B08B 3/02* (2013.01)

(58) Field of Classification Search
CPC ......... B05B 12/084; B05B 13/02; B08B 3/02; G06T 7/0008; G06T 2207/30148;
(Continued)

(56) References Cited

U.S. PATENT DOCUMENTS 7,827,930 B2 11/2010 Lubomirsky et al.
10,217,628 B2 2/2019 Amano et al.
(Continued)

FOREIGN PATENT DOCUMENTS

CN 101350930 A 1/2009
CN 107275200 A 10/2017
(Continued)

OTHER PUBLICATIONS

Notice of Reasons for Refusal dated Nov. 28, 2023 in corresponding Japanese Patent Application No. 2020-092559 and a computer generated English translation obtained from the JPO.
(Continued)

*Primary Examiner* — Hung V Nguyen
(74) *Attorney, Agent, or Firm* — OSTROLENK FABER LLP

(57) ABSTRACT

A substrate processing method includes: a holding step of carrying a substrate into an inside of a chamber and holding said substrate; a supply step of supplying a fluid to the substrate on the inside of the chamber; an imaging step of sequentially imaging the inside of the chamber by a camera to acquire image data; a condition setting step of specifying a monitoring target and changing an image condition based on the monitoring target; and a monitoring step of performing a monitoring process on the monitoring target based on the image data having the image condition corresponding to the monitoring target.

11 Claims, 31 Drawing Sheets

(58) Field of Classification Search
CPC ......... H01L 21/67051; H01L 21/67103; H01L 21/6719; H01L 21/67253; H01L 21/027; H01L 21/304; H01L 21/306; B05C 11/10; B05C 11/08
See application file for complete search history.

(56) References Cited

U.S. PATENT DOCUMENTS

| | | | |
|---|---|---|---|
| 11,322,415 | B2* | 5/2022 | Naohara ........... H01L 21/67253 |
| 11,823,922 | B2* | 11/2023 | Kiyotomi ............... G06V 10/98 |
| 2005/0060104 | A1 | 3/2005 | Strader |
| 2007/0173053 | A1 | 7/2007 | Fukuchi |
| 2008/0100809 | A1 | 5/2008 | Nakashima et al. |
| 2009/0021597 | A1 | 1/2009 | Kameya |
| 2010/0216259 | A1 | 8/2010 | Nakashima |
| 2011/0261345 | A1 | 10/2011 | Takaiwa et al. |
| 2013/0236088 | A1* | 9/2013 | Umehara ................ G06T 7/001 382/149 |
| 2015/0262848 | A1 | 9/2015 | Sano et al. |
| 2017/0228426 | A1 | 8/2017 | Schechter et al. |
| 2017/0263478 | A1 | 9/2017 | McChesney et al. |
| 2017/0287750 | A1 | 10/2017 | Amano et al. |
| 2018/0069992 | A1 | 3/2018 | Kakuma |
| 2019/0043742 | A1 | 2/2019 | Amano et al. |
| 2019/0217325 | A1 | 7/2019 | deVilliers |
| 2019/0217326 | A1 | 7/2019 | deVilliers |
| 2019/0217327 | A1 | 7/2019 | deVilliers |
| 2019/0217328 | A1 | 7/2019 | deVilliers |
| 2019/0259172 | A1 | 8/2019 | Kakuma et al. |
| 2020/0111715 | A1 | 4/2020 | Naohara et al. |
| 2021/0043482 | A1 | 2/2021 | Okamura et al. |
| 2021/0257236 | A1 | 8/2021 | Amano et al. |
| 2022/0216117 | A1 | 7/2022 | Naohara et al. |
| 2022/0400232 | A1 | 12/2022 | Kunugimoto et al. |

FOREIGN PATENT DOCUMENTS

| | | |
|---|---|---|
| CN | 111009460 A | 4/2020 |
| CN | 111009477 A | 4/2020 |
| JP | 2008-135679 A | 6/2008 |
| JP | 2013-214279 A | 10/2013 |
| JP | 2014-183164 A | 9/2014 |
| JP | 2015-173148 A | 10/2015 |
| JP | 2016-122681 A | 7/2016 |
| JP | 2017-029883 A | 2/2017 |
| JP | 2017-183496 A | 10/2017 |
| JP | 2018-160691 A | 10/2018 |
| JP | 2020-061404 A | 4/2020 |
| JP | 2020-061405 A | 4/2020 |
| KR | 10-2011-0126572 A | 11/2011 |
| TW | I345806 B | 7/2011 |
| TW | 201823689 A | 7/2018 |
| TW | 201906042 A | 2/2019 |
| TW | 201939637 A1 | 10/2019 |
| WO | WO 2019/146456 A1 | 8/2019 |
| WO | WO 2021/095612 A1 | 5/2021 |

OTHER PUBLICATIONS

Notice of Opinion For Examination with Search Report dated May 28, 2024 in corresponding Taiwanese Patent Application No. 113107144 and a machine generated English translation based on a Japanese translation of the Office Action.
International Search Report mailed Jul. 27, 2021 in corresponding PCT International Application No. PCT/JP2021/018027.
Written Opinion mailed Jul. 27, 2021 in corresponding PCT International Application No. PCT/JP2021/018027.
Office Action and Search Report dated Mar. 24, 2022 in corresponding Taiwanese Patent Application No. 110118359 and partial English translation made from the Japanese translation of the original communication.
Notice of Reasons for Refusal dated Oct. 8, 2024 in corresponding Japanese Patent Application No. 2024-024278 and a computer generated English translation obtained from the JPO.
Extended European Search Report and Opinion dated Jul. 1, 2024 in corresponding European Patent Application No. EP 21812075.
Motorola: "Video Surveillance Trade-Offs A Question of Balance: Finding the Right Combination of Image Quality, Frame Rate and Bandwidth," Dec. 30, 2012, XP093174218, Illinois USA.
Request for the Submission of an Opinion dated Jul. 8, 2024 in corresponding Korean Patent Application No. 10-2022-7041083 and an English machine language translation obtained from the Global Dossier.
Notice of Reasons for Refusal dated Sep. 5, 2023 in corresponding Japanese Patent Application No. 2020-092559 and a computer generated English translation obtained from the JPO.
Office Action with Search Report dated Jul. 9, 2025 in corresponding Chinese Patent Application No. 202180038150.X with English language translation.

* cited by examiner

FIG. 7

| STEP | TIME | EJECTION FLOW RATE | | | | POSITION | | | MONITORING PROCESS | | CONDITION | |
|---|---|---|---|---|---|---|---|---|---|---|---|---|
| | | FIRST NOZZLE | SECOND NOZZLE | THIRD NOZZLE | FIXED NOZZLE | FIRST NOZZLE | SECOND NOZZLE | THIRD NOZZLE | POSITION | PROCESSING LIQUID | RESOLUTION | FRAME RATE |
| ST1 | t1 | 0 | 0 | 0 | 0 | P33 | P63 | P68 | | | | |
| ST2 | t2 | 0 | 0 | 0 | 0 | P31 | P63 | P68 | EXECUTED | | HIGH | LOW |
| ST3 | t3 | F30 | 0 | 0 | 0 | P31 | P63 | P68 | | | LOW | HIGH |
| ST4 | t4 | 0 | 0 | 0 | 0 | P32 | P63 | P68 | EXECUTED | EXECUTED | HIGH | HIGH |
| ST5 | t5 | 0 | 0 | 0 | 0 | P33 | P63 | P68 | | EXECUTED | | |
| ST6 | t6 | 0 | F60 | 0 | 0 | P33 | P62 | P68 | EXECUTED | | HIGH | LOW |
| ST7 | t7 | 0 | 0 | 0 | F80 | P33 | P61 | P68 | EXECUTED | EXECUTED | HIGH | HIGH |
| ST8 | t8 | 0 | 0 | 0 | F80 | P33 | P63 | P68 | EXECUTED | EXECUTED | | |
| ST9 | t9 | 0 | 0 | 0 | 0 | P33 | P63 | P69 | EXECUTED | | HIGH | LOW |
| ST10 | t10 | 0 | 0 | F65 | 0 | P33 | P63 | P69 | EXECUTED | EXECUTED | LOW | HIGH |
| ST11 | t11 | 0 | 0 | 0 | 0 | P33 | P63 | P66 | | | HIGH | LOW |
| ST12 | t12 | 0 | 0 | 0 | 0 | P33 | P63 | P68 | | | | |

FIG. 21

| | MONITORING TARGET | RESOLUTION | FRAME RATE |
|---|---|---|---|
| POSITION OR SHAPE OF OBJECT | POSITION ABNORMALITY AND SHAPE ABNORMALITY OF NOZZLE | HIGH | LOW |
| | HOLDING ABNORMALITY, SUBSTRATE SHAPE ABNORMALITY (CLACKING) CARRY-IN POSITION ABNORMALITY, ECCENTRICITY ABNORMALITY | | |
| | POSITION ABNORMALITY AND SHAPE ABNORMALITY OF PROCESSING CUP | | |
| STATE CHANGE OVER TIME IN PROCESSING LIQUID | EJECTION START, EJECTION STOP, LIQUID SPLASH, DRIPPING, AND OUTFLOW OF PROCESSING LIQUID | LOW | HIGH |

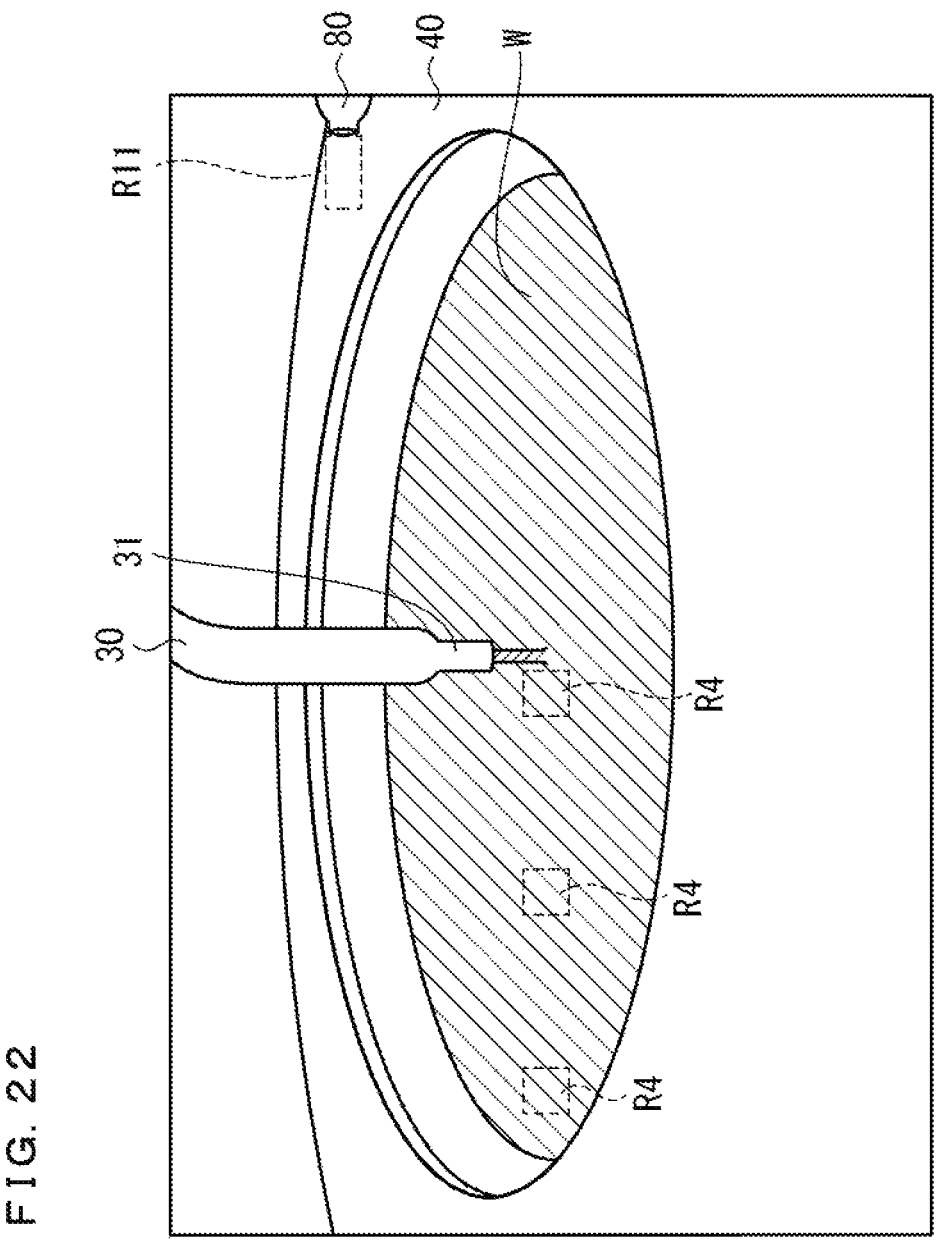

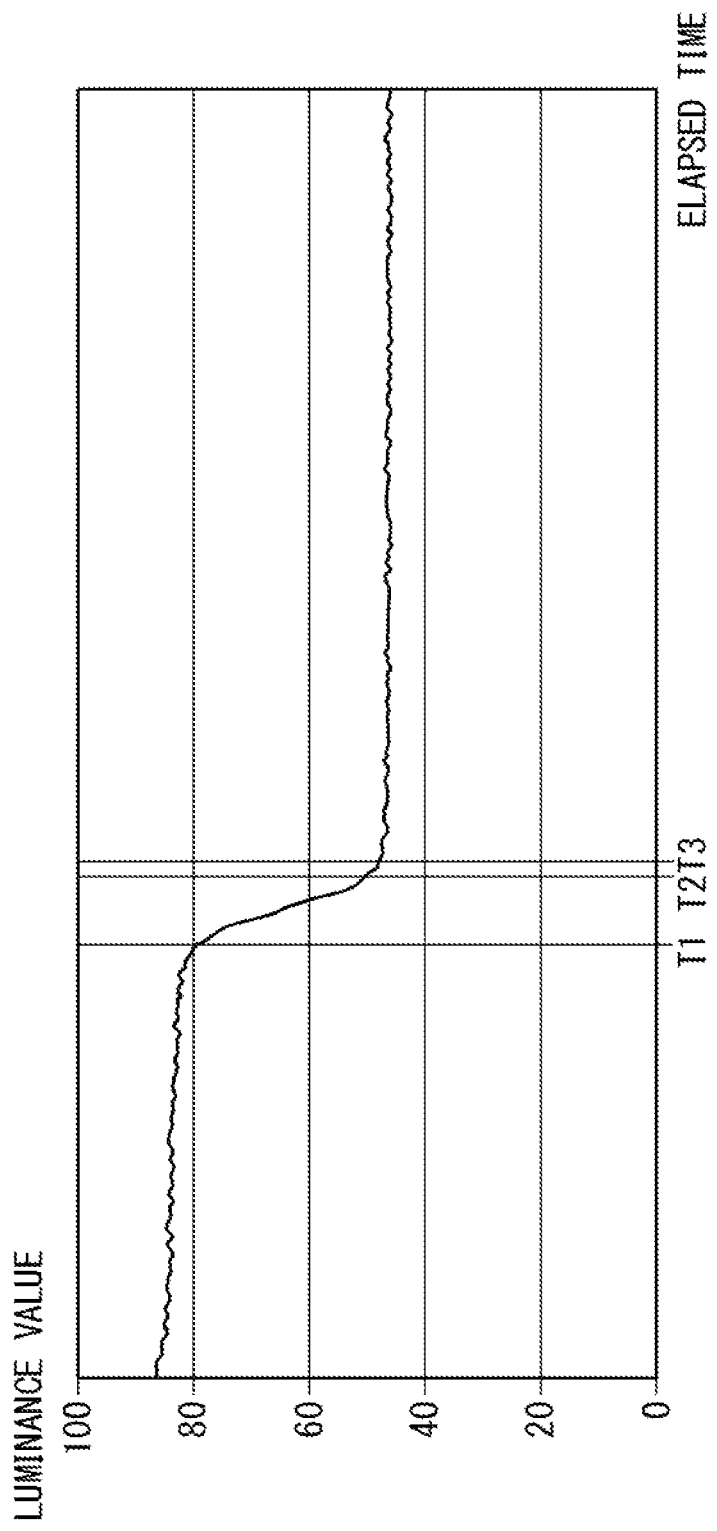

FIG. 32

| MONITORING TARGET | VISUAL FIELD | RESOLUTION | FRAME RATE |
|---|---|---|---|
| HOLDING ABNORMALITY | SMALL | HIGH | LOW |
| SUBSTRATE SHAPE ABNORMALITY | SMALL | HIGH/LOW | LOW |
| NOZZLE POSITION | SMALL | HIGH | LOW |
| EJECTION START, EJECTION STOP, DRIPPING, OUTFLOW, AND LIQUID SPLASH OF PROCESSING LIQUID | SMALL | LOW | HIGH |
| ETCHING ENDPOINT | SMALL | LOW | LOW |
| DRYING ABNORMALITY | SMALL | LOW | LOW |
| FUME ABNORMALITY | LARGE | LOW | LOW |
| POSITION ABNORMALITY AND SHAPE ABNORMALITY OF CUP | LARGE | HIGH | LOW |
| CRYSTAL ABNORMALITY | LARGE | LOW | LOW |
| EJECTION ABNORMALITY OF CLEANING IN CHAMBER | LARGE | LOW | LOW | ly large
SUBSTRATE PROCESSING METHOD AND SUBSTRATE PROCESSING APPARATUS

CROSS-REFERENCE TO RELATED APPLICATIONS

The present application is a 35 U.S.C. §§ 371 national phase conversion of International Application No. PCT/JP2021/018027, filed May 12, 2021, which claims priority to Japanese Patent Application No. 2020-092559, filed May 27, 2020, the contents of both of which are incorporated herein by reference. The PCT International Application was published in the Japanese language.

TECHNICAL FIELD

The present application relates to a substrate processing method and a substrate processing apparatus.

BACKGROUND ART

Conventionally, in a manufacturing process for a semiconductor device or the like, various processing liquids such as pure water, a photoresist liquid, and an etching liquid are supplied to a substrate to perform various sorts of substrate processing such as a cleaning process and a resist coating process. As an apparatus for performing substrate processing using these processing liquids, a substrate processing apparatus that ejects a processing liquid from a nozzle to a surface of a substrate while rotating the substrate in a horizontal orientation is used widely.

In such a substrate processing apparatus, whether or not the processing liquid is being ejected from the nozzle is checked. As a method for more reliably determining whether or not the ejection is being performed, for example, Patent Documents 1 and 2 propose that imaging means such as a camera is provided to directly monitor the ejection of the processing liquid from the nozzle.

PRIOR ART DOCUMENTS

Patent Documents

Patent Document 1: Japanese Patent Application Laid-Open No. 2008-135679
Patent Document 2: Japanese Patent Application Laid-Open No. 2015-173148

SUMMARY

Problem to be Solved by the Invention

However, in order to appropriately process the substrate, it is desirable to monitor not only the processing liquid but also more monitoring targets. However, the monitoring target changes, for example, depending on the progress status of the substrate processing. As a specific example, in a movement period when the nozzle moves to a processing position above the substrate and stops, the stop position of the nozzle is monitored as a monitoring target. In a period of ejection of the processing liquid performed subsequently, the eject state of the processing liquid ejected from the nozzle is monitored as a monitoring target.

When image data is acquired under an image condition common to the various monitoring targets as thus described, the image data cannot necessarily be acquired under an image condition suitable for all the monitoring targets. For example, when image data is acquired in a wide visual field range at a high resolution and a high frame rate, the data amount of the image data becomes unnecessarily large depending on the monitoring target, and hence the processing load in the monitoring step becomes unnecessarily large.

Therefore, the present application has been made in view of the above problems, and an object thereof is to provide a technique capable of performing a monitoring process on each of a plurality of monitoring targets based on more appropriate image data.

Means to Solve the Problem

A first aspect of a substrate processing method is a substrate processing method including: a holding step of carrying a substrate into an inside of a chamber and holding the substrate; a supply step of supplying a fluid to the substrate on the inside of the chamber; an imaging step of sequentially imaging the inside of the chamber by a camera to acquire image data; a condition setting step of specifying a monitoring target and changing an image condition based on the monitoring target; and a monitoring step of performing a monitoring process on the monitoring target based on the image data having the image condition corresponding to the monitoring target.

A second aspect of the substrate processing method is the substrate processing method according to the first aspect, in which the image condition includes at least one of resolution and a frame rate of the image data and a size of a visual field range projected in the image data.

A third aspect of the substrate processing method is the substrate processing method according to the second aspect, in which in the condition setting step, the frame rate is set to a first frame rate as the image condition of the image data in a first period when at least one of a shape and a position of an object in the chamber is taken as the monitoring target, and the frame rate is set to a second frame rate higher than the first frame rate as the image condition of the image data in a second period when a state change over time in a processing liquid ejected as the fluid from a nozzle in the chamber is taken as the monitoring target.

A fourth aspect of the substrate processing method is the substrate processing method according to the third aspect, in which in the condition setting step, the frame rate is set to the second frame rate as the image condition of the image data in a third period when at least one of a shape and a position of an object in the chamber and a state change over time in the processing liquid are taken as the monitoring target.

A substrate processing method according to a fifth aspect is the substrate processing method according to any one of the second to fourth aspects, in which the resolution is set to a first resolution as the image condition of the image data in a first period when at least one of a shape and a position of an object in the chamber is taken as the monitoring target, and the resolution is set to a second resolution lower than the first resolution as the image condition of the image data in a second period when a state change over time in a processing liquid ejected as the fluid from a nozzle in the chamber is taken as the monitoring target.

A substrate processing method according to a sixth aspect is the substrate processing method according to the fifth aspect, in which in the condition setting step, the resolution is set to the first resolution as the image condition of the image data in a third period when at least one of a shape and a position of an object in the chamber and a state change over time in the processing liquid are taken as the monitoring target.

A seventh aspect of the substrate processing method is the substrate processing method according to any one of the third to sixth aspects, in which the monitoring target including at least one of the shape and the position of the object includes at least one of: at least one of a shape and a position of the substrate; at least one of a shape and a position of the nozzle; and at least one of a shape and a position of a processing cup that receives the fluid scattered from a periphery of the substrate.

An eighth aspect of the substrate processing method is the substrate processing method according to any one of the third to seventh aspects, in which the monitoring target including the state change over time in the processing liquid includes at least one of an ejection start timing and an ejection stop timing of the processing liquid, a liquid splash of the processing liquid on the substrate, and dripping and outflow of the processing liquid from the nozzle.

A ninth aspect of the substrate processing method is the substrate processing method according to any one of the second to eighth aspects, in which in the condition setting step, the frame rate is set to a first frame rate as the image condition of the image data in a fourth period when occurrence or non-occurrence of a first abnormality occurring in a first occurrence period in the chamber is taken as the monitoring target, and the frame rate is set to a second frame rate higher than the first frame rate as the image condition of the image data in a fifth period when occurrence or non-occurrence of a second abnormality occurring in a second occurrence period shorter than the first occurrence period in the chamber is taken as the monitoring target.

A substrate processing method according to a tenth aspect is the substrate processing method according to any one of the first to ninth aspects, in which the condition setting step includes a step of setting the image condition as an imaging condition, and in the imaging step, the camera acquires the image data using the image condition corresponding to the monitoring target as an imaging condition.

A substrate processing method according to an eleventh aspect is the substrate processing method according to any one of the first to ninth aspects, in which in the imaging step, the camera acquires the image data under a predetermined imaging condition, and image processing is performed on the image data acquired by the camera to acquire the image data having the image condition corresponding to the monitoring target.

An aspect of a substrate processing apparatus is a substrate processing apparatus including: a substrate holder that holds a substrate on an inside of a chamber; a nozzle that supplies a fluid to the substrate on the inside of the chamber; a camera that sequentially images the inside of the chamber to acquire image data; and a controller that specifies a monitoring target, changes an image condition based on the monitoring target, and performs a monitoring process on the monitoring target based on the image data having the image condition corresponding to the monitoring target.

Effects of the Invention

According to the first, second, seventh, and eighth aspects of the substrate processing method and the aspect of the substrate processing apparatus, the monitoring process for each of the plurality of monitoring targets can be performed based on more appropriate image data.

According to the third aspect of the substrate processing method, when at least one of the position and the shape of the object is a monitoring target, the frame rate is set to the first frame rate that is low. Thus, the processing load can be reduced. On the other hand, the frame rate is set to the second frame rate, which is high, when the state change over time in the processing liquid is the monitoring target. Thus, a state change of the processing liquid can be monitored with higher accuracy.

According to the fourth aspect of the substrate processing method, since the frame rate is set to the second frame rate that is high, the state change of the processing liquid can be monitored appropriately.

According to the fifth aspect of the substrate processing method, in the second period when the state change over time in the processing liquid is the monitoring target, the resolution is set to the second resolution that is low. Thus, the processing load can be reduced. On the other hand, in the first period when at least one of the position and the shape of the object is the monitoring target, the resolution is set to the first resolution that is high. Thus, at least one of the position and the shape of the object can be monitored with higher accuracy.

According to the sixth aspect of the substrate processing method, since the resolution is set to the first resolution that is high, at least one of the shape and the position of the object can be monitored appropriately.

According to the ninth aspect of the substrate processing method, for the first abnormality with a long occurrence period, the frame rate is set to the first frame rate, which is low, so that the occurrence or non-occurrence of the first abnormality can be monitored with a low processing load. For the second abnormality with a short occurrence period, the frame rate is set to the second frame rate that is high, so that the occurrence or non-occurrence of the second abnormality can be monitored.

According to the tenth aspect of the substrate processing method, since the camera acquires the image data under the imaging condition corresponding to the monitoring target, the monitoring process can be performed using the image data corresponding to the monitoring target.

According to the eleventh aspect of the substrate processing method, even when the camera cannot change the imaging condition, the image data having the image condition corresponding to the monitoring target can be obtained.

BRIEF DESCRIPTION OF DRAWINGS

FIG. 7 is a table showing an example of specific steps of a processing liquid step.

FIG. 21 is a table showing an example of monitoring targets and imaging conditions.

FIG. 22 is a view schematically showing an example of the captured image data.

FIG. 23 is a graph schematically showing an example of a change over time in a luminance value.

FIG. 32 is a table showing an example of monitoring targets and imaging conditions.

DESCRIPTION OF EMBODIMENT

Figure 1:
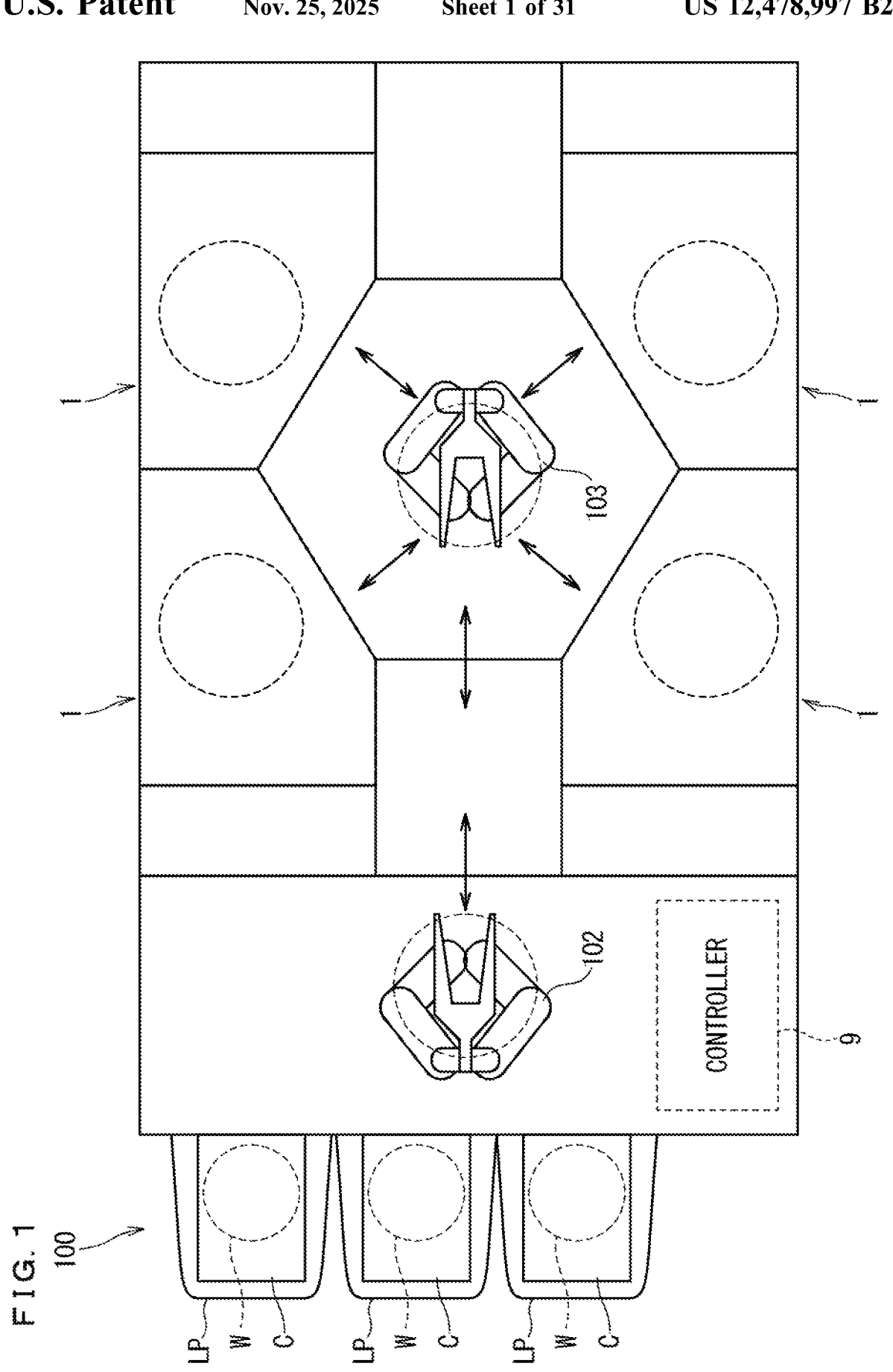
FIG. 1 is a view schematically showing an example of an overall configuration of a substrate processing apparatus.

Hereinafter, an embodiment will be described with reference to the attached drawings. Note that the drawings are schematically shown, and omission of the configuration or simplification of the configuration may be made as appropriate for the convenience of description. The interrelationships among sizes and positions of configurations shown in the drawings are not necessarily accurately described but may be changed as appropriate.

Moreover, in the description shown below, similar components are shown with the same symbol, and it is assumed that this also applies to the names and functions of those components. Accordingly, detailed descriptions of those may be omitted to avoid duplication.

In addition, in the description described below, even when an ordinal number such as "first" or "second" is used, these terms are to be used for the sake of convenience to facilitate the understanding of the contents of the embodiment, and the order or the like which may occur by these ordinal numbers is not restrictive.

Unless otherwise specified, an expression that indicates a relative or absolute positional relationship (e.g., "in one direction", "along one direction", "parallel", "orthogonal", "center", "concentric", "coaxial", etc.) not only precisely represents the positional relationship but also represents the state of relative displacement with respect to an angle or a distance within a range where a tolerance or a similar function can be obtained. Unless otherwise specified, an expression indicating an equal state (e.g., "same", "equal", "homogeneous", etc.) not only represents a precisely and quantitatively equal state but also represents a state where there is a difference in which a tolerance or a similar function is obtained. Unless otherwise specified, an expression indicating a shape (e.g., "square shape", "cylindrical shape", etc.) not only represents the shape geometrically and precisely but also represents a shape having unevenness, chamfering, or the like within a range where a similar effect can be obtained. The expression of "comprising", "being provided with", "including", or "having" one component is not an exclusive expression excluding the presence of other components. The expression of "at least any one of A, B, and C" includes only A, only B, only C, any two of A, B and C, and all of A, B and C.

<Overall Configuration of Substrate Processing Apparatus>

FIG. 1 is a schematic plan view for explaining an example of an internal layout of a substrate processing apparatus 100 according to the present embodiment. As shown in FIG. 1, a substrate processing apparatus 100 is a single wafer type processing apparatus that processes substrates W to be processed one by one.

The substrate processing apparatus 100 according to the present embodiment performs a cleaning process on a substrate W, which is a silicon substrate having a circular thin plate shape, using a chemical liquid and a rinse liquid such as pure water, and then performs a drying process.

As the chemical liquid, for example, a mixed liquid of ammonia and a hydrogen peroxide (SC1), a mixed aqueous solution of hydrochloric acid and a hydrogen peroxide (SC2), or a dilute hydrofluoric acid (DHF) liquid is used.

In the following description, a chemical liquid, a rinse liquid, an organic solvent, and the like are collectively referred to as a "processing liquid". Note that not only the cleaning process but also a chemical liquid for removing an unnecessary film, a chemical liquid for etching, or the like is included in the "processing liquid".

The substrate processing apparatus 100 includes a plurality of processing units 1, a load port LP, an indexer robot 102, a main transport robot 103, and a controller 9.

As the carrier, a front opening unified pod (FOUP) that accommodates the substrate W in a sealed space, a standard mechanical interface pod (SMIF), or an open cassette (OC) that exposes the substrate W to outside air may be adopted. Further, a transfer robot transfers the substrate W between the carrier and the main transport robot 103.

The processing unit 1 performs a liquid process and a drying process on one substrate W. In the substrate processing apparatus 100 according to the present embodiment, 12 processing units 1 having the same configuration are arranged.

Specifically, four towers each including three processing units 1 stacked in the vertical direction are arranged so as to surround the main transport robot 103.

FIG. 1 schematically shows one of the three stacked processing units 1. Note that the number of processing units 1 in the substrate processing apparatus 100 is not limited to 12 but may be changed as appropriate.

The main transport robot 103 is installed at the center of the four towers in which the processing units 1 are stacked. The main transport robot 103 carries the substrate W to be processed received from the indexer robot 102 into each processing unit. Further, the main transport robot 103 carries the processed substrate W out of each processing unit 1 and passes the substrate W to the indexer robot 102. The controller 9 controls the operation of each component of the substrate processing apparatus 100.

Hereinafter, one of the 12 processing units 1 mounted on the substrate processing apparatus 100 will be described, but the other processing units 1 have the same configuration except that the arrangement relationship of the nozzles is different.

<Processing Unit>

Figure 2:
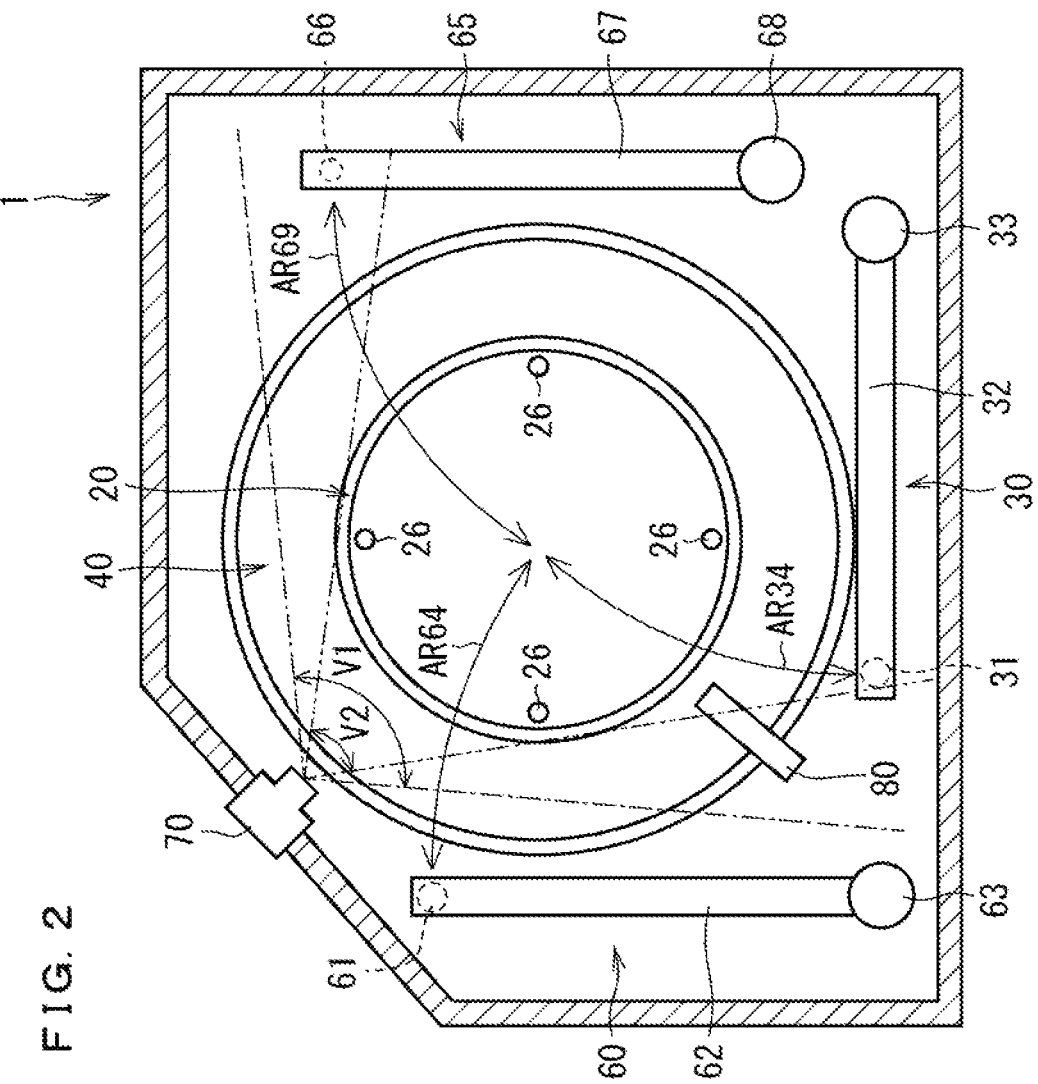
FIG. 2 is a plan view schematically showing an example of a configuration of a processing unit.
Figure 3:
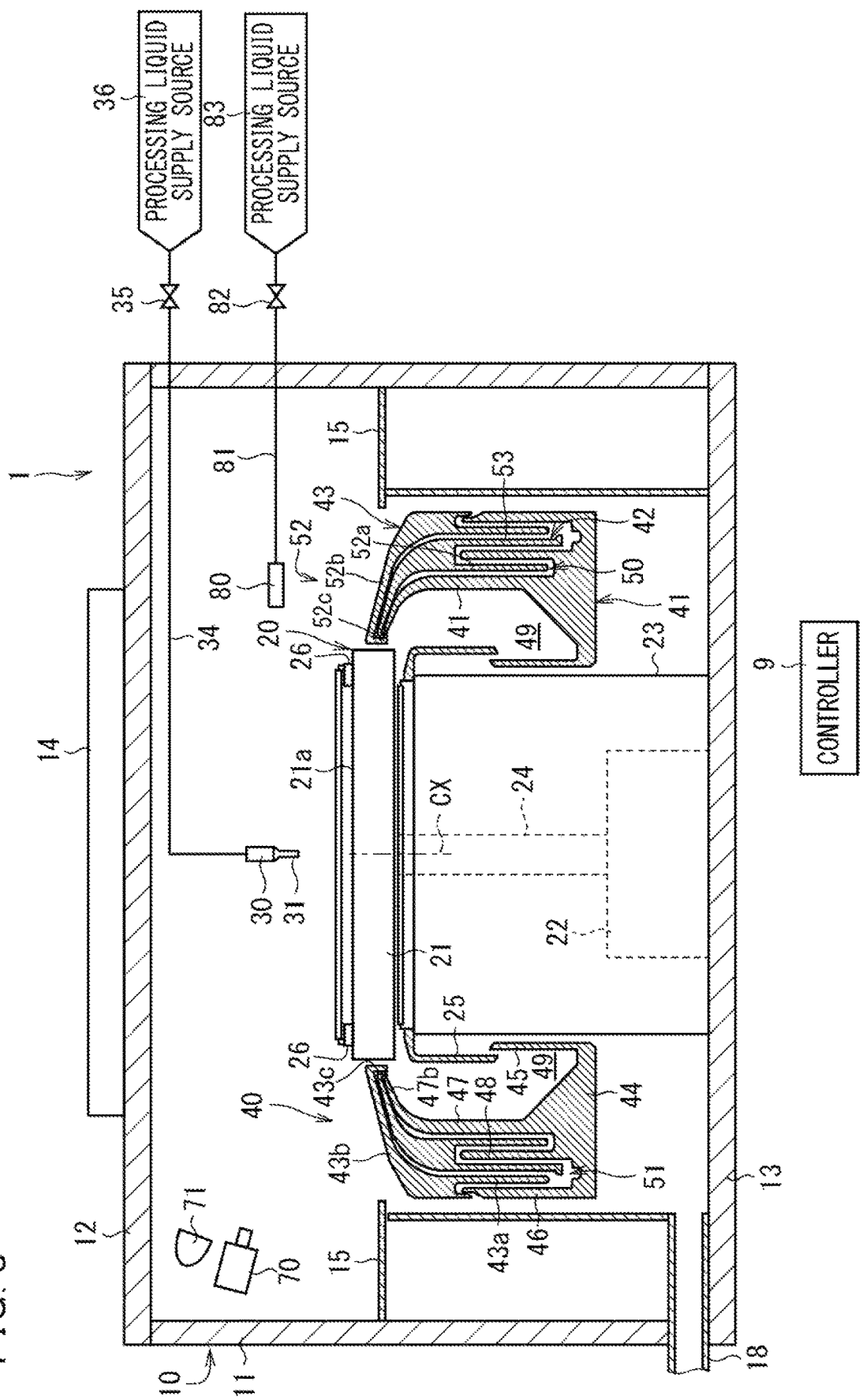
FIG. 3 is a longitudinal sectional view schematically showing an example of the configuration of the processing unit.

Next, the processing unit 1 will be described. Hereinafter, one of the 12 processing units 1 mounted on the substrate processing apparatus 100 will be described. FIG. 2 is a plan view of the processing unit 1. FIG. 3 is a longitudinal sectional view of the processing unit 1.

The processing unit 1 includes a spin chuck 20 as an example of a substrate holder, a first nozzle 30, a second nozzle 60, a third nozzle 65, a fixed nozzle 80, a processing cup 40, and a camera 70 in a chamber 10.

The chamber 10 includes a side wall 11 along the vertical direction, a ceiling wall 12 closing the upper side of a space surrounded by the side wall 11, and a floor wall 13 closing the lower side of the space. The space surrounded by the side wall 11, the ceiling wall 12, and the floor wall 13 is a processing space. A part of the side wall 11 of the chamber 10 is provided with a carry-in/out port for the main transport robot 103 to carry the substrate W in and out and a shutter for opening and closing the carry-in/out port (neither is shown).

The ceiling wall 12 of the chamber 10 is mounted with a fan filter unit (FFU) 14 for further cleaning air in a clean room where the substrate processing apparatus 100 is installed and supplying the air to the processing space in the chamber 10. The fan filter unit 14 includes a fan and a filter (e.g., high-efficiency particulate air (HEPA) filter) for taking in the air in the clean room and sending the air into the chamber 10 and forms a downflow of the clean air in the processing space in the chamber 10. In order to uniformly disperse the clean air supplied from the fan filter unit 14, a punching plate perforated with a large number of blow-out holes may be provided immediately below the ceiling wall 12.

The spin chuck 20 holds the substrate W in a horizontal orientation (an orientation in which the normal is along the vertical direction). The spin chuck 20 includes a disk-shaped spin base 21 fixed in the horizontal orientation to an upper end of a rotating shaft 24 extending along the vertical direction. A spin motor 22 for rotating the rotating shaft 24 is provided below the spin base 21. The spin motor 22 rotates the spin base 21 in a horizontal plane via the rotating shaft 24. In addition, a tubular cover member 23 is provided so as to surround the spin motor 22 and the rotating shaft 24.

The outer diameter of the disk-shaped spin base 21 is slightly larger than the diameter of the circular substrate W held by the spin chuck 20. Therefore, the spin base 21 has an upper surface 21a facing the entire lower surface of the substrate W to be held.

A plurality of (four in the present embodiment) chuck pins 26 are erected on a peripheral portion of the upper surface 21a of the spin base 21. The plurality of chuck pins 26 is arranged at equal intervals (at 90° intervals in the case of four chuck pins 26 as in the present embodiment) along the circumference corresponding to the periphery of the circular substrate W. Each chuck pin 26 is provided to be drivable between a holding position in contact with the periphery of the substrate W and an open position away from the periphery of the substrate W. The plurality of chuck pins 26 are interlocked and driven by a link mechanism (not shown) accommodated in the spin base 21. The spin chuck 20 can hold the substrate W in the horizontal orientation close to the upper surface 21a above the spin base 21 by stopping the plurality of chuck pins 26 at the respective contact positions (cf. FIG. 3) and can release the holding of the substrate W by stopping the plurality of chuck pins 26 at the respective open positions.

The lower end of the cover member 23 covering the spin motor 22 is fixed to the floor wall 13 of the chamber 10, and the upper end thereof reaches a position immediately below the spin base 21. The Similarly, upper end portion of the cover member 23 is provided with a flange-like member 25 that projects outward from the cover member 23 almost horizontally and further bends downward. The spin motor 22 rotates the rotating shaft 24 in a state where the spin chuck 20 holds the substrate W by grasping with the plurality of chuck pins 26, whereby the spin chuck 20 can rotate the substrate W around a rotation axis CX along the vertical direction passing through the center of the substrate W. Note that driving of the spin motor 22 is controlled by controller 9.

The first nozzle 30 is configured by attaching an ejection head 31 to the tip of a nozzle arm 32. The base end side of the nozzle arm 32 is fixedly coupled to a nozzle base 33. The nozzle base 33 is rotatable around a shaft along the vertical direction by a motor (not shown). By the rotation of the nozzle base 33, the first nozzle 30 moves in an arc shape in a space above the spin chuck 20 as indicated by an arrow AR34 in FIG. 2.

Figure 4:
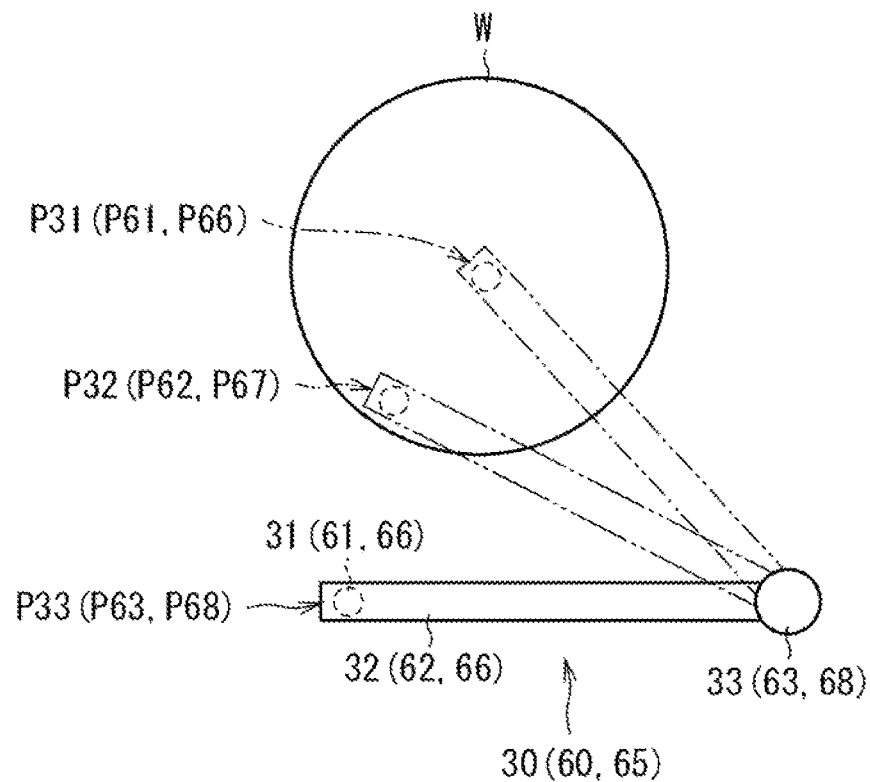
FIG. 4 is a view schematically showing an example of a movement path of each nozzle.

FIG. 4 is a plan view schematically showing an example of a movement path of the first nozzle 30. As exemplified in FIG. 4, by the rotation of the nozzle base 33, the ejection head 31 of the first nozzle 30 moves along the circumferential direction around the nozzle base 33. The first nozzle 30 can be stopped at an appropriate position. In the example of FIG. 4, the first nozzle 30 can stop at each of a center position P31, a peripheral position P32, and a standby position P33.

The center position P31 is a position where the ejection head 31 faces the central portion of the substrate W held by the spin chuck 20 in the vertical direction. The first nozzle 30 located at the center position P31 ejects a processing liquid onto the upper surface of the rotating substrate W, whereby the processing liquid can be supplied to the entire upper surface of the substrate W. As a result, the entire upper surface of the substrate W can be processed.

The peripheral position P32 is a position where the ejection head 31 faces the peripheral portion of the substrate W held by the spin chuck 20 in the vertical direction. In the state of being located at the peripheral position P32, the first nozzle 30 may eject the processing liquid onto the upper surface of the rotating substrate W. As a result, the processing liquid can be ejected only to the peripheral portion of the upper surface of the substrate W, and only the peripheral portion of the substrate W can be processed (so-called bevel processing).

Further, the first nozzle 30 can eject the processing liquid onto the upper surface of the rotating substrate W while oscillating between the center position P31 and the peripheral position P32. In this case as well, the entire upper surface of the substrate W can be processed.

On the other hand, the first nozzle 30 may not eject the processing liquid at the peripheral position P32. For example, the peripheral position P32 may be a relay position where the first nozzle 30 temporarily stands by when moving from the center position P31 to the standby position P33.

The standby position P33 is a position where the ejection head 31 does not face the substrate W held by the spin chuck 20 in the vertical direction. The standby position P33 may be provided with a standby pod that accommodates the ejection head 31 of the first nozzle 30.

As exemplified in FIG. 3, the first nozzle 30 is connected to a processing liquid supply source 36 via the supply pipe 34. The supply pipe 34 is provided with a valve 35. The valve 35 opens and closes the flow path of the supply pipe 34. By the opening of the valve 35, the processing liquid supply source 36 supplies the processing liquid to the first nozzle 30 through the supply pipe 34. Note that the first nozzle 30 may be configured to be supplied with a plurality of types of processing liquids (including at least pure water).

The processing unit 1 of the present embodiment is further provided with the second nozzle 60 and the third nozzle 65 in addition to the first nozzle 30. The second nozzle 60 and the third nozzle 65 of the present embodiment have the same configuration as the first nozzle 30 described above. That is, the second nozzle 60 is configured by attaching an ejection head 61 to the tip of a nozzle arm 62. The second nozzle 60 moves in an arc shape in a space above the spin chuck 20 as indicated by an arrow AR64 by a nozzle base 63 coupled to the base end side of the nozzle arm 62. The relative positional relationship among a center position P61, a peripheral position P62, and a standby position P63 located on the movement path of the second nozzle 60 is similar to the relative positional relationship among the center position P31, the peripheral position P32, and the standby position P33, respectively.

Similarly, the third nozzle 65 is configured by attaching an ejection head 66 to the tip of a nozzle arm 67. The third nozzle 65 moves in an arc shape in a space above the spin chuck 20 as indicated by an arrow AR69 by a nozzle base 68 coupled to the base end side of the nozzle arm 67. It moves in an arc shape between the processing position and the standby position outside the processing cup 40. The relative positional relationship among a center position P66, a peripheral position P67, and a standby position P68 located on the movement path of the third nozzle 65 is similar to the relative positional relationship among the center position P31, the peripheral position P32, and the standby position P33, respectively.

The third nozzle 65 may be movable up and down. For example, the third nozzle 65 is lifted and lowered by a nozzle lifting mechanism (not shown) incorporated in the nozzle base 68. In this case, the third nozzle 65 can also be stopped at an upper center position P69 located vertically above the center position P66. Note that at least one of the first nozzle 30 and the second nozzle 60 may be provided so as to be movable up and down.

Similarly to the first nozzle 30, each of the second nozzle 60 and the third nozzle 65 is connected to a processing liquid supply source (not shown) via a supply pipe (not shown). Each supply pipe is provided with a valve, and the supply/stop of the processing liquid is switched by opening and closing the valve. Note that each of the second nozzle 60 and the third nozzle 65 may be configured to be supplied with a plurality of kinds of processing liquids containing at least pure water. At least one of the first nozzle 30, the second nozzle 60, and the third nozzle 65 may be a two-fluid nozzle that mixes the cleaning liquid such as pure water with pressurized gas to generate liquid droplets and injects a mixed fluid of the liquid droplets and a gas onto the substrate W. In addition, the number of nozzles provided in the processing unit 1 is not limited to three but may be one or more.

In the example of FIGS. 2 and 3, the processing unit 1 is also provided with the fixed nozzle 80. The fixed nozzle 80 is located above the spin chuck 20 and radially outside the outer periphery of the spin chuck 20. As a more specific example, the fixed nozzle 80 is provided at a position facing the processing cup 40 to be described later in the vertical direction. The ejection port of the fixed nozzle 80 faces the substrate W side, and the opening axis thereof is, for example, along the horizontal direction. The fixed nozzle 80 also ejects the processing liquid onto the upper surface of the substrate W held by the spin chuck 20. The processing liquid ejected from the fixed nozzle 80 reaches, for example, the central portion of the upper surface of the substrate W.

As exemplified in FIG. 3, the fixed nozzle 80 is connected to a processing liquid supply source 83 via a supply pipe 81. The supply pipe 81 is provided with a valve 82. The valve 82 opens and closes the flow path of the supply pipe 81. By the opening of the valve 82, the processing liquid supply source 83 supplies the processing liquid (e.g., pure water) to the fixed nozzle 80 through the supply pipe 81, and the processing liquid is ejected from the ejection port of the fixed nozzle 80.

The processing cup 40 surrounding the spin chuck 20 includes an inner cup 41, a middle cup 42, and an outer cup 43 that can be lifted and lowered independently of each other. The inner cup 41 surrounds the spin chuck 20 and has a shape that is substantially rotationally symmetric with respect to the rotation axis CX passing through the center of the substrate W held by the spin chuck 20. The inner cup 41 integrally includes a bottom portion 44 having an annular shape in a plan view, a cylindrical inner wall portion 45 rising upward from a inner periphery of the bottom portion 44, a cylindrical outer wall portion 46 rising upward from the outer periphery of the bottom portion 44, a first guide 47 rising from between the inner wall portion 45 and the outer wall portion 46 and extending obliquely upward toward a center side (in a direction approaching the rotation axis CX of the substrate W held by the spin chuck 20) while drawing a smooth arc at the upper end portion and a cylindrical middle wall portion 48 rising upward from between the first guide 47 and the outer wall portion 46.

The inner wall portion 45 is formed to have such a length as to be accommodated between the cover member 23 and the flange-like member 25 with an appropriate gap held therebetween in a state where the inner cup 41 is lifted the most. The middle wall portion 48 is formed to have such a length as to be accommodated between a second guide 52 and a processing liquid separation wall 53, which will be described later, in the middle cup 42 with an appropriate gap held therebetween in a state where the inner cup 41 and the middle cup 42 are closest to each other.

The first guide 47 has an upper end portion 47b extending obliquely upward on the center side (a direction approaching the rotation axis CX of the substrate W) while drawing a smooth arc. A space between the inner wall portion 45 and the first guide 47 is formed as a disposal groove 49 for collecting and disposing of the used processing liquid. A space between the first guide 47 and the middle wall portion 48 is formed as an annular inner collection groove 50 for collecting the used processing liquid. A space between the middle wall portion 48 and the outer wall portion 46 is formed as an annular outer collection groove 51 for collecting a processing liquid of a different kind from the processing liquid collected by the inner collection groove 50.

The disposal groove 49 is connected with an exhaust liquid mechanism (not shown) for forcibly discharging the air inside the disposal groove 49 while exhausting the processing liquid collected into the disposal groove 49. For example, four exhaust liquid mechanisms are provided at regular intervals along the circumferential direction of the disposal groove 49. Further, the inner collection groove 50 and the outer collection groove 51 are connected with a collection mechanism for collecting the processing liquid, collected in each of the inner collection groove 50 and the outer collection groove 51, to a collection tank provided outside the substrate processing unit 1 (neither is shown). Note that the bottoms of the inner collection groove 50 and the outer collection groove 51 are inclined by a slight angle with respect to the horizontal direction, and the collection mechanism is connected to the lowest position. Thereby, the processing liquid having flowed into each of the inner collection groove 50 and the outer collection groove 51 is collected smoothly.

The middle cup 42 surrounds the spin chuck 20 and has a shape that is substantially rotationally symmetric with respect to the rotation axis CX passing through the center of the substrate W held by the spin chuck 20. The middle cup 42 integrally includes the second guide 52 and the cylindrical processing liquid separation wall 53 coupled to the second guide 52.

Outside the first guide 47 of the inner cup 41, the second guide 52 includes a lower end portion 52*a* coaxially cylindrical with the lower end portion of the first guide 47, an upper end portion 52*b* extending obliquely upward on the center side (a direction approaching the rotation axis CX of the substrate W) while drawing a smooth circular arc from the upper end of the lower end portion 52*a*, and a folded portion 52*c* formed by folding the tip portion of the upper end portion 52*b* downward. The lower end portion 52*a* is accommodated in the inner collection groove 50 while holding an appropriate gap between the first guide 47 and the middle wall portion 48 in the state where the inner cup 41 and the middle cup 42 are closest to each other. The upper end portion 52*b* is provided so as to overlap the upper end portion 47*b* of the first guide 47 of the inner cup 41 in the vertical direction, and is close to the upper end portion 47*b* of the first guide 47 while holding a very small space therewith in the state where the inner cup 41 and the middle cup 42 are closest to each other. The folded portion 52*c* formed by folding the tip of the upper end portion 52*b* downward has such a length that the folded portion 52*c* overlaps the tip of the upper end portion 47*b* of the first guide 47 in the horizontal direction in the state where the inner cup 41 and the middle cup 42 are closest to each other.

The upper end portion 52*b* of the second guide 52 is formed with a thickness increasing downward, and the processing liquid separation wall 53 has a cylindrical shape, provided so as to extend downward from the lower end outer peripheral portion of the upper end portion 52*b*. The processing liquid separation wall 53 is accommodated in the outer collection groove 51 while holding an appropriate gap between the middle wall portion 48 and the outer cup 43 in the state where the inner cup 41 and the middle cup 42 are closest to each other.

The outer cup 43 surrounds the spin chuck 20 on the outside of the second guide 52 of the middle cup 42 and has a shape that is almost rotationally symmetric to the rotation axis CX passing through the center of the substrate W held by the spin chuck 20. The outer cup 43 has a function as a third guide. The outer cup 43 includes a lower end portion 43*a* coaxially cylindrical with the lower end portion 52*a* of the second guide 52, an upper end portion 43*b* extending obliquely upward on the center side (a direction approaching the rotation axis CX of the substrate W) while drawing a smooth circular arc from the upper end of the lower end portion 43*a*, and a folded portion 43*c* formed by folding the tip portion of the upper end portion 43*b* downward.

The lower end portion 43*a* is accommodated in the outer collection groove 51 while holding an appropriate gap between the processing liquid separation wall 53 of the middle cup 42 and the outer wall portion 46 of the inner cup 41 in a state where the inner cup 41 and the outer cup 43 are closest to each other. The upper end portion 43*b* is provided so as to overlap the second guide 52 of the middle cup 42 in the vertical direction, and is close to the upper end portion 52*b* of the second guide 52 while holding a very small space therewith in a state where the middle cup 42 and the outer cup 43 are closest to each other. The folded portion 43*c* formed by folding the tip portion of the upper end portion 43*b* downward is formed such that the folded portion 43*c* overlaps the folded portion 52*c* of the second guide 52 in the horizontal direction in the state where the middle cup 42 and the outer cup 43 are closest to each other.

Further, the inner cup 41, the middle cup 42, and the outer cup 43 can be lifted and lowered independently of each other. That is, each of the inner cup 41, the middle cup 42, and the outer cup 43 is individually provided with a cup lifting mechanism (not shown), whereby each cup is lifted and lowered separately and independently. As such a cup lifting mechanism, various known mechanisms such as a ball screw mechanism and an air cylinder can be adopted.

A partition plate 15 is provided so as to vertically partition the inner space of the chamber 10 around the processing cup 40. The partition plate 15 may be a single plate member surrounding the processing cup 40 or may be a combination of a plurality of plate members. Further, the partition plate 15 may be formed with a through hole penetrating in the thickness direction or a notch, and in the present embodiment, a through hole is formed to pass a support shaft for supporting the nozzle base 33 of the first nozzle 30, the nozzle base 63 of the second nozzle 60, and the nozzle base 68 of the third nozzle 65.

The outer circumferential end of the partition plate 15 is coupled to the side wall 11 of the chamber 10. An edge portion of the partition plate 15 surrounding the processing cup 40 is formed so as to have a circular shape with a larger diameter than the outer diameter of the outer cup 43. Therefore, the partition plate 15 does not become an obstacle for lifting and lowering the outer cup 43.

An exhaust duct 18 is provided in the vicinity of the floor wall 13 as a part of the side wall 11 of the chamber 10. The exhaust duct 18 is communicatively connected to an exhaust mechanism (not shown). Among the clean air supplied from the fan filter unit 14 and flowing down in the chamber 10, the air having passed between the processing cup 40 and the partition plate 15 is discharged from the exhaust duct 18 to the outside of the apparatus.

The camera 70 is installed above the partition plate 15 in the chamber 10. The camera 70 includes, for example, a charge-coupled device (CCD) which is one of solid-state imaging elements, and an optical system such as a lens. The camera 70 is provided to monitor various monitoring targets in the chamber 10 to be described later. A specific example of the monitoring target will be described in detail later. The camera 70 is disposed at a position including various monitoring targets in an imaging visual field. The camera 70 captures an image of the imaging visual field at each frame rate to acquire captured image data and sequentially outputs the acquired captured image data to the controller 9.

As shown in FIG. 3, an illuminator 71 is provided at a position above the partition plate 15 in the chamber 10. In a case where the inside of the chamber 10 is a dark room, the controller 9 may control the illuminator 71 so that the illuminator 71 emits light when the camera 70 performs imaging.

A configuration as hardware of the controller 9 provided in the substrate processing apparatus 100 is the same as that of a general computer. That is, the controller 9 includes a processor such as a central processing unit (CPU) that performs various types of arithmetic processing, a temporary storage medium such as a read-only memory (ROM) that is a read-only memory for storing a basic program, and a non-temporary storage medium such as a random-access memory (RAM) that is a readable and writable memory for storing various types of information, and a magnetic disk for storing control software, data, or the like. By the CPU of controller 9 executing a predetermined processing program, each operation mechanism of the substrate processing apparatus 100 is controlled by controller 9, and the process in the substrate processing apparatus 100 proceeds. Note that the controller 9 may be realized by a dedicated hardware circuit that does not require software for realizing the function.

Figure 5:
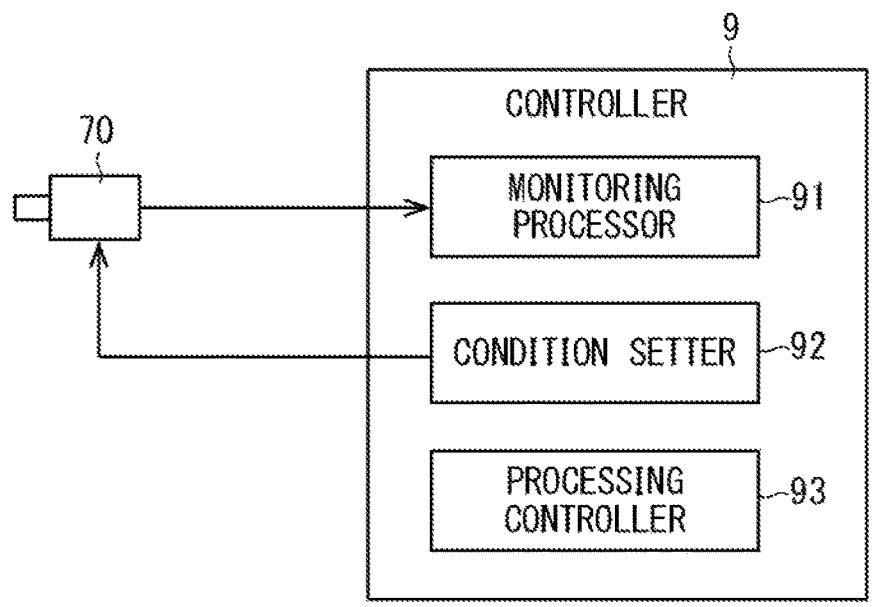
FIG. 5 is a functional block diagram showing an example of an internal configuration of a controller.

FIG. 5 is a functional block diagram schematically showing an example of the internal configuration of the controller 9. The controller 9 includes a monitoring processor 91, a condition setter 92, and a processing controller 93.

The processing controller 93 controls each component in the chamber 10. Specifically, the processing controller 93 controls the spin motor 22, various valves such as the valves 35, 82, the motors of the nozzle bases 33, 63, 68, the nozzle lifting mechanism, the cup lifting mechanism, and the fan filter unit 14. The processing controller 93 controls these components in accordance with a predetermined procedure, so that the processing unit 1 can perform processing on the substrate W. An example of a specific flow of the processing on the substrate W will be described in detail later.

The monitoring processor 91 performs a monitoring process based on captured image data acquired by imaging the inside of the chamber 10 by the camera 70. Thereby the monitoring processor 91 can monitor various monitoring targets in the chamber 10. A specific example of the monitoring process will be described in detail later.

The condition setter 92 specifies a monitoring target to be monitored and changes the imaging condition of the camera 70 in accordance with the monitoring target. Then, the condition setter 92 notifies the camera 70 of the imaging condition. The imaging condition includes, for example, at least one of resolution, a frame rate, and a visual field range. The camera 70 acquires captured image data under the imaging condition notified from the condition setter 92 and outputs the captured image data to the controller 9. A specific example of the imaging condition corresponding to the monitoring target will be described in detail later.

<Example of Flow of Substrate Processing>
<Overall Flow>

Figure 6:
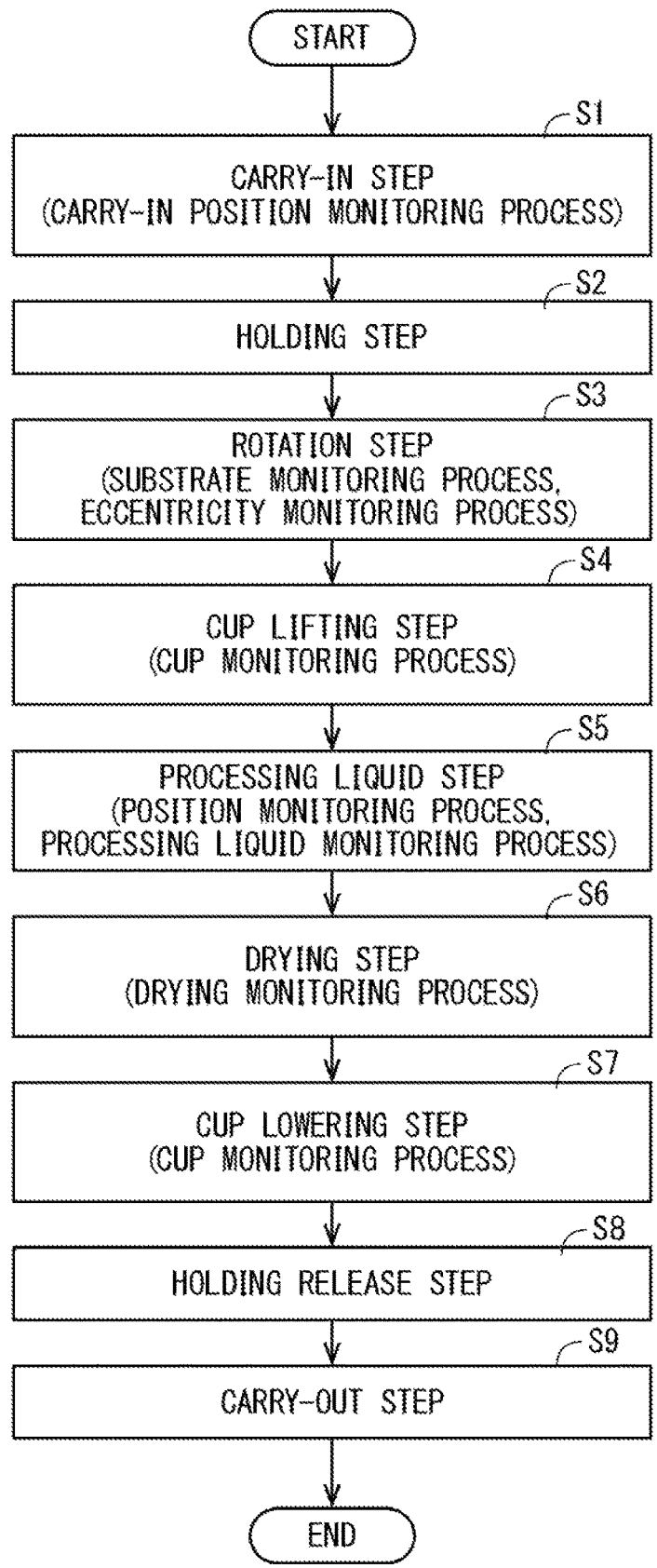
FIG. 6 is a flowchart showing an example of an operation of the processing unit.

FIG. 6 is a flowchart showing an example of a flow of substrate processing. First, the main transport robot 103 carries an unprocessed substrate W into the processing unit 1 (step S1: carry-in step). Next, the spin chuck 20 holds the substrate W in the horizontal orientation (step S2: holding step). Specifically, the plurality of chuck pins 26 hold the substrate W by the chuck pin 26 moving to the respective contact positions.

Next, the spin motor 22 starts the rotation of the substrate W (step S3: rotation step). Specifically, the spin motor 22 rotates the spin chuck 20 to rotate the substrate W held by the spin chuck 20. Next, the cup lifting mechanism lifts the processing cup 40 (step S4: cup lifting step). Thereby, the processing cup 40 stops at an upper position.

Next, the processing liquid is sequentially supplied to the substrate W (step S5: processing liquid step). In the processing liquid step (step S5), the cup lifting mechanism appropriately switches the cup to be lifted in accordance with the type of the processing liquid supplied to the substrate W, but this point is different from the essence of the present embodiment, and hence the description thereof will be omitted below.

FIG. 7 is a table showing an example of a specific procedure of the processing liquid step (step S5). In the example of FIG. 7, the processing liquid step is defined by steps ST1 to ST12. The table shows the time required for each step, the flow rate (ejection flow rate) of the processing liquid ejected from the first nozzle 30, the second nozzle 60, the third nozzle 65, and the fixed nozzle 80, and the positions of the first nozzle 30, the second nozzle 60, and the third nozzle 65. In the example of FIG. 7, examples of a monitoring process that can be executed in each step and an imaging condition is also shown, but these will be described in detail later.

In the example of FIG. 7, in step ST1, the ejection flow rates of the processing liquid from the first nozzle 30, the second nozzle 60, the third nozzle 65, and the fixed nozzle 80 are zero over a required time t1, and the first nozzle 30, the second nozzle 60, and the third nozzle 65 are stopped at the respective standby positions P33, P63, and P68. The required time t1 may be zero, for example. In this case, step ST1 merely indicates an initial state.

In the next step ST2, the nozzle base 33 moves the first nozzle 30 from the standby position P33 to the center position P31 in a required time t2. The required time t2 is, for example, about several seconds.

In the next step ST3, the first nozzle 30 ejects the processing liquid onto the upper surface of the substrate W at a flow rate F30 in a required time t3. The processing liquid having reached the upper surface of the substrate W spreads on the upper surface of the substrate W by receiving a centrifugal force accompanying the rotation of the substrate W and scatters from the periphery of the substrate W. The processing liquid scattered from the periphery of the substrate W is received and collected by the processing cup 40. The required time t3 is, for example, about several ten seconds, and the flow rate F30 is, for example, about several thousand cc/min. By this step ST3, the substrate W can be processed in accordance with the processing liquid.

In the next step ST4, while the fixed nozzle 80 ejects the processing liquid (e.g., rinse liquid) at the flow rate F80, the nozzle base 33 moves the first nozzle 30 from the center position P31 to the peripheral position P32 in a required time t4. The processing liquid from the fixed nozzle 80 reaches the central portion of the upper surface of the substrate W, spreads on the upper surface of the substrate W by receiving a centrifugal force, and scatters from the periphery of the substrate W. The processing liquid scattered from the periphery of the substrate W is received and collected by the processing cup 40. The required time t4 is, for example, about several ten seconds, and the flow rate F80 is, for example, about several thousand cc/min.

In the next step ST5, the nozzle base 33 moves the first nozzle 30 from the peripheral position P32 to the standby position P33 in a required time t5 while the fixed nozzle 80 ejects the processing liquid (e.g., rinse liquid) at the flow rate F80. The required time t5 is, for example, about several seconds.

In the next step ST6, the nozzle base 63 moves the second nozzle 60 from the standby position P63 to the peripheral position P62 in a required time t6 while the fixed nozzle 80 ejects the processing liquid (e.g., rinse liquid) at the flow rate F80. The required time t6 is, for example, about several seconds.

The fixed nozzle 80 ejects the processing liquid in steps ST4 to ST6. When the processing liquid ejected from the fixed nozzle 80 is the rinse liquid, the processing liquid remaining on the upper surface of the substrate W at the end of step ST3 can be replaced with the rinse liquid.

In the next step ST7, in a required time t7, the nozzle base 63 moves the second nozzle 60 from the peripheral position P62 to the center position P61, and the second nozzle 60 ejects the processing liquid onto the upper surface of the substrate W at a flow rate F60. The required time t7 is, for example, about several ten seconds, and the flow rate F60 is, for example, about several thousand cc/min. By this step ST7, the upper surface of the substrate W can be processed.

In the next step ST8, the nozzle base 63 moves the second nozzle 60 from the center position P61 to the standby position P63 in a required time t8. The required time t8 is, for example, about several seconds.

In the next step ST9, the nozzle base 68 moves the third nozzle 65 from the standby position P68 to the upper center position P69 in a required time t9. The required time t9 is, for example, about several seconds.

In the next step ST10, the third nozzle 65 ejects the processing liquid onto the upper surface of the substrate W at a flow rate F65 in a required time t10. The required time t10 is, for example, about several ten seconds, and the flow rate F65 is, for example, several thousand cc/min. When the processing liquid ejected from the third nozzle 65 is the rinse liquid, the processing liquid remaining on the upper surface of the substrate W at the end of step ST7 can be replaced with the rinse liquid.

In the next step ST11, the nozzle base 63 lowers the third nozzle 65 from the upper center position P69 to the center position P66 in a required time t11. The required time t11 is, for example, about several ten seconds.

In the next step ST12, the nozzle base 63 moves the third nozzle 65 from the center position P66 to the standby position P68 in a required time t12. The required time t12 is, for example, about several seconds.

Referring to FIG. 6 again, after the end of the processing liquid step (step S5), the processing unit 1 dries the substrate W (step S6: drying step). For example, the spin motor 22 increases the rotation speed of the substrate W to dry the substrate W (so-called spin dry).

Next, the cup lifting mechanism lowers the processing cup 40 (step S7: cup lowering step).

Then, the spin motor 22 ends the rotation of the spin chuck 20 and the substrate W, and the spin chuck 20 releases the holding of the substrate W (step S8: holding release step). Specifically, the plurality of chuck pins 26 moves to the respective open positions to release the holding.

Next, the main transport robot 103 carries the processed substrate W out of the processing unit 1 (step S9: carry-out step).

As described above, the substrate W is processed.

<Monitoring>

The monitoring processor 91 monitors the inside of the chamber 10 by using the camera 70 and determines whether or not the processing on the substrate W is appropriately progressing. As can be understood from the following description, the monitoring target monitored by the monitoring processor 91 sequentially changes in accordance with the progress status of the processing. Hereinafter, examples of the monitoring target in the chamber 10 will be described.

<Monitoring Target>

<Position of Nozzle>

In the processing liquid step described above (cf. FIG. 7), the first nozzle 30, the second nozzle 60, and the third nozzle 65 move as appropriate. For example, the first nozzle 30 moves from the standby position P33 to the center position P31 in step ST2. At this time, the first nozzle 30 may be shifted from the center position P31 and stopped due to a motor abnormality or the like of the nozzle base 33. In this case, the process in step ST3 may be ended inappropriately.

Therefore, the position of the nozzle may be adopted as the monitoring target in the step (period) in which the nozzle moves. In the example of FIG. 7, a step of performing a position monitoring process for monitoring the position of the nozzle is schematically shown with shaded hatching. Hereinafter, a specific example of the position monitoring process will be described.

Figure 8:
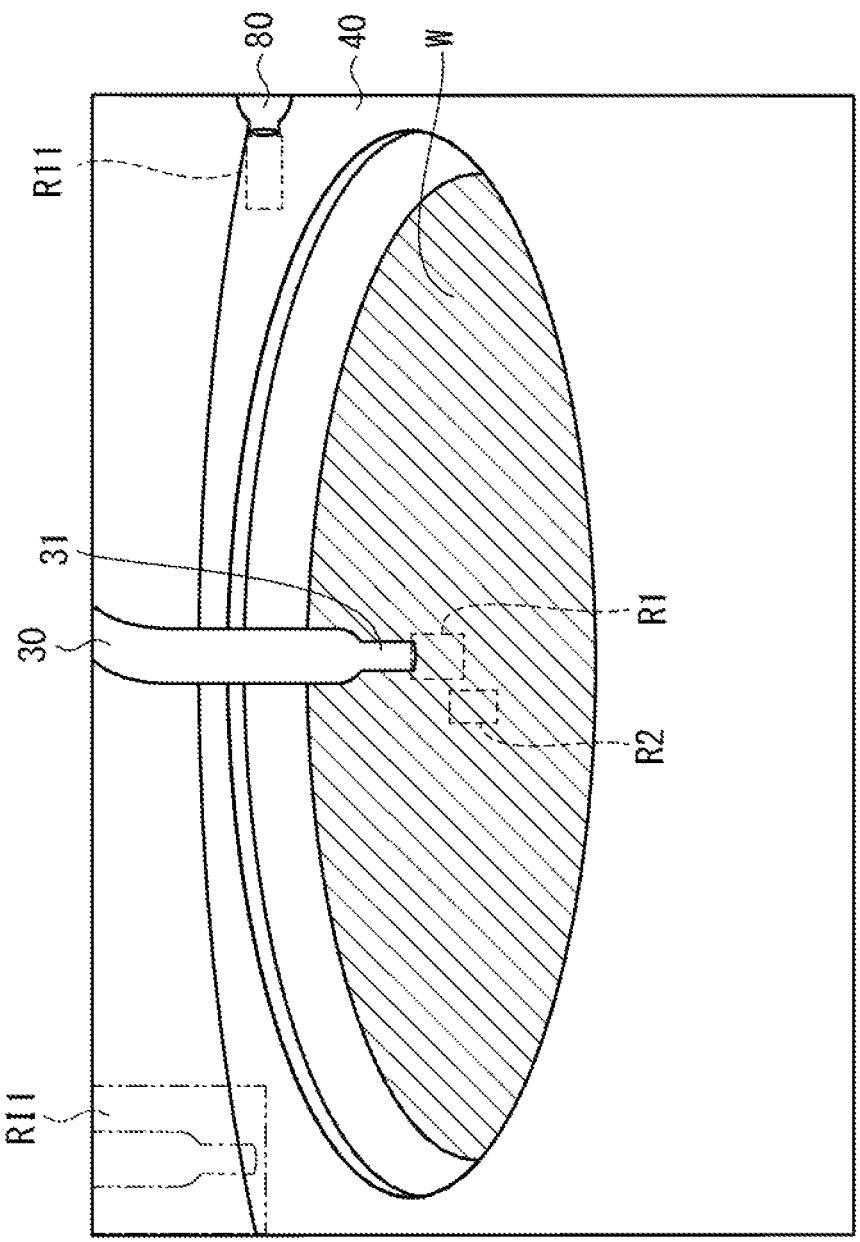
FIG. 8 is a view schematically showing an example of captured image data.

FIG. 8 is a view schematically showing an example of captured image data acquired in the step of performing the position monitoring process. FIG. 8 shows an example of captured image data acquired in step ST2. The captured image data of FIG. 8 includes the ejection head 31 of the first nozzle 30 that stops at the center position P31. That is, FIG. 8 shows captured image data acquired after the first nozzle 30 moves from the standby position P33 to the center position P31 in step ST2. In addition to the first nozzle 30, the captured image data also includes the processing cup 40 located at the upper position, the substrate W located in the opening of the processing cup 40, and the fixed nozzle 80.

The monitoring processor 91 analyzes the captured image data acquired in step ST2 to detect the position of the first nozzle 30. For example, the monitoring processor 91 specifies the position of the first nozzle 30 in the captured image data by pattern matching between the captured image data and reference image data RI1 including the first nozzle 30 (specifically, the ejection head 31) stored in advance in the storage medium. In the example of FIG. 8, the reference image data RI1 is schematically shown as virtual lines superimposed on the captured image data.

Next, the monitoring processor 91 determines the suitability of the detected position of the first nozzle 30. For example, the monitoring processor 91 determines whether or not the difference between the position of the first nozzle 30 and the preset center position P31 is equal to or smaller than a predetermined nozzle position tolerance. When the difference is equal to or smaller than the nozzle position tolerance, the monitoring processor 91 determines that the first nozzle 30 is located at the center position P31. On the other hand, the monitoring processor 91 determines that the first nozzle 30 is not located at the center position P31 when the difference is larger than the nozzle position tolerance. That is, the monitoring processor 91 determines that a nozzle position abnormality has occurred.

When an abnormality occurs, the monitoring processor 91 may cause a notifier (not shown) (e.g., display, speaker, etc.) to notify the abnormality. Further, the controller 9 may stop the operation of the processing unit 1 and interrupt the processing on the substrate W. Note that this point is similar in the following various monitoring processes, and hence repeated description is avoided below.

In step ST2, the first nozzle 30 moves from the standby position P33 to the center position P31. The monitoring processor 91 does not need to determine the suitability of the position during the movement of the first nozzle 30. Therefore, the monitoring processor 91 may determine that the first nozzle 30 is stopped when the position of the first nozzle 30 in the plurality of pieces of continuous captured image data becomes constant. Then, the monitoring processor 91 may determine whether or not the difference between the position of the first nozzle 30 after stopping and the center position P31 is equal to or smaller than the nozzle position tolerance. That is, the monitoring processor 91 may determine the suitability of the position of the first nozzle 30 after the position of the first nozzle 30 is stabilized.

In the example of FIG. 7, in step ST3, the first nozzle 30 stops at the center position P31, following step ST2. In a case where the position of the first nozzle 30 has not changed in the continuous steps ST2 and ST3, the monitoring processor 91 does not need to perform the position monitoring process in step ST3. In the example of FIG. 7, the monitoring processor 91 does not perform the position monitoring process in step ST3. Accordingly, the execution of an unnecessary position monitoring process can be reduced, and a processing load of the monitoring processor 91 can be reduced.

In the example of FIG. 7, in step ST4, the first nozzle 30 moves from the center position P31 to the peripheral position P32. Therefore, the monitoring processor 91 may also perform the position monitoring process in step ST4. Specifically, the monitoring processor 91 may detect the position of the first nozzle 30 after stopping based on the captured image data and determine whether or not the first nozzle 30 is appropriately stopped at the peripheral position P32. This suitability determination can also be performed in the same manner as described above.

In the example of FIG. 7, in step ST5, the first nozzle 30 has moved from the peripheral position P32 to the standby position P33. However, in the example of FIG. 7, the monitoring processor 91 does not perform the position monitoring process in step ST5. That is, the monitoring processor 91 does not monitor the position of the first nozzle 30 with respect to the standby position P33. This is because even when the first nozzle 30 is shifted from the standby position P33 and stops, the influence on the processing of the substrate W is small. Naturally, the monitoring processor 91 may also perform the position monitoring process on the standby position P33.

The monitoring processor 91 may also perform the position monitoring process on the second nozzle 60 and the third nozzle 65 at least in a step where the positions thereof change. In the example of FIG. 7, since the second nozzle 60 moves in steps ST6 and ST7, the monitoring processor 91 performs the position monitoring process for monitoring the position of the second nozzle 60 in steps ST6 and ST7. In the example of FIG. 7, since the third nozzle 65 moves in steps ST9 and ST11, the monitoring processor 91 performs the position monitoring process for monitoring the position of the third nozzle 65 in steps ST9 and ST11.

In the example of FIG. 7, in step ST8 where the second nozzle 60 moves to the standby position P63 and in step ST12 where the third nozzle 65 moves to the standby position P68, the monitoring processor 91 does not perform the position monitoring process. Naturally, the position monitoring process may also be performed in these steps.

<Processing Liquid>

In the processing liquid step described above (cf. FIG. 7), the first nozzle 30, the second nozzle 60, the third nozzle 65, and the fixed nozzle 80 appropriately eject the processing liquid. For example, the first nozzle 30 ejects the processing liquid onto the upper surface of the substrate W at the required time t3 of step ST3. At this time, the first nozzle 30 appropriately ejects the processing liquid, so that the substrate W can be processed.

Therefore, the state of the processing liquid may be adopted as the monitoring target in the step in which each nozzle ejects the processing liquid. In the example of FIG. 7, the step of performing the processing liquid monitoring process related to the processing liquid is schematically shown with sandy hatching. Hereinafter, a specific example of the processing liquid monitoring process will be described.

<Ejection Time>

For example, when the ejection time during which the first nozzle 30 actually ejects the processing liquid in step ST3 deviates from the specified time, the process in step ST3 may be inappropriately terminated. Specifically, when the ejection time is too short, the processing on the substrate W becomes insufficient, and when the ejection time is too long, the processing on the substrate W becomes excessive.

Therefore, as the monitoring target in the step in which each nozzle ejects the processing liquid, the ejection start timing and the ejection stop timing of the processing liquid, and thus the ejection time, may be adopted. Hereinafter, a specific example of an ejection time monitoring process for monitoring the ejection time of the processing liquid will be described.

Figure 9:
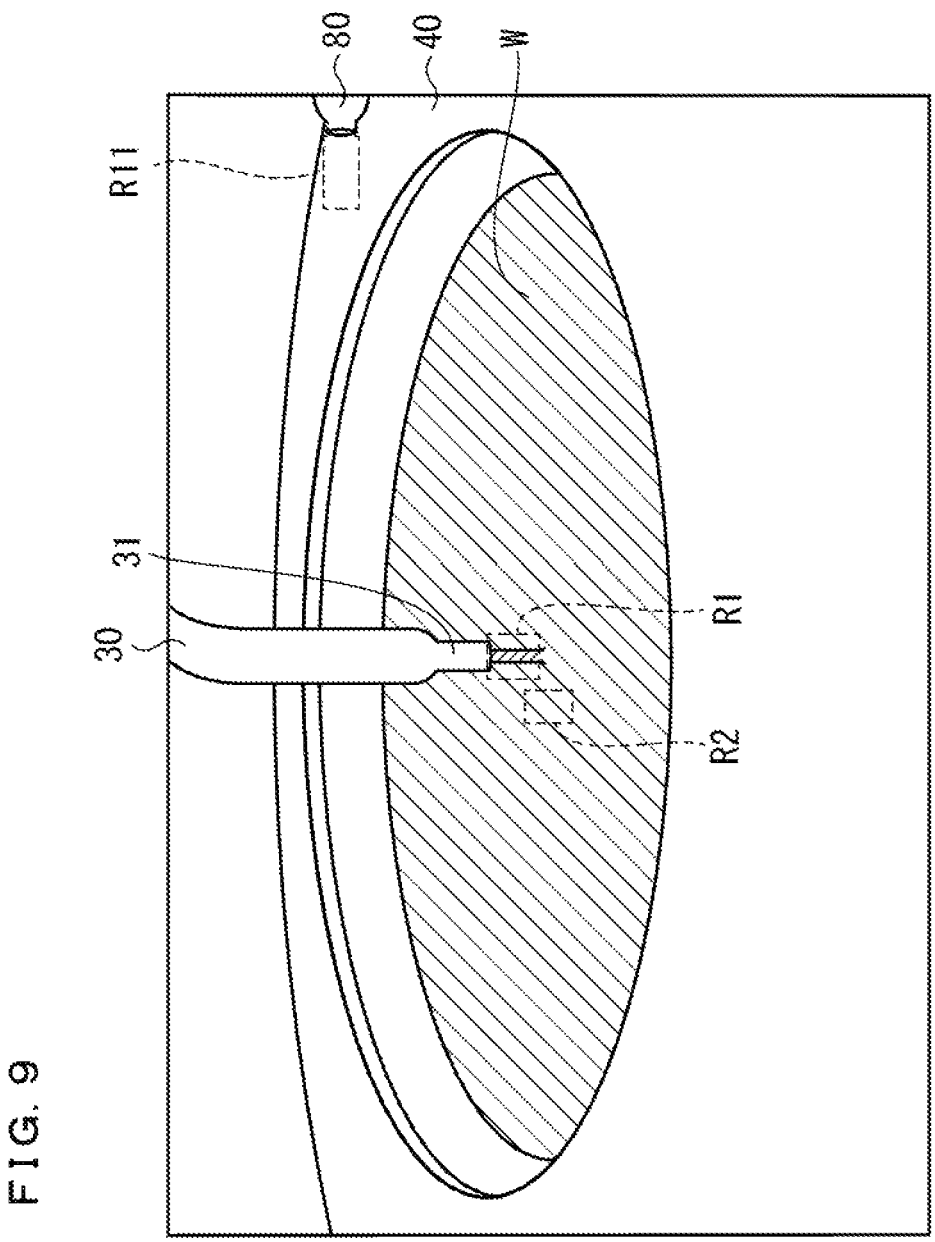
FIG. 9 is a view schematically showing an example of the captured image data.

FIG. 9 is a view schematically showing an example of captured image data acquired in the step of performing the ejection time monitoring process. FIG. 9 shows an example of captured image data acquired in step ST3. The captured image data of FIG. 9 includes the first nozzle 30 that ejects the processing liquid. That is, FIG. 9 shows captured image data acquired after the first nozzle 30 starts ejecting the processing liquid in step ST3.

Before the first nozzle 30 starts ejecting the processing liquid in step ST3, the camera 70 sequentially acquires captured image data (e.g., FIG. 8) including the first nozzle 30 not ejecting the processing liquid. When the processing liquid starts to be ejected from the first nozzle 30, the camera 70 sequentially acquires captured image data (e.g., FIG. 9) including the first nozzle 30 that has ejected the processing liquid. Therefore, when it can be specified whether or not the first nozzle 30 is ejecting the processing liquid for each captured image data sequentially acquired, the ejection start timing at which the first nozzle 30 starts the processing liquid can be specified based on the specified result.

Therefore, the monitoring processor 91 determines whether or not the first nozzle 30 is ejecting the processing liquid for each captured image data. In the examples of FIGS. 8 and 9, an ejection determination region R1 has been set in the captured image data. The ejection determination region R1 includes a region extending in the ejection direction from the tip of the first nozzle 30 (i.e., the tip of the ejection head 31). The ejection determination region R1 has, for example, a rectangular shape extending in the ejection direction (here, the lower side) from the tip of the first nozzle 30.

As can be understood from the comparison between FIGS. 8 and 9, pixel values in the ejection determination region R1 are different between when the first nozzle 30 ejects the processing liquid and when the first nozzle 30 is not ejecting the processing liquid. For example, the sum of the pixel values in the ejection determination region R1 when the first nozzle 30 is ejecting the processing liquid is larger than the sum of the pixel values in the ejection determination region R1 when the first nozzle 30 is not ejecting the processing liquid.

Therefore, the monitoring processor 91 determines whether or not the first nozzle 30 is ejecting the processing liquid based on the pixel values of the ejection determination region R1 for each captured image data acquired in step ST3. As a specific example, the monitoring processor 91 determines whether or not the sum of the pixel values in the ejection determination region R1 is equal to or larger than a predetermined ejection reference value, and determines that the first nozzle 30 is ejecting the processing liquid when the sum is equal to or larger than the ejection reference value. When the sum is less than the ejection reference value, the monitoring processor 91 determines that the first nozzle 30 has not ejected the processing liquid.

Note that the determination on whether or not the processing liquid is being ejected based on the pixel values in the ejection determination region R1 is not limited thereto, and various methods can be adopted. For example, the variance of the pixel values in the ejection determination region R1 when the first nozzle 30 is ejecting the processing liquid is larger than the variance when the first nozzle 30 is not ejecting the processing liquid. Thus, the monitoring processor 91 may calculate the variance and determine whether or not the processing liquid is being ejected based on the magnitude of the variance. In addition, it is also possible to adopt standard deviation instead of variance.

For example, the monitoring processor 91 specifies the start timing based on the acquisition timing of the captured image data in which the first nozzle 30 is not ejecting the processing liquid and the acquisition timing of the captured image data in which the first nozzle 30 is ejecting the processing liquid.

Similarly, the monitoring processor 91 can also specify the end timing at which the first nozzle 30 ends the ejection of the processing liquid.

Then, the monitoring processor 91 calculates a difference between the ejection stop timing and the ejection start timing as the ejection time. Next, the monitoring processor 91 determines the suitability of the ejection time. For example, the monitoring processor 91 determines whether or not the difference between the ejection time and the specified time is equal to or smaller than a predetermined time tolerance. The monitoring processor 91 determines that the ejection time is appropriate when the difference is equal to or smaller than the time tolerance. The monitoring processor 91 determines that the ejection time is inappropriate when the difference is larger than the time tolerance. That is, the monitoring processor 91 determines that an ejection time abnormality has occurred.

In the processing liquid step described above (cf. FIG. 7), since the second nozzle 60 and the third nozzle 65 also eject the processing liquid, the ejection time monitoring process may be performed in each step of ejecting the processing liquid. The ejection time monitoring process for each of the second nozzle 60 and the third nozzle 65 is similar to that for the first nozzle 30.

Note that the fixed nozzle 80 ejects the processing liquid in steps ST4 to ST6. In the example of FIG. 7, the monitoring processor 91 performs the processing liquid monitoring process in step ST4, but this processing liquid monitoring process includes a liquid splash monitoring process to be described later and does not include an ejection time monitoring process for the fixed nozzle 80. In the example of FIG. 7, the monitoring processor 91 does not perform the processing liquid monitoring process in steps ST5 and ST6. However, the present invention is not limited thereto, and the monitoring processor 91 may perform the ejection time monitoring process for the fixed nozzle 80 in steps ST4 to ST6.

Figure 10:
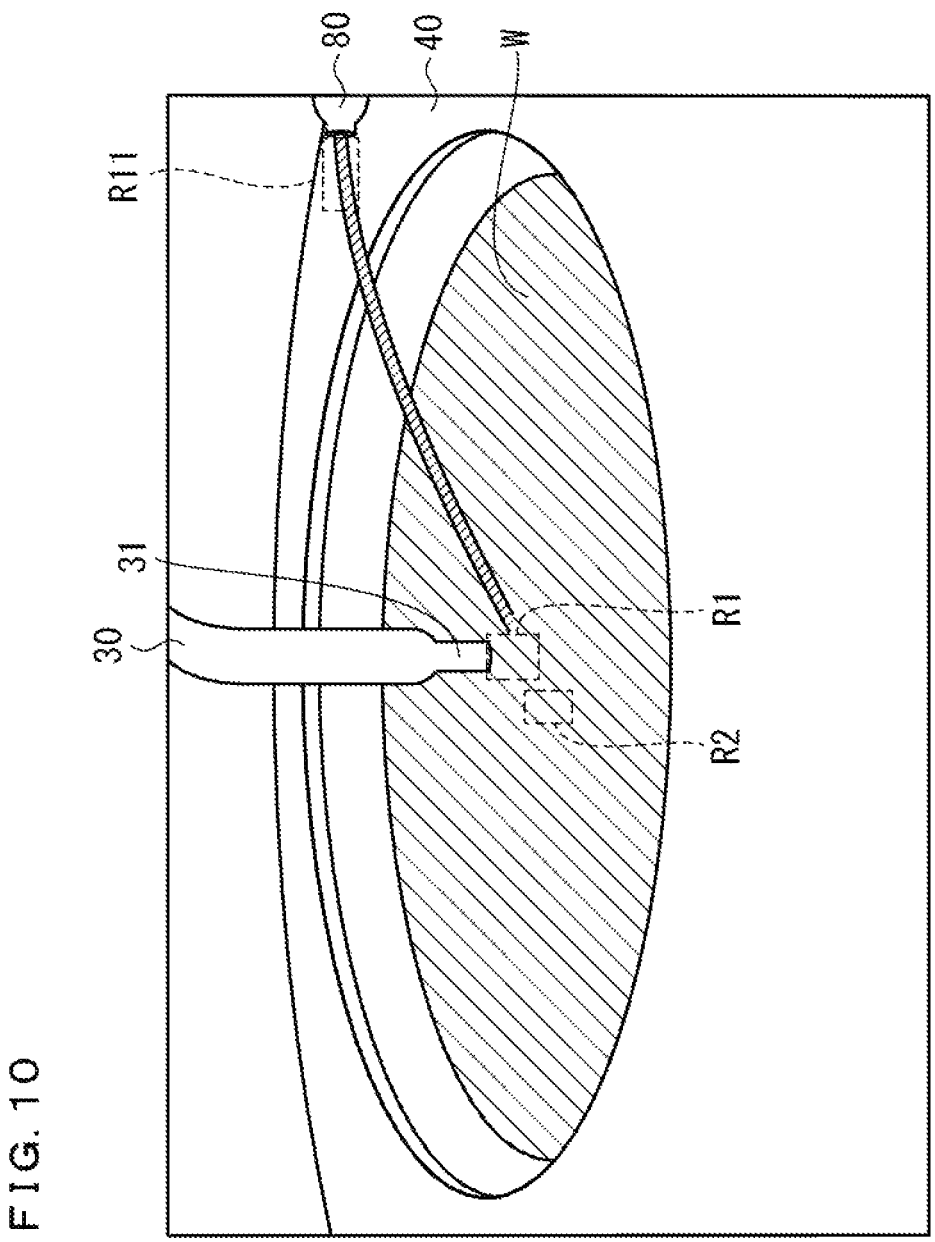
FIG. 10 is a view schematically showing an example of the captured image data.

FIG. 10 is a view schematically showing an example of captured image data acquired in steps ST4 to ST6. The captured image data of FIG. 10 includes the fixed nozzle 80 that ejects the processing liquid. That is, FIG. 10 shows captured image data acquired after the fixed nozzle 80 ejects the processing liquid.

In the examples of FIGS. 8 to 10, an ejection determination region R11 has been set to determine whether or not the processing liquid is being ejected from the fixed nozzle 80. The fixed nozzle 80 ejects the processing liquid horizontally, and hence the ejection determination region R11 has, for example, a rectangular shape extending in the lateral direction from the tip of the fixed nozzle 80. The ejection time monitoring process using the ejection determination region R11 is similar to the ejection time monitoring process using the ejection determination region R1.

<Liquid Splash>

In step ST3, the processing liquid may bounce on the upper surface of the substrate W (so-called liquid splash) due to various factors such as the first nozzle 30 ejecting the processing liquid onto the upper surface of the substrate W at a flow rate larger than the flow rate F30, for example. When such a liquid splash occurs, the processing unit 1 cannot appropriately process the substrate W.

Therefore, the occurrence or non-occurrence of a liquid splash of the processing liquid may be adopted as the monitoring target in the step in which each nozzle ejects the processing liquid. Hereinafter, a specific example of the liquid splash monitoring process for monitoring the occurrence or non-occurrence of a liquid splash will be described.

Figure 11:
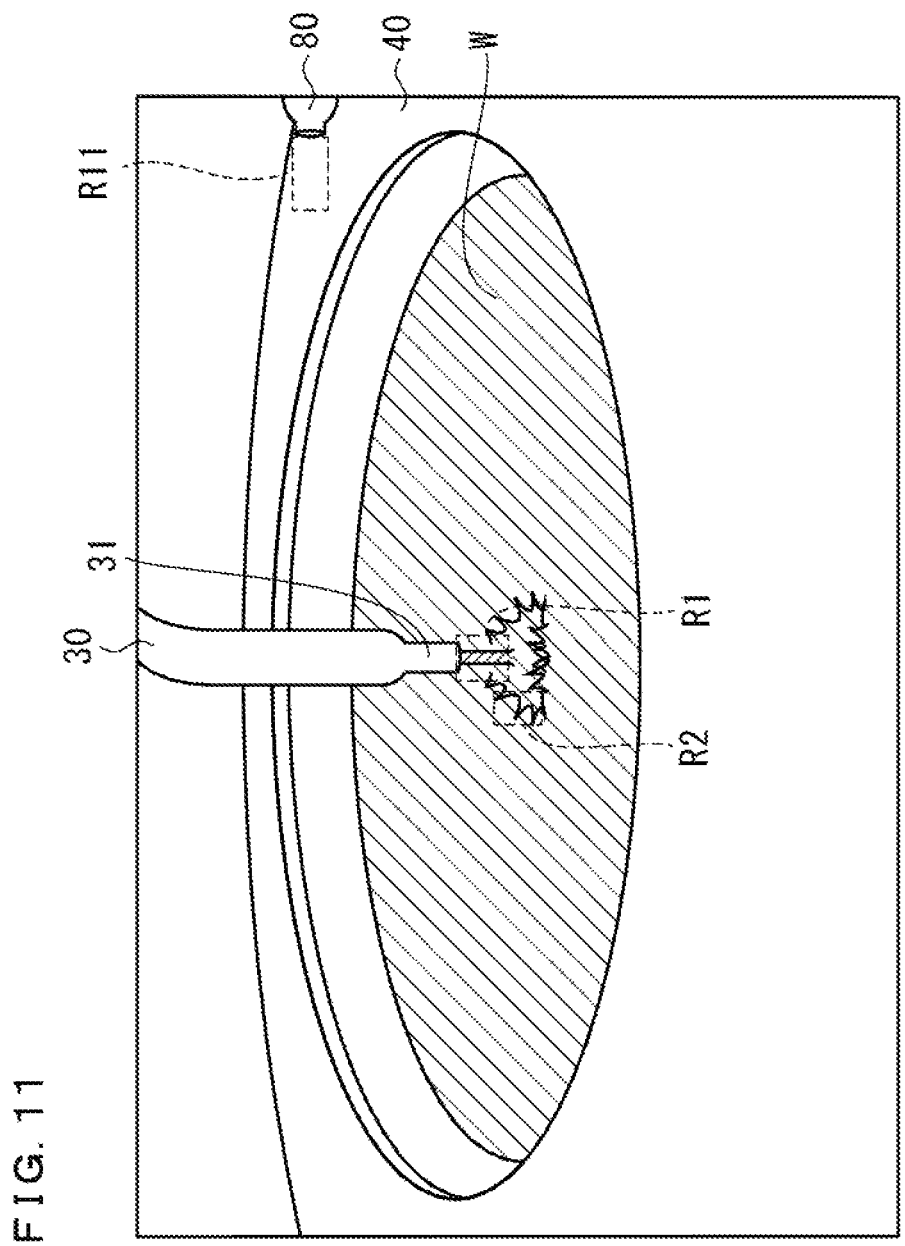
FIG. 11 is a view schematically showing an example of the captured image data.

FIG. 11 is a view schematically showing an example of the captured image data acquired in step ST3. In the captured image data of FIG. 11, a liquid splash has occurred. As exemplified in FIG. 11, the processing liquid flowing down from the first nozzle 30 bounces on the upper surface of the substrate W, whereby the processing liquid splashes in a crown shape surrounding the liquid arrival position.

In the examples of FIGS. 8 to 11, a liquid splash determination region R2 has been set in the captured image data. The liquid splash determination region R2 may be set to a region including a part of the processing liquid splashing from the upper surface of the substrate W. Since the processing liquid splashes around the liquid arrival position, the liquid splash determination region R2 may be set, for example, next to the ejection determination region R1. In the shown example, the liquid splash determination region R2 is separated from the ejection determination region R1 and is located on the left side of the ejection determination region R1, for example. In the shown example, the liquid splash determination region R2 has a rectangular shape.

The pixel values in the liquid splash determination region R2 are different between when no liquid splash has occurred (e.g., FIG. 9) and when a liquid splash has occurred (e.g., FIG. 11). For example, when light strikes the processing liquid having splashed from the upper surface of the substrate W, the light is irregularly projected, and hence the sum of the pixel values in the liquid splash determination region R2 when a liquid splash has occurred is larger than the sum of the pixel values in the liquid splash determination region R2 when a liquid splash has not occurred.

Therefore, the monitoring processor 91 determines whether or not a liquid splash has occurred for each captured image data acquired in step ST3 based on the pixel values in the liquid splash determination region R2. As a specific example, the monitoring processor 91 determines whether or not the sum of the pixel values in the liquid splash determination region R2 is equal to or larger than a predetermined liquid splash reference value, and determines that no splash has occurred when the sum is less than the liquid splash reference value. On the other hand, the monitoring processor 91 determines that a liquid splash has occurred when the sum is equal to or larger than the liquid splash reference value. That is, the monitoring processor 91 determines that a liquid splash abnormality has occurred.

Note that the determination of the occurrence or non-occurrence of a liquid splash based on the pixel values in the liquid splash determination region R2 is not limited thereto, and various methods can be adopted. For example, when light strikes the processing liquid having splashed from the upper surface of the substrate W, the light is irregularly projected, and hence the variance of the pixel values in the liquid splash determination region R2 when a liquid splash has occurred is larger than the variance when a liquid splash has not occurred. Therefore, the monitoring processor 91 may calculate the variance and determine the occurrence or non-occurrence of a liquid splash based on the magnitude of the variance. Note that it is also possible to adopt standard deviation instead of variance.

Since the second nozzle 60, the third nozzle 65, and the fixed nozzle 80 also eject the processing liquid, the monitoring processor 91 performs the liquid splash monitoring process in the step in which each nozzle ejects the processing liquid. Since the fixed nozzle 80 ejects the processing liquid along the horizontal direction from the tip thereof, a liquid splash is likely to occur on the side opposite to the fixed nozzle 80 with respect to the liquid arrival position. In the example of FIG. 11, the liquid splash determination region R2 is located on the opposite side of the fixed nozzle 80 with respect to the liquid arrival position and can thus also be used for liquid splash detection accompanying the ejection of the processing liquid from the fixed nozzle 80.

In the example of FIG. 7, the liquid splash monitoring process is performed in step ST4 for the fixed nozzle 80, but the liquid splash monitoring process may be performed in steps ST5 and ST6.

<Dripping>

When the ejection of the processing liquid from the first nozzle 30, the second nozzle 60, and the third nozzle 65 is stopped, droplets of the processing liquid may fall from the respective ejection ports (so-called dripping). When such droplets fall on the upper surface of the substrate W, a problem may occur.

Therefore, the occurrence or non-occurrence of dripping may be adopted as the monitoring target in the step in which each nozzle ejects the processing liquid. Hereinafter, a specific example of a dripping monitoring process for monitoring the occurrence or non-occurrence of dripping will be described.

Figure 12:
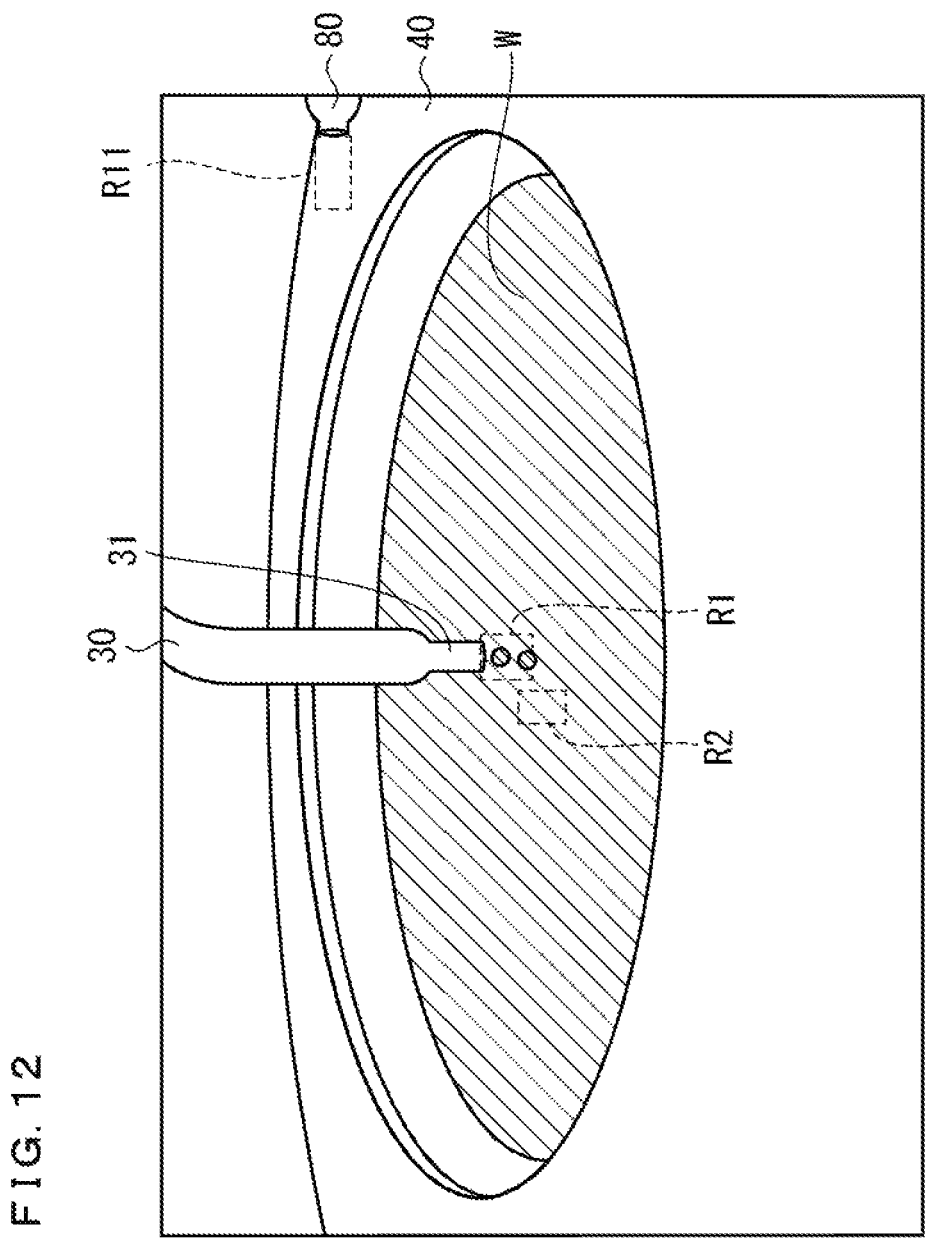
FIG. 12 is a view schematically showing an example of the captured image data.

FIG. 12 is a view schematically showing an example of the captured image data acquired in step ST3. FIG. 12 shows captured image data acquired immediately after the first nozzle 30 stops ejecting the processing liquid, and in the example of FIG. 12, dripping has occurred.

As can be understood from the comparison of FIGS. 8, 9, and 12, the pixel values in the ejection determination region R1 are different when the first nozzle 30 is not ejecting the processing liquid (FIG. 8), when the first nozzle 30 is ejecting the processing liquid (FIG. 9), and when dripping has occurred (FIG. 12). For example, the sum of the pixel values in the ejection determination region R1 when the dripping has occurred is smaller than the sum of the pixel values in the ejection determination region R1 when the first nozzle 30 is ejecting the processing liquid, and is larger than the sum of the pixel values in the ejection determination region R1 when the first nozzle 30 is not ejecting the processing liquid.

Therefore, the monitoring processor 91 determines whether or not dripping has occurred for each captured image data acquired in step ST3 based on the pixel values in the ejection determination region R1. As a specific example, the monitoring processor 91 may determine that the first nozzle 30 is ejecting the processing liquid when the sum of the pixel values in the ejection determination region R1 is equal to or larger than a predetermined first reference value, determine that a dripping abnormality has occurred when the sum of the pixel values in the ejection determination region R1 is less than the first reference value and equal to or larger than a predetermined second reference value, and determine that the first nozzle 30 is not ejecting the processing liquid when the sum of the pixel values in the ejection determination region R1 is less than the second reference value.

Note that the determination on the occurrence or non-occurrence of dripping based on the pixel values in the ejection determination region R1 is not limited thereto, and various methods can be adopted. For example, the occurrence or non-occurrence of dripping may be determined based on the variance or standard deviation in the ejection determination region R1.

<Outflow>

Each valve may slightly open due to an abnormality of each valve even though the processing controller 93 outputs a close signal to each valve. In this case, the ejection of the processing liquid cannot be appropriately stopped, and the processing liquid continues to flow out from the nozzle (so-called outflow). In this case, the processing liquid continues to be ejected onto the upper surface of the substrate W, so that a processing failure may occur.

Therefore, the occurrence or non-occurrence of outflow may be adopted as the monitoring target in the step in which each nozzle ejects the processing liquid. Hereinafter, a specific example of an outflow monitoring process for monitoring the occurrence or non-occurrence of outflow will be described.

As described above, the outflow is an abnormality in which the processing liquid is ejected from the nozzle in a state where the close signal has been output to the valve. Since the valve is controlled by the processing controller 93, the monitoring processor 91 can recognize whether or not the close signal has been output to the valve. The monitoring processor 91 can determine whether or not the processing liquid is being ejected from the nozzle based on the captured image data as in the description of the ejection time monitoring process.

For example, the monitoring processor 91 determines that an outflow abnormality has occurred in the first nozzle 30 when determining that the first nozzle 30 is ejecting the processing liquid even though the processing controller 93 has output the close signal to the valve 35. The same applies to the second nozzle 60 and the third nozzle 65.

<Imaging Conditions>

As described above, the monitoring target changes in accordance with each step defining the processing liquid step (step S5). In FIG. 7, the monitoring target is, for example, the position of the first nozzle 30 in the execution period of step ST2, and the state (shape) change (e.g., ejection start, ejection stop, liquid splash, dripping, and outflow) of the processing liquid ejected from the first nozzle 30 in the execution period of step ST3. That is, in the execution period of step ST2, the state change of the processing liquid is not the monitoring target, and the position of the nozzle is the monitoring target, and in the execution period of step ST3, the position of the nozzle is not the monitoring target, and the eject state of the processing liquid is the monitoring target. Further, as in the execution period of step ST7, both the position of the nozzle and the state change of the processing liquid may be the monitoring targets.

In the present embodiment, the condition setter 92 sets an imaging condition in accordance with the monitoring target in each execution period. Hereinafter, as a specific example, first, an imaging condition in an execution period (e.g., step ST2) when the position of the nozzle is the monitoring target and an imaging condition in an execution period (e.g., step ST3) when the state change of the processing liquid is the monitoring target will be described, and then, an imaging condition in an execution period (e.g., step ST7) when both the position of the nozzle and the state change of the processing liquid are the monitoring targets will be described.

<Nozzle Position Monitoring Process>

As the resolution of the captured image data is higher, the shape of each nozzle in the captured image data appears finer and clearer. Therefore, when the camera 70 acquires captured image data for the position monitoring process at a high resolution, the monitoring processor 91 can detect the position of the nozzle with higher accuracy based on the captured image data.

Therefore, the condition setter 92 sets the resolution to the high resolution as the imaging condition when the camera 70 acquires the captured image data for the position monitoring process. Specifically, the condition setter 92 sets the resolution to a higher resolution as the imaging condition in step ST2, step ST4, step ST6, step ST7, step ST9, and step ST11 (cf. also FIG. 7).

On the other hand, even when the frame rate of the captured image data is low, a problem hardly occurs in the position monitoring process. That is, since the stop position of the nozzle is monitored in the position monitoring process, no problem occurs in the position monitoring process even when the frame rate is low. In addition, even in a case where a change over time in the position of the nozzle is monitored, the frame rate may be lowered so long as it is not highly necessary to detect the position of the nozzle at a short time interval.

However, the frame rate is preferably high when the processing liquid monitoring process is performed. This point will be described in detail later.

Therefore, the condition setter 92 sets the resolution to the high resolution and sets the frame rate to the low frame rate as imaging conditions in the execution periods of the steps ST2, ST6, ST9, and ST11. In short, the condition setter 92 sets the resolution to the high resolution and sets the frame rate to the low frame rate as imaging conditions of captured image data not used in the processing liquid monitoring process but used in the position monitoring process. In other words, the condition setter 92 sets the resolution to the high resolution and sets the frame rate to the low frame rate as imaging conditions in a period when the state change of the processing liquid is not the monitoring target and the position of the nozzle is the monitoring target.

The condition setter 92 notifies the camera 70 of the set imaging conditions. The camera 70 acquires captured image data in accordance with the received imaging conditions. That is, the camera 70 acquires captured image data at the high resolution and the low frame rate in steps ST2, ST6, ST9, and ST11.

A change in the resolution can be realized by, for example, a binning function of the camera 70. The binning function is a function of changing the number of light receiving elements to be read out as one pixel among the plurality of light receiving elements of the camera 70. For example, a case is considered where the light receiving surface of the camera 70 is made up of Nx (e.g., 2448) light receiving elements in the vertical direction×Ny (e.g., 2048) in the horizontal direction. By the camera 70 reading out data of each light receiving element as one pixel, it is possible to acquire captured image data having Nx pixels in the vertical direction×Ny pixels in the horizontal direction. Furthermore, by the camera 70 reading, as one pixel, data of a total of four light receiving elements, for example, two in the vertical direction×two in the horizontal direction, it is possible to acquire captured image data having Nx/2 (e.g., 1224) pixels in the vertical direction×Ny/2 (e.g., 1024) pixels in the horizontal direction. Since the visual field range of the captured image data remains unchanged, the resolution of the captured image data can be reduced.

The frame rate can be changed, for example, by changing a cycle at which a shutter (electronic shutter or mechanical shutter) of the camera 70 is opened. The high frame rate is, for example, 100 fps, and the low frame rate is, for example, 30 fps.

In each of step ST2, step ST6, step ST9, and step ST11, since the camera 70 acquires captured images at the high resolution and the low frame rate, the monitoring processor 91 performs the position monitoring process based on high-resolution and low-frame-rate captured image data. Due to the use of the high-resolution captured image data, the monitoring processor 91 can detect the position of the nozzle with high accuracy. Meanwhile, due to the use of the low-frame-rate captured image data, the processing load of the monitoring processor 91 can be reduced. Therefore, power consumption can be reduced.

<Processing Liquid Monitoring Process>

As the frame rate of the captured image data is higher, the camera 70 can acquire the captured image data at a shorter time interval. Thus, in a plurality of pieces of captured image data, it is easy to show the state change of the processing liquid ejected from each nozzle. For example, as the frame rate is higher, it is easier to grasp a change from a state where the processing liquid is not ejected to a state where the processing liquid is ejected. Therefore, as the frame rate is higher, the monitoring processor 91 can monitor the ejection start timing of the processing liquid with higher accuracy. The same applies to the ejection stop timing of the processing liquid. In turn, the monitoring processor 91 can calculate the processing time with higher accuracy.

Furthermore, the captured image data is acquired at a shorter time interval as the frame rate is higher, so that even there is a phenomenon generated in a short period, the phenomenon can be projected in the captured image data. For example, even in a case where a liquid splash occurs instantaneously due to an instantaneous increase in the ejection flow rate of the processing liquid caused by the flow rate fluctuation, when the frame rate is high, the camera 70 can acquire captured image data including the liquid splash.

The dripping occurs when the ejection of the processing liquid is stopped, and the occurrence period is not so long. The occurrence period of the outflow may be short depending on the degree of abnormality of the valve. Even when the dripping or the outflow occurs instantaneously, so long as the frame rate is high, the camera 70 can acquire captured image data including the dripping or the outflow.

Therefore, the condition setter 92 sets the frame rate to the high frame rate as the imaging conditions in step ST3, step ST4, step ST7, and step ST10. In short, the condition setter 92 sets the frame rate to the high frame rate as the imaging condition when the camera 70 acquires captured image data for the processing liquid monitoring process.

On the other hand, the state change of the processing liquid can also be detected by captured image data acquired at a low resolution. Therefore, the condition setter 92 sets the resolution to the low resolution and sets the frame rate to the high frame rate as the imaging conditions in steps ST3 and ST10. In short, the condition setter 92 sets the resolution to the low resolution and the frame rate to a low fame rate as imaging conditions of captured image data not used in the position monitoring process but used in the processing liquid monitoring process. In other words, the condition setter 92 sets the resolution to the low resolution and the frame rate to the low frame rate as imaging conditions in a period when the position of the nozzle is not the monitoring target and the state change of the processing liquid is the monitoring target.

The condition setter 92 notifies the camera 70 of the set imaging conditions. The camera 70 acquires captured image data in accordance with the received imaging conditions. Therefore, the monitoring processor 91 performs the processing liquid monitoring process based on the captured image data acquired at the low resolution and the high frame rate in each of steps ST3 and ST10. Accordingly, due to the use of the high-frame-rate captured image data, the monitoring processor 91 can monitor the ejection start timing, the ejection stop timing, the liquid splash, the dripping, and the outflow with higher accuracy. Further, due to the use of the low-resolution captured image data, the processing load of the monitoring processor 91 can be reduced. Therefore, power consumption can be reduced.

<Parallel Execution of Position Monitoring Process and Processing Liquid Monitoring Process>

The condition setter 92 sets the resolution to the high resolution and sets the frame rate to the high frame rate as the imaging conditions in steps ST4 and ST7. In short, the condition setter 92 sets the resolution to the high resolution and sets the frame rate to the high frame rate as imaging conditions of captured image data used for both the position monitoring process and the processing liquid monitoring process. In other words, the condition setter 92 sets the resolution to the high resolution and sets the frame rate to the low frame rate as imaging conditions in a period when both the position of the nozzle and the state change of the processing liquid are set as monitoring targets.

The condition setter 92 notifies the camera 70 of the set imaging conditions. The camera 70 acquires captured image data in accordance with the received imaging conditions. Therefore, the monitoring processor 91 performs both the position monitoring process and the processing liquid monitoring process based on the captured image data acquired at the high resolution and the high frame rate in each of steps ST4 and ST7. Accordingly, the position monitoring process and the processing liquid monitoring process can be performed with higher accuracy.

<Recipe Information>

To the controller 9, for example, recipe information indicating a procedure of substrate processing (including each step and various conditions in each step) is input from an apparatus or an operator in the upstream. The processing controller 93 can perform processing on the substrate W by controlling the processing unit 1 based on the recipe information. The recipe information may include, for example, information of "step", "time", "ejection flow rate", and "position" in FIG. 7. In this case, the condition setter 92 specifies the monitoring target in each step based on the recipe information, sets the imaging condition as described above in accordance with the monitoring target, and notifies the camera 70 of the imaging condition.

As a specific example, the condition setter 92 specifies a step in which the nozzle is moving based on the information of the "position" included in the recipe information and adopts the position of the nozzle as the monitoring target in the process. Further, the condition setter 92 specifies a step in which the nozzle is ejecting the processing liquid based on information of the "ejection flow rate" included in the recipe information and adopts the state change of the processing liquid as the monitoring target in the process. Then, as described above, the condition setter 92 sets the imaging condition in the execution period of each step in accordance with the monitoring target in each step.

Note that the condition setter 92 does not necessarily need to specify the monitoring target in each step based on the recipe information. Information defining a processing procedure and a monitoring target may be input to the controller 9 by an apparatus or an operator in the upstream. Accordingly, the condition setter 92 can specify the monitoring target in each step by reading the information and can set the imaging condition corresponding to the monitoring target.

<Overall Flow of Monitoring Process>

Figure 13:
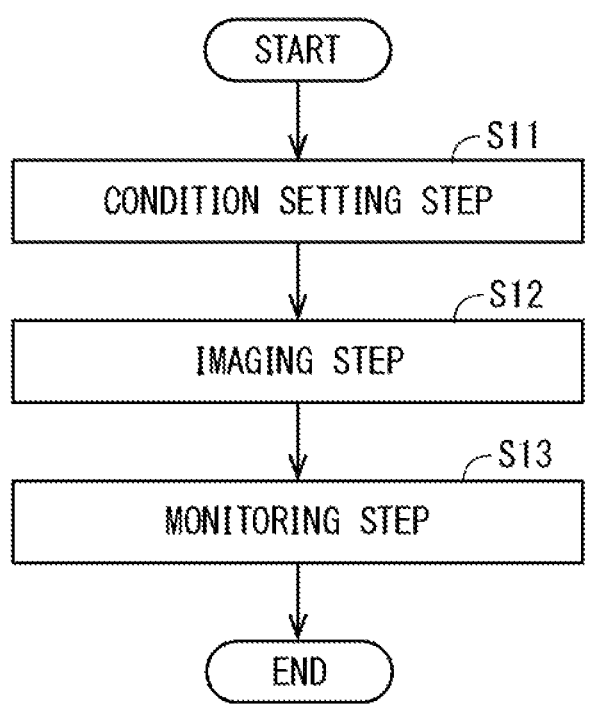
FIG. 13 is a flowchart showing an example of the operation of the processing unit.

FIG. 13 is a flowchart showing an example of the overall flow of the monitoring process described above. The condition setter 92 specifies the monitoring target in each step from a plurality of monitoring target candidates based on a processing procedure (e.g., recipe information, etc.) and sets an imaging condition in each step based on the monitoring target (step S11: condition setting step). The monitoring target candidates mentioned here are monitoring targets before being specified and include, for example, the position of the nozzle, the ejection start timing and the ejection stop timing of the processing liquid, a liquid splash, dripping, outflow, and the like.

The camera 70 sequentially acquires captured image data based on the imaging condition set by the condition setter 92 (step S12: imaging step). Thereby, the camera 70 acquires captured image data under the imaging condition corresponding to the monitoring target in each step.

The monitoring processor 91 performs a monitoring process on the monitoring target in each step based on the captured image data captured under the imaging condition corresponding to the monitoring target (step S13: monitoring step).

Note that the imaging step and the monitoring step are preferably executed in parallel with the processing on the substrate W. This enables the monitoring process to be performed during the processing on the substrate W. In the condition setting step, imaging conditions in all steps may be set in advance before the processing of the substrate W, or the imaging condition in each step may be sequentially set in accordance with the progress of the processing of the substrate W.

Effects of Embodiment

As described above, the condition setter 92 sets an imaging condition corresponding to the monitoring target and notifies the camera 70 of the imaging condition. The camera 70 acquires the captured image data under the notified imaging condition, so that the captured image data can be acquired under the imaging condition corresponding to the monitoring target.

For example, in an execution period of a step in which the state change of the processing liquid is not set as the monitoring target but the position of the nozzle is set as the monitoring target, the camera 70 acquires captured image data at the high resolution and the low frame rate. Therefore, the monitoring processor 91 performs the position monitoring process based on the high-resolution and low-frame-rate captured image data. Accordingly, it is possible to reduce the processing load at the low frame rate while monitoring the position of the nozzle with high accuracy based on the high-resolution captured image data.

In addition, for example, in an execution period of a step in which the position of the nozzle is not set as the monitoring target but the state change of the processing liquid is set as the monitoring target, the camera 70 acquires captured image data at the low resolution and the high frame rate. Therefore, the monitoring processor 91 performs the processing liquid monitoring process based on the low-resolution and high-frame-rate captured image data. Accordingly, it is possible to reduce the processing load by the low resolution while monitoring the state change of the processing liquid with high accuracy based on the high-frame-rate captured image data.

In addition, in an execution period of a step in which both the position of the nozzle and the state change of the processing liquid are set as the monitoring targets, the camera 70 acquires captured image data at the high resolution and the high frame rate. Therefore, the monitoring processor 91 can perform the position monitoring process and the processing liquid monitoring process with high accuracy.

<Another Example of Monitoring Target>

Note that the monitoring target is not limited to the specific example described above, and various other monitoring targets in the chamber 10 can be adopted. In short, the condition setter 92 may sequentially change the imaging condition in accordance with a change in the monitoring target regardless of the type of the monitoring target. Hereinafter, another specific example of the monitoring target will be described.

<Holding Abnormality and Shape Abnormality of Substrate>

In the holding step (step S2), the spin chuck 20 holds the substrate W. At this time, the spin chuck 20 may not be able to hold the substrate W in an appropriate orientation. For example, in a state where the spin chuck 20 holds the substrate W, the contact position between any one of the chuck pins 26 and the periphery of the substrate W may be shifted in the vertical direction. In this case, the substrate W is held in an inclined orientation. When the shift amount increases, the substrate W may ride on the chuck pins 26. Hereinafter, an abnormality in which the spin chuck 20 cannot hold the substrate W in the horizontal orientation is referred to as a holding abnormality. When such a holding abnormality occurs, the substrate W cannot be processed appropriately.

In addition, an abnormality may occur in the shape of the substrate W. For example, when a crack has occurred from the periphery of the substrate W, a step height is generated at a cracked portion at the periphery of the substrate W, and the periphery of the substrate W does not have a circular shape. Also, when a part of the periphery of the substrate W is chipped, the periphery of the substrate W does not have a circular shape. In such a case as well, there is a high possibility that the spin chuck 20 cannot hold the substrate W in the horizontal orientation. Hereinafter, an abnormality such as cracking of the substrate W is referred to as a shape abnormality. Also, when such a shape abnormality occurs, the substrate W cannot be processed appropriately.

Therefore, the occurrence or non-occurrence of the holding abnormality and the shape abnormality of the substrate may be adopted as the monitoring targets. Hereinafter, an example of a substrate monitoring process for monitoring the occurrence or non-occurrence of the holding abnormality and the shape abnormality of the substrate will be described.

Figure 14:
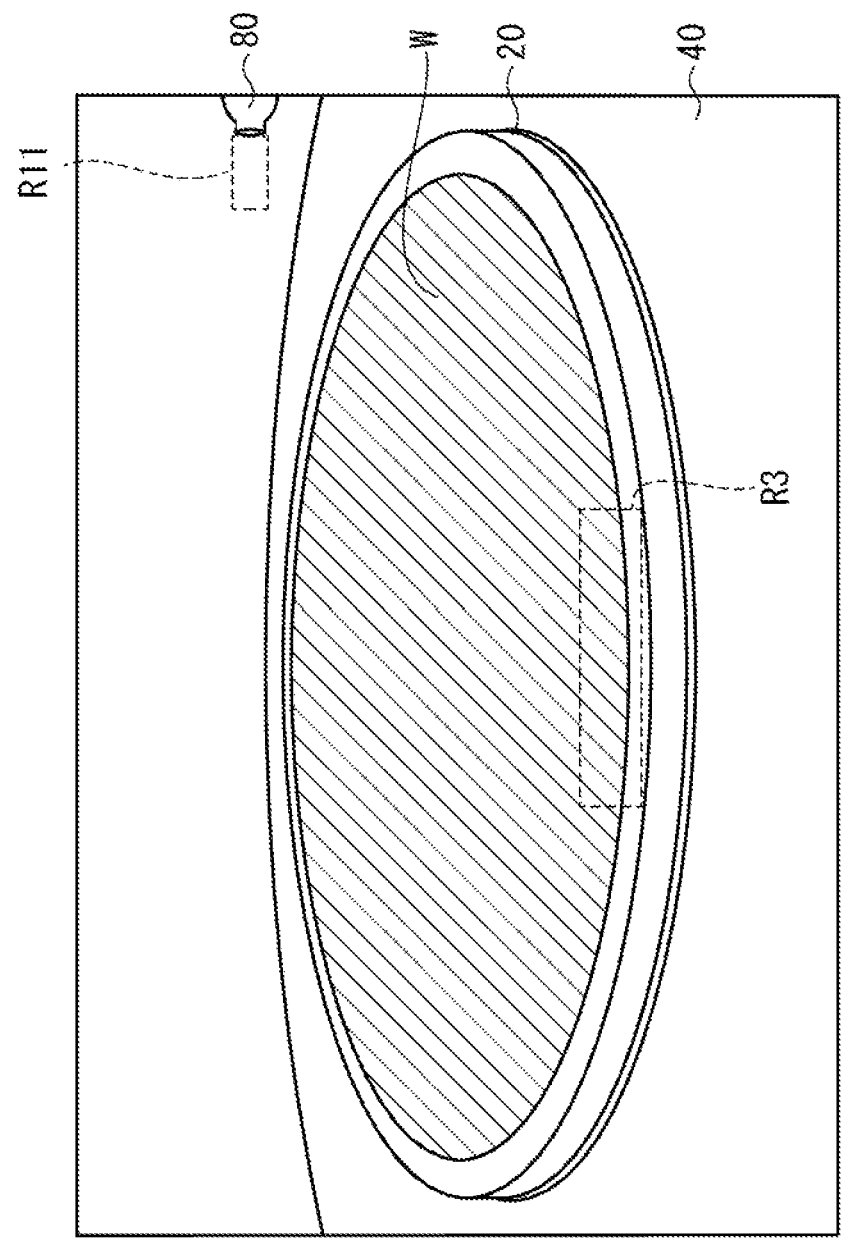
FIG. 14 is a view schematically showing an example of the captured image data.
Figure 15:
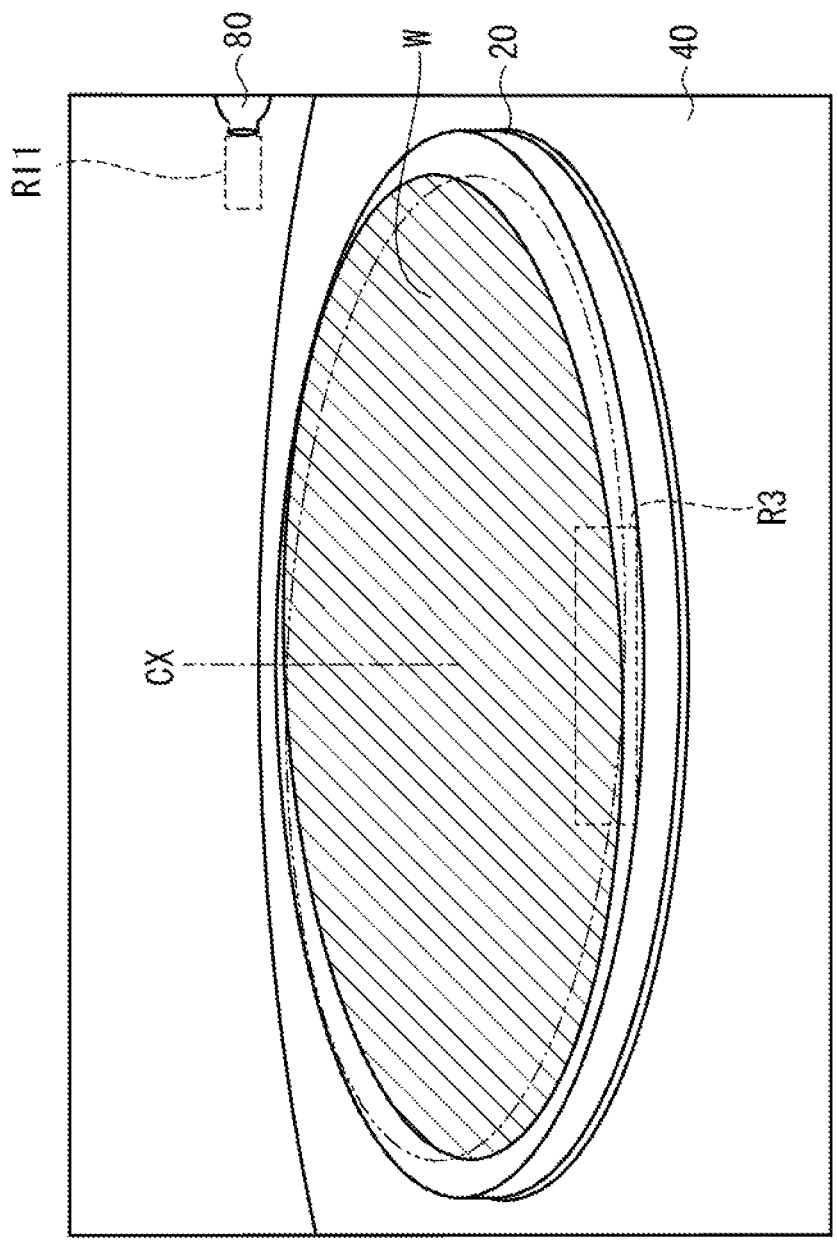
FIG. 15 is a view schematically showing an example of the captured image data.
Figure 16:
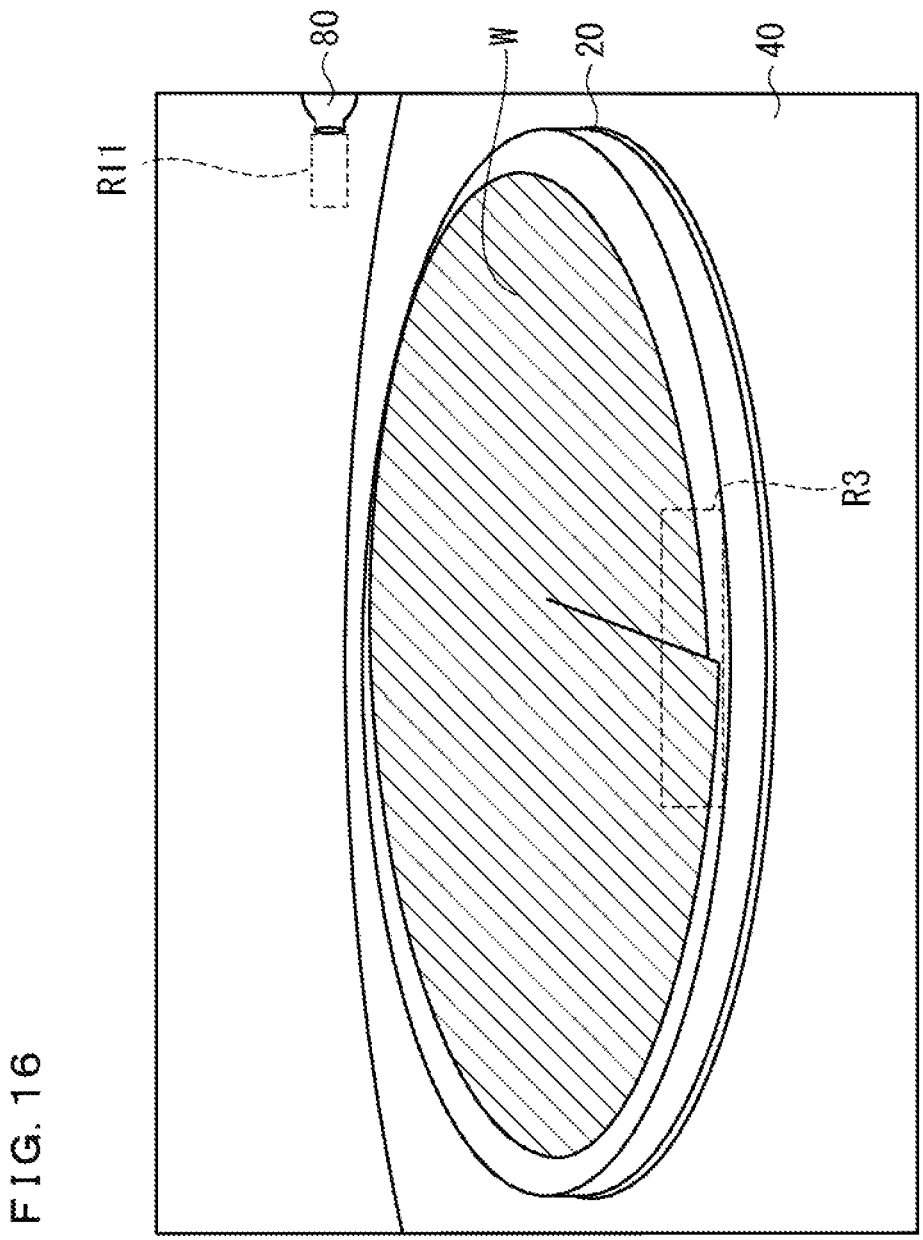
FIG. 16 is a view schematically showing an example of the captured image data.

FIGS. 14 to 16 are diagrams schematically showing examples of captured image data acquired during the rotation step. FIGS. 14 to 16 each show captured image data acquired before the processing cup 40 rises. That is, FIGS. 14 to 16 show pieces of captured image data in steps from the start of the rotation step (step S3) to the cup lifting step (step S4). FIG. 14 shows a state where the spin chuck 20 holds the substrate W in the horizontal orientation, FIG. 15 shows a state where the spin chuck 20 holds the substrate W in an inclined orientation, and FIG. 16 shows a state where the substrate W has been cracked. The chuck pins 26 for holding the substrate W can be included in the captured image data, but are omitted in each of FIGS. 14 to 16 in order to avoid the complication of illustration.

When the spin chuck 20 holds the substrate W in the horizontal orientation and rotates the substrate W, ideally, the peripheral (contour) shape of the substrate W is always constant. In the shown example, with the camera 70 obliquely imaging the substrate W, the periphery of the substrate W in the captured image data has an elliptical shape. Ideally, the peripheral shape of the substrate W is always constant in a plurality of pieces of captured image data sequentially acquired during the rotation of the substrate W. However, in practice, the position of the periphery of the substrate W slightly fluctuates during the rotation of the substrate W.

On the other hand, the rotation axis CX of the spin chuck 20 is not orthogonal to the substrate W when the spin chuck 20 holds the substrate W in the inclined orientation. Thus, when the spin chuck 20 rotates the substrate W, the peripheral shape of the substrate W is relatively greatly different in a plurality of pieces of captured image data. That is, the periphery of the substrate W fluctuates greatly. In the example of FIG. 15, the periphery of the substrate W acquired at a different timing is schematically shown by a virtual line.

In addition, when a crack has occurred in the periphery of the substrate W, the shape of the periphery of the substrate W is less similar to the elliptical shape. In the example of FIG. 16, a step height due to the crack has been generated at the periphery of the substrate W. In this case as well, when the spin chuck 20 rotates the substrate W, the position of the periphery of the substrate W is relatively greatly different in a plurality of pieces of captured image data. That is, the periphery of the substrate W fluctuates greatly.

Therefore, the monitoring processor 91 acquires a difference in the peripheral shape of the substrate W between the plurality of pieces of captured image data sequentially acquired by the camera 70 and determines whether or not the difference is equal to or smaller than a predetermined substrate tolerance. The monitoring processor 91 determines that the spin chuck 20 holds the normal substrate W in the horizontal orientation when the difference is equal to or smaller than the substrate tolerance, and determines that the holding abnormality or the shape abnormality of the substrate has occurred when the difference is larger than the substrate tolerance.

Note that the monitoring processor 91 does not need to compare the entire peripheral shape of the substrate W between the pieces of captured image data but, for example, may compare the shape of a part of the periphery of the substrate W on the front side or a part of the periphery of the substrate W on the back side between the pieces of captured image data. In the examples of FIGS. 14 to 16, a substrate determination region R3 has been set in the captured image data. In the examples of FIGS. 14 to 16, the substrate determination region R3 is a region including a part on the front side of the periphery of the substrate W and has a shape extending along the periphery of the substrate W.

For example, the monitoring processor 91 cuts out the substrate determination region R3 of the captured image data, calculates a difference between the substrate determination regions R3 of two pieces of captured image data, and acquires a difference image. Specifically, the monitoring processor 91 performs subtraction on pixel values of pixels at the same positions in the substrate determination regions R3 to acquire the difference image. By the subtraction, in the substrate determination regions R3, pixel values in first regions, which are the same as each other, are offset and pixel values in second regions, which are different from each other, are emphasized. That is, the absolute value of the pixel value of the pixel in the second region is larger than the absolute value of the pixel value of the pixel in the first region. Therefore, in the difference image, a region (hereinafter referred to as a peripheral difference) sandwiched between the peripheries of the substrates W in the two substrate determination regions R3 is emphasized.

Figure 17:
FIG. 17 is a view schematically showing an example of edge image data.
Figure 18:
FIG. 18 is a view schematically showing an example of the edge image data.

Next, the monitoring processor 91 performs edge extraction processing such as the Canny method on the difference image to acquire an edge image. FIGS. 17 and 18 are diagrams schematically showing an example of an edge image. FIG. 17 shows an edge image when the spin chuck 20 holds the normal substrate W in the horizontal orientation, and FIG. 18 shows an edge image when the spin chuck 20 holds the normal substrate W in an inclined orientation. In the examples of FIGS. 17 and 18, an edge 201 corresponds to the peripheral difference. As can be understood from FIGS. 17 and 18, although the edge image includes a plurality of edges, the longest edge 201 extending in an arc shape corresponds to the peripheral difference.

As can be understood from FIGS. 17 and 18, the circumferential length of the edge 201 when the normal substrate W is held in the horizontal orientation is shorter than the circumferential length of the edge 201 at the time of the holding abnormality. This is considered to be because due to large fluctuation in the vertical direction of the periphery of the substrate W at the time of the holding abnormality, the position of the periphery of the substrate W varies in the vertical direction in a wider range in the circumferential direction. Also, when the substrate W is cracked, the variation of the periphery of the substrate W in the vertical direction is large, so that the circumferential length of the edge 201 becomes long.

Therefore, the monitoring processor 91 calculates the circumferential length of the edge 201 from the edge image, determines whether or not the length is equal to or smaller than a predetermined substrate reference value, and determines that the spin chuck 20 holds the normal substrate W in the horizontal orientation when the length is equal to or smaller than the substrate reference value. On the other hand, the monitoring processor 91 determines that the holding abnormality or the shape abnormality of the substrate has occurred when the length is longer than the substrate reference value.

As described above, in the substrate monitoring process for monitoring the occurrence or non-occurrence of the holding abnormality and the shape abnormality of the substrate, it is necessary to detect the position of the periphery of the substrate W. Therefore, the condition setter 92 desirably sets the resolution to the high resolution as the imaging condition of the captured image data used for the substrate monitoring process. In other words, the condition setter 92 sets the resolution to the high resolution as the imaging condition in the rotation period of the substrate W before the processing cup 40 rises. This enables the monitoring processor 91 to detect the holding abnormality or the shape abnormality of the substrate with higher accuracy.

On the other hand, in the substrate monitoring process, although the difference image between the plurality of pieces of captured image data is acquired, the holding abnormality or the shape abnormality of the substrate can be detected without increasing the frame rate. Therefore, the condition setter 92 may set the frame rate to the low frame rate as the imaging condition of the captured image data used for the substrate monitoring process. In other words, the condition setter 92 may set the frame rate to the low frame rate as the imaging condition in the rotation period of the substrate W before the processing cup 40 rises. Accordingly, the processing load of the monitoring processor 91 can be reduced.

When the shape abnormality of the substrate has occurred, the fluctuation in the periphery of the substrate W increases, and hence there is a possibility that the shape abnormality of the substrate can be detected even when the resolution is set to the low resolution. Therefore, in a case where the holding abnormality is not the monitoring target but the shape abnormality of the substrate is the monitoring target, the condition setter 92 may set the resolution to the low resolution.

In addition, the occurrence or non-occurrence of the holding abnormality or the shape abnormality of the substrate does not necessarily need to be monitored in the rotation period of the substrate before the processing cup 40 rises. In a step where the camera 70 can image the periphery of the rotating substrate W, it is possible to monitor the holding abnormality or the shape abnormality of the substrate.

<Eccentricity Abnormality>

In the holding step (step S2), when the spin chuck 20 holds the substrate W, the substrate W may be shifted with respect to the spin chuck 20 in a plan view. When the center of the substrate W deviates from the rotation axis CX of the spin chuck 20 by exceeding a predetermined eccentricity tolerance, the substrate W does not appropriately rotate in the rotation step (step S3). Hereinafter, an abnormality in which the center of the substrate W deviates from the rotation axis CX beyond the eccentricity tolerance is referred to as an eccentricity abnormality. When such an eccentricity abnormality occurs, there is a case where the substrate W cannot be processed appropriately.

Therefore, the eccentricity abnormality of the substrate W may be adopted as the monitoring target. Hereinafter, a specific example of an eccentricity monitoring process for monitoring the occurrence or non-occurrence of the eccentricity abnormality of the substrate W will be described.

Figure 19:
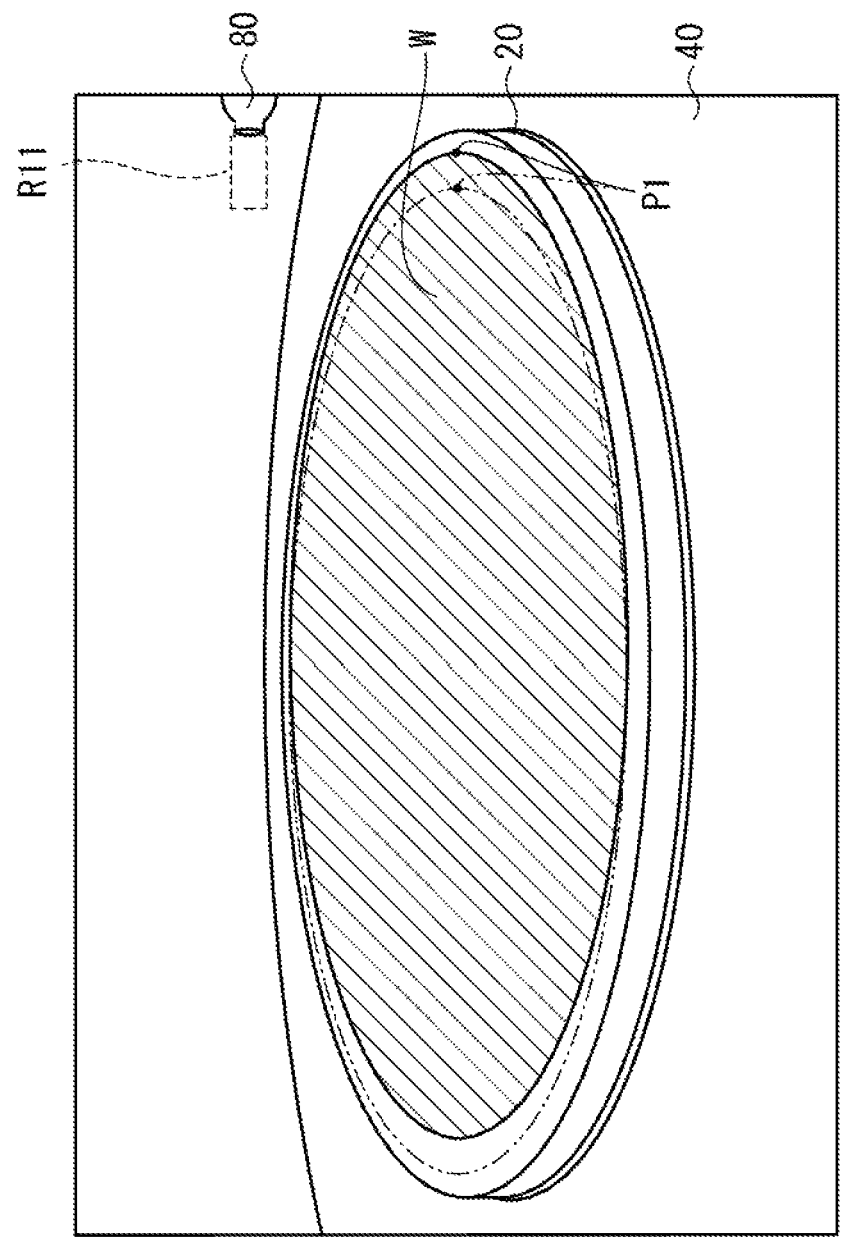
FIG. 19 is a view schematically showing an example of the captured image data.

FIG. 19 is a view schematically showing an example of captured image data acquired during the rotation step. FIG. 19 shows captured image data acquired before the processing cup 40 rises. That is, FIG. 19 shows captured image data in steps from the start of the rotation step (step S3) to the cup lifting step (step S4). FIG. 19 shows a state where the eccentricity abnormality has occurred. When the substrate W is eccentric, the position of the periphery of the substrate W varies in accordance with the rotational position of the substrate W. For example, in the captured image data, the periphery of the substrate W has an elliptical shape, and a point P1 at which the major axis of the periphery of the substrate W intersects the periphery of the substrate W varies in the lateral direction in accordance with the rotational position of the substrate W. In the example of FIG. 19, the substrate W acquired at a different timing is schematically shown by a virtual line.

Figure 20:
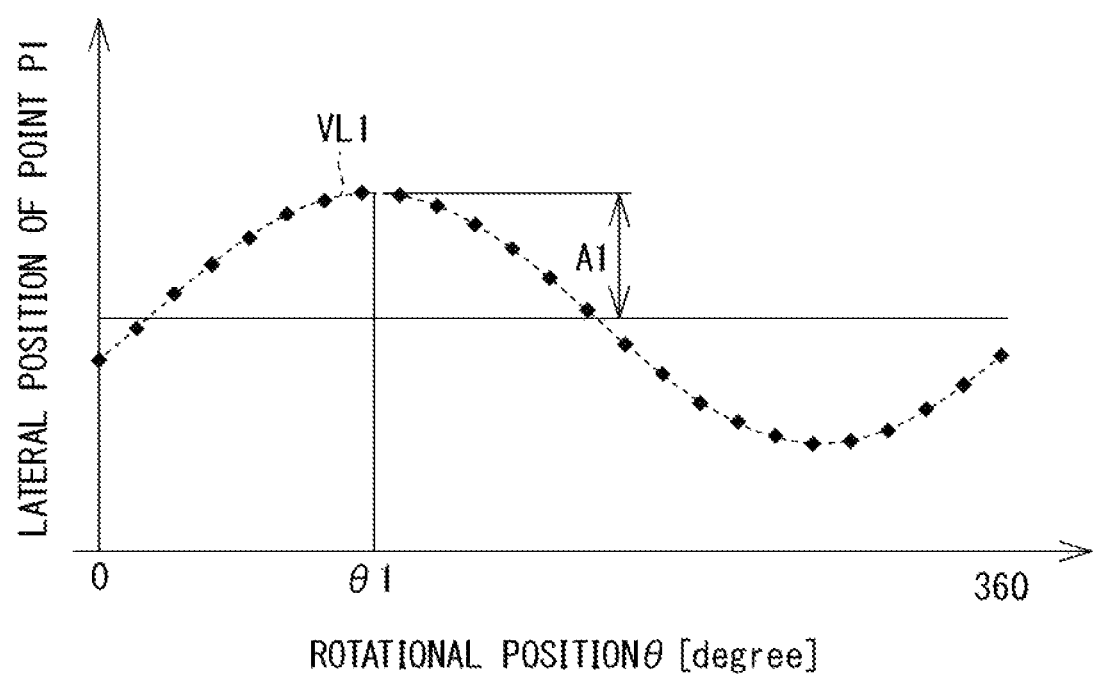
FIG. 20 is a graph schematically showing an example of a relationship between a position and a rotation angle of a substrate.

FIG. 20 is a graph showing an example of the relationship between the point P1 and a rotation angle θ of the substrate W. As shown in FIG. 20, the point P1 varies sinusoidally with the rotation angle θ as a variable. The position of the point P1 in the lateral direction in FIG. 20 is shown to be larger as being located on the right side in FIG. 19. The rotation angle θ1 when the point P1 is the largest indicates the eccentricity direction of the substrate W, and an amplitude A1 of the point P1 indicates the eccentricity amount between the substrate W and the rotation axis CX.

Therefore, first, the monitoring processor 91 detects the position of the point P1 in each of the plurality of pieces of captured image data. For example, the monitoring processor 91 may perform edge extraction processing on each captured image data to acquire an edge image, specify an elliptical edge having an elliptical shape from the edge image, and specify the rightmost point of the elliptical edge as the point P1. Alternatively, the monitoring processor 91 may calculate an elliptical approximate line closest to the elliptical edge by, for example, a least squares method or the like and calculate an intersection of the major axis of the elliptical approximate line and the elliptical approximate line as the point P1.

Next, the monitoring processor 91 performs curve interpolation processing, such as spline interpolation processing, on the rotation angle θ of the substrate W at each acquisition timing when the camera 70 has acquires the captured image data and on the point P1 in each captured image data to calculate a sine wave VL1 of the point P1. Next, the monitoring processor 91 calculates an amplitude A1 (eccentricity amount) and the rotation angle θ1 (eccentricity direction) based on the sine wave VL1.

The monitoring processor 91 determines whether or not the eccentricity amount is equal to or smaller than the eccentricity tolerance, and determines that the eccentricity abnormality has not occurred when determining that the eccentricity amount is equal to or smaller than the eccentricity tolerance. On the other hand, the monitoring processor 91 determines that the eccentricity abnormality has occurred when the eccentricity amount is larger than the eccentricity tolerance.

In such an eccentricity monitoring process, the position of the point P1 can be detected with higher accuracy as the resolution of the captured image data is higher. Therefore, the condition setter 92 sets the resolution to the high resolution as the imaging condition of the captured image data used for the eccentricity monitoring process. In other words, the condition setter 92 sets the resolution to the high resolution as the imaging condition in the rotation period of the substrate W before the processing cup 40 rises. This enables the monitoring processor 91 to detect the eccentricity abnormality with higher accuracy.

On the other hand, in the eccentricity monitoring process, it is sufficient that there are a plurality of plot points for the point P1 during one rotation of the substrate W, and the frame rate is not necessarily high. In addition, even when the number of plot points is increased, it is not necessary to increase the frame rate so long as the rotation speed of the substrate W is decreased. Thus, the condition setter 92 may set the frame rate to the low frame rate as the imaging condition of the captured image data used for the eccentricity monitoring process. In other words, the condition setter 92 may set the frame rate to the low frame rate as the imaging condition in the rotation period of the substrate W before the processing cup 40 rises. Accordingly, the processing load of the monitoring processor 91 can be reduced.

<Carry-In Position of Substrate W>

In the carry-in step (step S1), the main transport robot 103 carries the substrate W into the processing unit 1. For example, the main transport robot 103 first moves the substrate W to a space above the spin chuck 20. Next, the main transport robot 103 lowers the substrate W and delivers the substrate W to the spin chuck 20. When the delivery position (carry-in position) is shifted in a plan view, the eccentricity abnormality of the substrate W may occur. Hereinafter, the fact that the carry-in position is shifted beyond a predetermined carry-in tolerance is referred to as a carry-in abnormality.

Therefore, the occurrence or non-occurrence of the carry-in abnormality of the substrate W may be adopted as the monitoring target. Hereinafter, a specific example of a carry-in monitoring process for monitoring the occurrence or non-occurrence of the carry-in position abnormality of the substrate W will be described.

The camera 70 sequentially acquires captured images in the carry-in step. The monitoring processor 91 detects the position of the center of the substrate W as the carry-in position based on the captured image data. For example, as described above, the monitoring processor 91 may acquire an edge image from the captured image data, identify an elliptical edge from the edge image, and calculate an elliptical approximate line from the elliptical edge. The monitoring processor 91 calculates the center of the elliptical approximate line as the position of the center of the substrate W. For example, when the position of the center of the substrate W becomes constant in a plurality of pieces of captured image data, the monitoring processor 91 may determine that the substrate W has been delivered to the spin chuck 20 and specify the position of the center of the substrate W as the carry-in position. The monitoring processor 91 determines whether or not the difference between the carry-in position and a predetermined reference carry-in position is equal to or smaller than a predetermined carry-in tolerance, and determines that no carry-in abnormality has occurred when the difference is equal to or smaller than the carry-in tolerance. On the other hand, the monitoring processor 91 determines that the carry-in abnormality has occurred when the difference is larger than the carry-in tolerance.

As the resolution of the captured image data is higher, the monitoring processor 91 can detect the position of the center of the substrate W with higher accuracy. Therefore, the condition setter 92 sets the resolution to the high resolution as the imaging condition of the captured image data used for the carry-in monitoring process. In other words, the condition setter 92 sets the resolution to the high resolution as the imaging condition in the execution period of the carry-in step. This enables the monitoring processor 91 to detect the carry-in abnormality with higher accuracy.

On the other hand, the carry-in monitoring process does not require the high frame rate. Thus, the condition setter 92 may set the frame rate to the low frame rate as the imaging condition of the captured image data used for the carry-in monitoring process. In other words, the condition setter 92 may set the frame rate to the low frame rate as the imaging condition in the execution period of the carry-in step. Accordingly, the processing load of the monitoring processor 91 can be reduced.

<Processing Cup Abnormality>

In the cup lifting step (step S4), for example, the processing cup 40 may not appropriately rise due to an abnormality of the cup lifting mechanism or the like. That is, the processing cup 40 may stop in the state of being shifted from a predetermined upper position. In this case, there is a possibility that the processing liquid scattered from the periphery of the substrate W cannot be collected appropriately. Hereinafter, an abnormality in which the processing cup 40 is shifted from a predetermined cup reference position by more than a predetermined cup tolerance is referred to as a cup position abnormality.

In addition, a shape abnormality may occur in the processing cup 40. For example, the processing cup 40 may be deformed. When the shape abnormality occurs in the processing cup 40 as described above, there is a possibility that the correction of the processing liquid become inadequate. Hereinafter, an abnormality in the shape of the processing cup 40 is referred to as a cup shape abnormality.

Therefore, the occurrence or non-occurrence of the cup position abnormality and the cup shape abnormality may be adopted as the monitoring targets. Hereinafter, a specific example of a cup monitoring process for monitoring the occurrence or the non-occurrence of the cup position abnormality and the cup shape abnormality will be described.

The camera 70 acquires captured image data in the cup lifting step (step S4). The monitoring processor 91 detects the position of the processing cup 40 based on the captured image data. For example, the monitoring processor 91 detects the position of the processing cup 40 by pattern matching between the captured image data and reference image data obtained by imaging the normal processing cup 40.

Since the processing cup 40 moves in the cup lifting step (step S4), the monitoring processor 91 determines the suitability of the position of the processing cup 40 after the processing cup 40 is stopped. More specifically, when the position of the processing cup 40 falls within a predetermined range in a plurality of pieces of captured image data, the monitoring processor 91 determines that the processing cup 40 is stopped and determines the suitability of the position of the processing cup 40. For example, the monitoring processor 91 determines whether the difference between the position of the processing cup 40 and the cup reference position is equal to or smaller than a predetermined cup position tolerance, and determines that no cup position abnormality has occurred when the difference is equal to or smaller than the cup position tolerance. On the other hand, the monitoring processor 91 determines that the cup position abnormality has occurred when the difference is larger than the cup position tolerance.

Next, the cup shape abnormality will be described. When the cup shape abnormality has occurred, the difference between a region including the processing cup 40 in the captured image data and the reference image data including the normal processing cup 40 stopped at the normal position increases. Therefore, for example, the monitoring processor 91 calculates a difference between the reference image data and the captured image data and acquires a difference image. Next, the monitoring processor 91 performs binarization processing on the difference image to acquire a binarized image. In the binarized image, the absolute value of the pixel value of the portion where the captured image data and the reference image data are different from each other increases. For example, the monitoring processor 91 obtains an area of a portion having a large pixel value and determines whether or not the area is equal to or smaller than a predetermined cup shape tolerance. The monitoring processor 91 determines that no cup shape abnormality has occurred when the area is equal to or smaller than the cup shape tolerance, and determines that the cup shape abnormality has occurred in the processing cup 40 when the area is larger than the cup shape tolerance.

As the resolution of the captured image data is higher, the position of the processing cup 40 and the above difference can be detected with higher accuracy. Therefore, the condition setter 92 sets the resolution to the high resolution as the imaging condition of the captured image data used for the processing cup monitoring process. In other words, the condition setter 92 sets the resolution to the high resolution as the imaging condition in the execution period of the cup lifting step. Accordingly, the monitoring processor 91 can monitor the occurrence or non-occurrence of the cup position abnormality and the cup shape abnormality with high accuracy.

On the other hand, the frame rate is not necessarily high for monitoring the processing cup 40. Thus, the condition setter 92 may set the frame rate to the low frame rate as the imaging condition of the captured image data used for the processing cup monitoring process. In other words, the condition setter 92 may set the frame rate to the low frame rate as the imaging condition in the execution period of the cup lifting step. Accordingly, the processing load of the monitoring processor 91 can be reduced.

Note that the cup monitoring process may be performed not only in the cup lifting step (step S4) but also in the cup lowering step (step S7).

Not only the position but also the shape of the processing cup 40 are monitored. Not only the position but also the shape of the nozzle may also be monitored. That is, the monitoring processor 91 may monitor the occurrence or non-occurrence of an abnormality in the shape of the nozzle.

<Imaging Conditions in Accordance with Position Shape Monitoring and Aging Monitoring>

FIG. 21 is a table showing imaging conditions in accordance with the monitoring target described above. As exemplified in FIG. 21, the resolution is set to the high resolution for the captured image data used for the monitoring process related to the position abnormality and shape abnormality of the nozzle, the holding abnormality, shape abnormality, carry-in abnormality, and eccentricity abnormality of the substrate, and the position abnormality and shape abnormality of the processing cup. In short, when the position or shape of the object in the chamber 10 is the monitoring target, the condition setter 92 sets the resolution to the high resolution.

This enables the monitoring processor 91 to monitor the position or shape of the object with high accuracy. On the other hand, the condition setter 92 may set the frame rate to the low frame rate when the position or shape of the object in the chamber 10 is the monitoring target. In this case, the processing load of the monitoring processor 91 can be reduced.

On the other hand, the frame rate is set to the high frame rate for the captured image data used for the processing liquid monitoring process related to the ejection start and ejection stop of the processing liquid from the nozzle, the liquid splash, dripping, and outflow of the processing liquid, and the like. That is, when the state change over time in the processing liquid in the chamber 10 is the monitoring target, the condition setter 92 sets the frame rate to the high frame rate. This enables the monitoring processor 91 to monitor the state change over time in the processing liquid with high accuracy. On the other hand, the condition setter 92 may set the resolution to the low resolution when a state change over time in the chamber 10 is a monitoring target. In this case, the processing load of the monitoring processor 91 can be reduced.

However, for the captured image data used for both the monitoring process related to the position or shape of the object and the monitoring process related to the state change over time in the processing liquid, the frame rate is set to the high frame rate while the resolution is set to the high resolution. As a result, the monitoring processor 91 can monitor the position or shape of the object and the state change over time in the processing liquid with high accuracy.

<Still Another Example of Monitoring Target>
<Etching Endpoint>

For example, when the first nozzle 30 ejects an etching liquid as the processing liquid in step ST3, the etching target on the upper surface of the substrate W is etched by the processing liquid. Specifically, as time elapses from the ejection start of the processing liquid, the etching target is removed, and an underlying layer located immediately below the etching target is exposed. When the etching process time (processing liquid ejection time) deviates from a specified time, etching becomes insufficient or excessive.

When the etching target on the upper surface of the substrate W is removed, the underlying layer is exposed, and hence a change in exposure appears in the captured image data. That is, due to the difference in reflectance of light between the etching target and the underlying layer, the pixel value of the pixel corresponding to the substrate W in the captured image data is different between a state where the etching target is exposed and a state where the underlying layer is exposed. Thus, the timing (etching endpoint) at which the removal of the etching target of the substrate W is substantially completed can be detected by a change over time in the pixel value.

Therefore, the etching endpoint may be adopted as the monitoring target. Hereinafter, a specific example of an etching monitoring process for monitoring the etching endpoint will be described.

FIG. 22 shows an example of the captured image data acquired in step ST3. The captured image data of FIG. 22 includes the first nozzle 30 that ejects the etching liquid. That is, FIG. 22 shows captured image data acquired after the first nozzle 30 starts ejecting the etching liquid.

In the example of FIG. 22, a plurality of etching determination regions R4 are set in the captured image data. In the example of FIG. 22, three etching determination regions R4 are arranged side by side from the central portion toward the periphery side of the substrate W. That is, the three etching determination regions R4 are set at different positions in the radial direction with respect to the substrate W.

As the etching progresses, the pixel values in the etching determination region R4 gradually change with the lapse of time, and when the etching in the etching determination region R4 is completed, a change over time in the pixel value decreases. FIG. 23 is a graph showing an example of the change over time in the luminance value in one etching determination region R4. Here, as the luminance value in the etching determination region R4, the sum or average value of the pixel values in the etching determination regions R4 is adopted.

As shown in FIG. 23, the luminance value is initially substantially flat with respect to time. In the example of FIG. 23, the luminance value decreases with the lapse of time after time point T1 when the ejection of the etching liquid is started, and the luminance value is again leveled off with respect to time after time point T2. This is because the etching target is gradually removed in the period between time point T1 and time point T2, and hence the luminance value changes in accordance with the removal of the etching target, whereas the etching target is completely removed at time point T2.

Therefore, for example, the monitoring processor 91 calculates the sum or average value of the pixel values in the etching determination regions R4 as the luminance value and calculates a differential value that is an amount of change in the luminance value with respect to the unit time. Then, the monitoring processor 91 detects a time point at which the differential value falls below a predetermined differential reference value as time point T1 and detects a time point at which the differential value exceeds the differential reference value as time point T2. Time point T2 is the etching endpoint in the etching determination region R4.

The etching endpoints of the etching determination regions R4 may be different from each other. For example, when the first nozzle 30 ejects the etching liquid to the central portion of the substrate W, the etching endpoint may be earlier in the etching determination region R4 closer to the center.

Further, when the first nozzle 30 ejects the etching liquid while oscillating between the center position P31 and the peripheral position P32, each etching endpoint can change in accordance with a change in the moving speed of the first nozzle 30, the flow rate of the etching liquid at each position on the oscillation path, and the like. For example, the etching endpoint of the central etching determination region R4 among the three etching determination regions R4 may be the earliest.

When the monitoring processor 91 can detect the etching endpoints of all the etching determination regions R4, the processing controller 93 may close the valve 35 and end the ejection of the etching liquid from the first nozzle 30. This can reduce the possibility of insufficient etching in all the etching determination regions R4.

In such an etching monitoring process, the luminance value that is the sum or average in the etching determination regions R4 does not greatly depend on the level of resolution. Thus, the condition setter 92 may set the resolution to the low resolution as the imaging condition of the captured image data used for the etching monitoring process. In other words, the condition setter 92 may set the resolution to the low resolution as the imaging condition in the execution period of step ST3. This can reduce the processing load of the monitoring processor 91.

In addition, since the rate at which etching proceeds is not so high, the high frame rate is not required. Thus, the condition setter 92 may set the frame rate to the low frame rate as the imaging condition of the captured image data used for the etching monitoring process. In other words, the condition setter 92 may set the frame rate to the low frame rate as the imaging condition in the execution period of step ST3. This can reduce the processing load of the monitoring processor 91.

When the state change of the processing liquid is also adopted as the monitoring target in step ST3, the condition setter 92 sets the frame rate to the low frame rate as the imaging condition in step ST3.

<Drying Abnormality>

Figure 24:
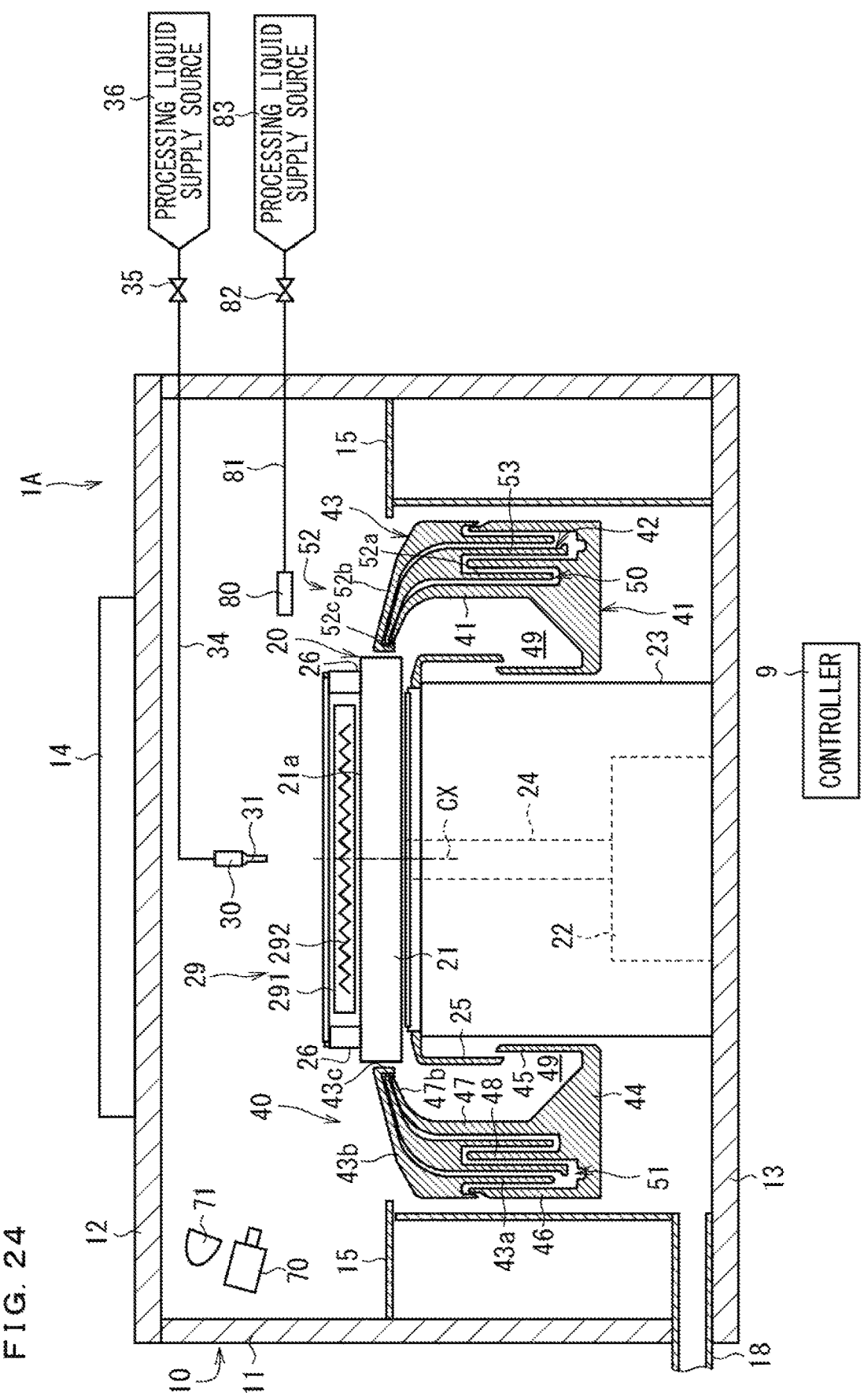
FIG. 24 is a longitudinal sectional view schematically showing an example of the configuration of the processing unit.

FIG. 24 is a view schematically showing an example of a configuration of a processing unit 1A that is another example of the processing unit 1. The processing unit 1A has the same configuration as the processing unit 1 except for the presence or absence of a heating part 29.

The heating part 29 is heating means that heats the substrate W. The heating part 29 includes a disk-shaped hot plate 291 and a heater 292 serving as a heat source. The hot plate 291 is disposed between the upper surface 21a of the spin base 21 and the lower surface of the substrate W held by the chuck pins 26. The heater 292 is embedded inside the hot plate 291. As the heater 292, for example, an electric heating wire such as a nichrome wire that generates heat by energization is used. When the heater 292 is energized, the hot plate 291 is heated to a temperature higher than the environmental temperature.

In the processing unit 1A, the third nozzle 65 ejects not only the processing liquid (e.g., rinse liquid) but also an inert gas. The inert gas is a gas having low reactivity with the substrate W and includes, for example, a rare gas such as an argon gas or nitrogen. For example, the ejection head of the third nozzle 65 is provided with a first internal flow path and a first ejection port for the processing liquid, and a second internal flow path and a second ejection port for gas, the first internal flow path is connected to the processing liquid supply source through a first supply pipe, and the second internal flow path is connected to the gas supply source through a second supply pipe. The first supply pipe is provided with a first valve, and the second supply pipe is provided with a second valve.

Figure 25:
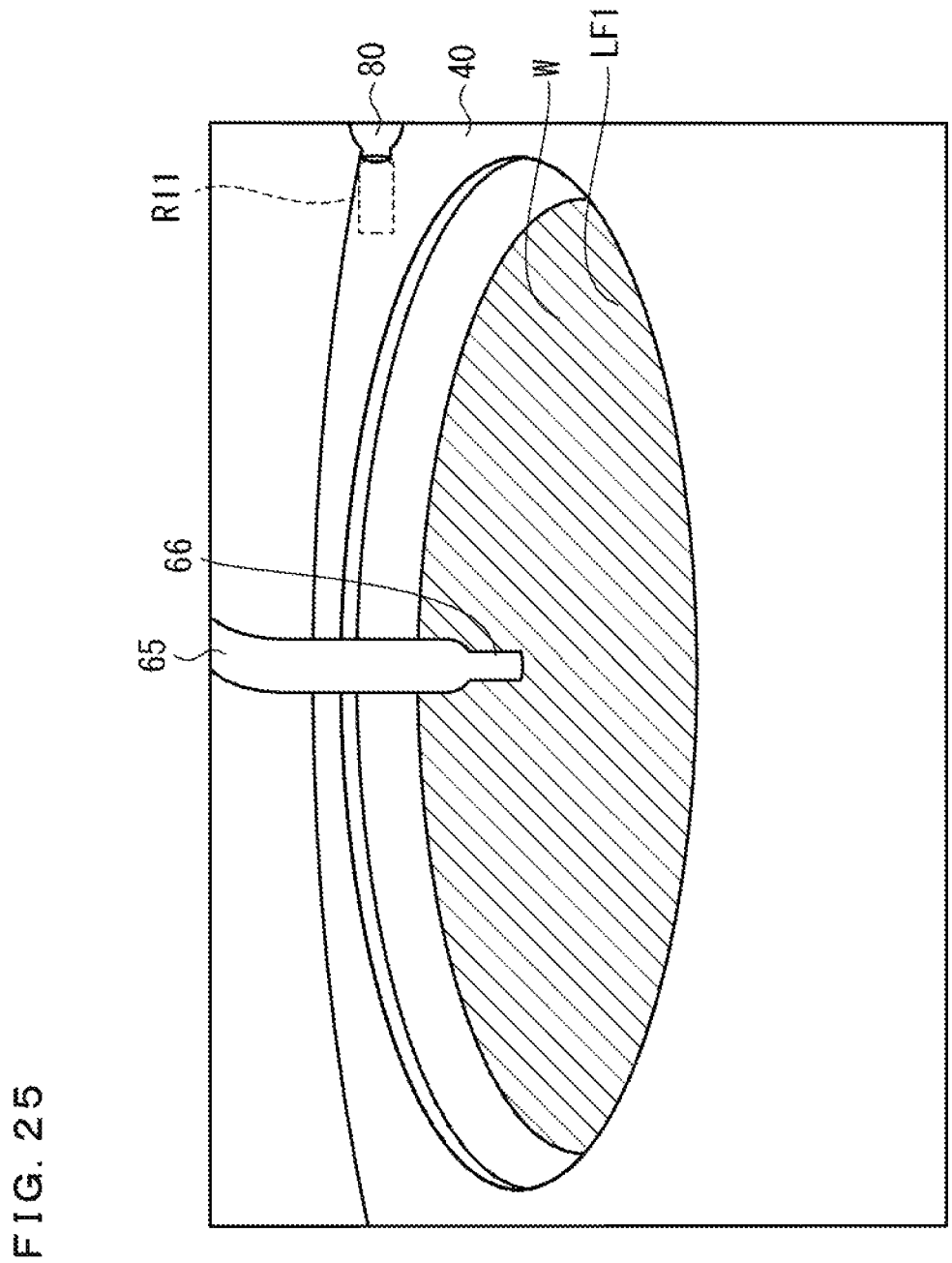
FIG. 25 is a view schematically showing an example of the captured image data.
Figure 26:
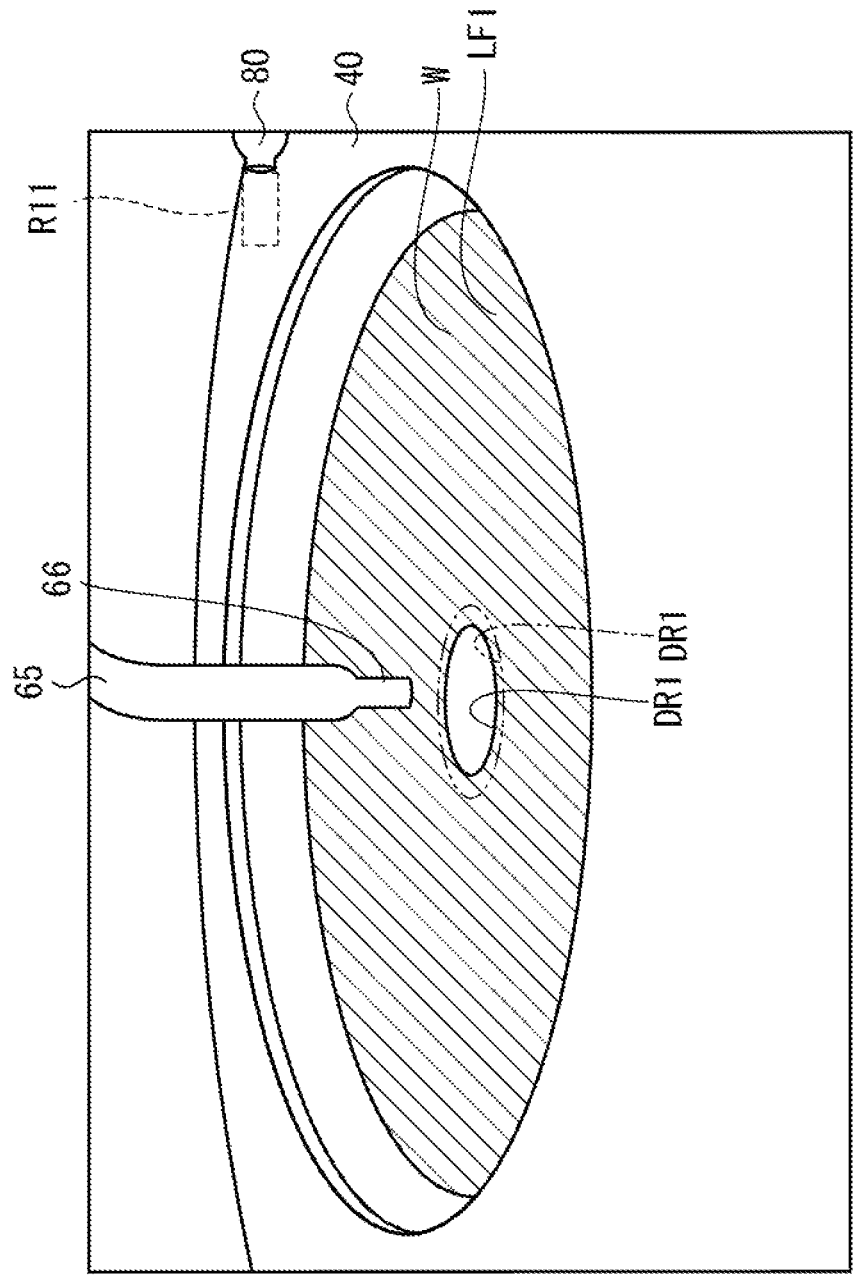
FIG. 26 is a view schematically showing an example of the captured image data.
Figure 27:
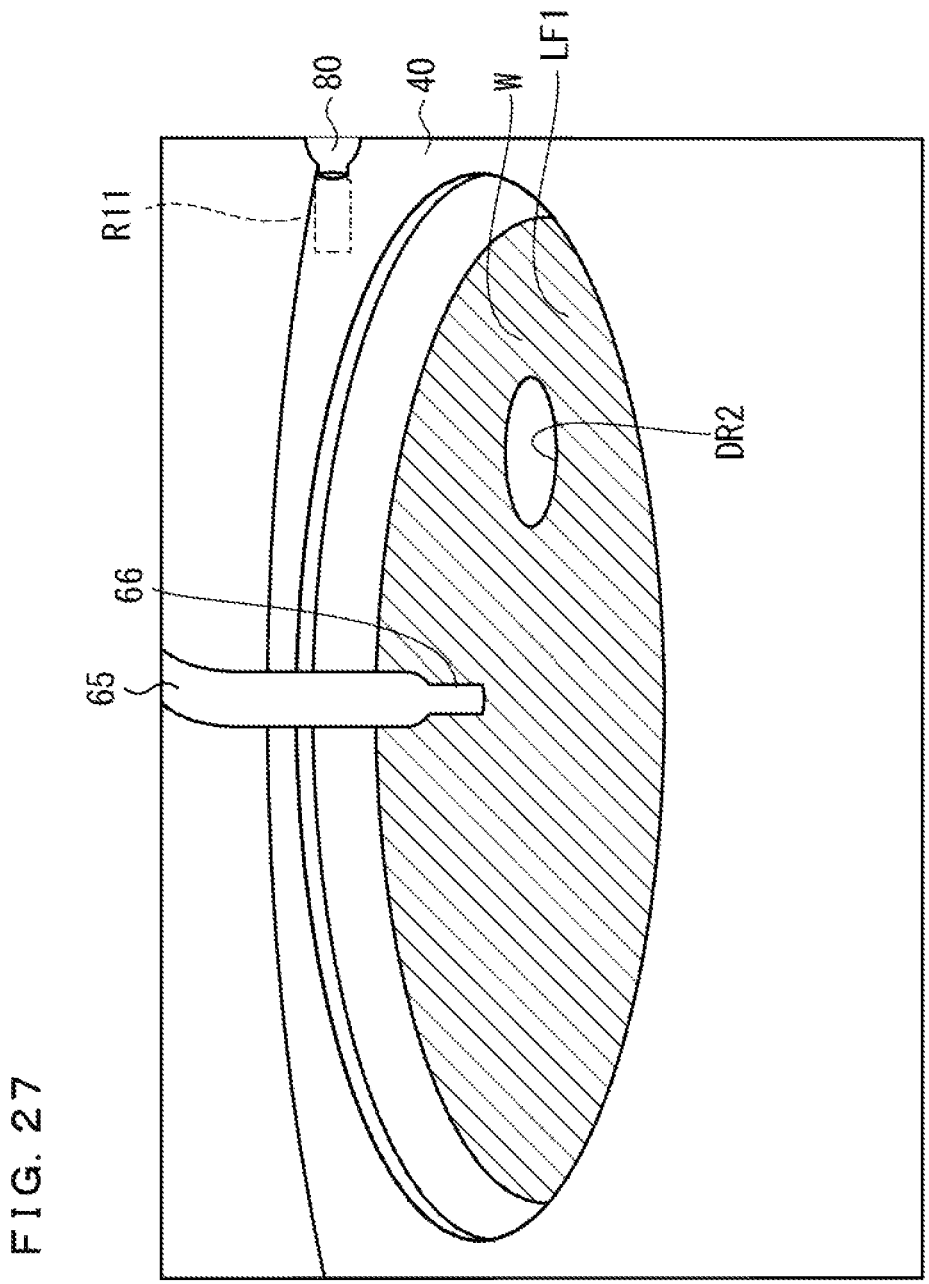
FIG. 27 is a view schematically showing an example of the captured image data.

The flow of the substrate processing by the processing unit 1A is similar to that in FIG. 6, but the drying step (step S6) is different from the specific example described above. Hereinafter, an example of the drying step in the processing unit 1A will be described. Here, the camera 70 acquires captured image data in the drying step. FIGS. 25 to 27 are diagrams schematically showing examples of the captured image data acquired in the drying step. Hereinafter, these pieces of captured image data are also referred to.

First, the third nozzle 65 moves from the standby position P68 to the center position P66. Next, for example, the third nozzle 65 supplies a rinse liquid having higher volatility than pure water to the upper surface of the rotating substrate W. The rinse liquid is, for example, isopropyl alcohol (IPA). Thereby, the rinse liquid spreads over the entire upper surface of the substrate W, and the processing liquid remaining on the upper surface of the substrate W is replaced with the rinse liquid.

Next, while the spin motor 22 stops the rotation of the substrate W, the third nozzle 65 stops the ejection of the rinse liquid. This causes the rinse liquid on the upper surface of the substrate W to stand still. That is, a liquid film LF1 of the rinse liquid is formed on the upper surface of the substrate W (cf. FIG. 25). Subsequently, the heater 292 of the heating part 29 is energized. The heating part 29 is thus heated, and the substrate W is heated by the heat of the heating part 29. Thereby, a lower layer portion in contact with the upper surface of the substrate W in the liquid film LF1 of the rinse liquid is also heated. Then, the lower layer portion of the liquid film LF1 is vaporized. As a result, a vapor layer of IPA is formed between the upper surface of the substrate W and the liquid film LF1. That is, the liquid film LF1 comes into the state of floating off the upper surface of the substrate W.

Next, the third nozzle 65 ejects the inert gas. The inert gas is ejected toward the central portion of the liquid film LF1. By the inert gas being blown against the liquid film LF1, the liquid film LF1 moves radially outward and flows outward from the periphery of the substrate W. Accordingly, an opening having a circular shape in a plan view is formed in the central portion of the liquid film LF1 (cf. FIG. 26). Since the processing liquid such as the rinse liquid is not present in the opening, the opening is a dry region DR1. The liquid film LF1 is pressed by the inert gas, sequentially moves radially outward, and flows down from the periphery of the substrate W, so that the dry region DR1 isotropically spreads with the lapse of time. That is, the dry region DR1 expands while maintaining a circular shape in the plan view. In the example of FIG. 26, the dry region DR1 in the captured image data acquired at a different timing is schematically indicated by virtual lines.

When the liquid film LF1 on the upper surface of the substrate W is removed, the third nozzle 65 stops ejecting the inert gas and moves to the standby position P68. The energization of the heater 292 of the heating part 29 is also stopped.

In the drying step described above, it is difficult to stably form and expand the dry region DR1 as intended. That is, when a large number of substrates W are sequentially processed, the position, shape, or number of the dry regions DR1 may not be in an intended state during the drying process for some of the substrates W.

For example, the substrate W is heated to form the vapor layer of the rinse liquid between the upper surface of the substrate W and the liquid film LF1. At this time, fine bubbles may be generated in the liquid film LF1, thereby generating an opening DR2 in a part of the liquid film LF1 (cf. FIG. 27). When the opening DR2 is generated in a part of the liquid film LF1 before the inert gas is blown, the vapor of the rinse liquid between the upper surface of the substrate W and the liquid film LF1 leaks from the opening DR2. Then, the vapor layer cannot be maintained, and the drying step cannot be performed appropriately.

By the blowing of the inert gas, the dry region DR1 is gradually enlarged as described above. At this time, the shape of the dry region DR1 may collapse, or a plurality of dry regions DR1 may occur. In this case as well, the drying step cannot be performed appropriately.

Hereinafter, such abnormalities related to the opening are collectively referred to as a drying abnormality. Here, the drying abnormality is adopted as the monitoring target. Hereinafter, a specific example of a drying monitoring process for monitoring the occurrence or non-occurrence of the drying abnormality will be described.

First, the monitoring of the drying abnormality that occurs before the ejection of the inert gas (FIG. 27) will be described. FIG. 25 shows a state where the liquid film LF1 of the rinse liquid is appropriately formed on the upper surface of the substrate W, and FIG. 27 shows a state where an unintended opening DR2 has been formed in the liquid film LF1 of the rinse liquid.

The monitoring processor 91 calculates a difference between the reference image data (e.g., FIG. 27) acquired by capturing an image in a normal state and the captured image data to acquire a difference image. When the opening DR2 has been formed, the absolute value of the pixel value in the portion corresponding to the opening DR2 increases in the difference image. When the area of the portion is large, it can be said that the opening DR2 has been formed. Therefore, the monitoring processor 91 determines whether or not the area of the portion having a high absolute value of the pixel value is equal to or smaller than a predetermined drying tolerance, and determines that no drying abnormality has occurred when the area is equal to or smaller than the drying tolerance. On the other hand, the monitoring processor 91 determines that the drying abnormality has occurred when the area is larger than the drying tolerance.

Figure 28:
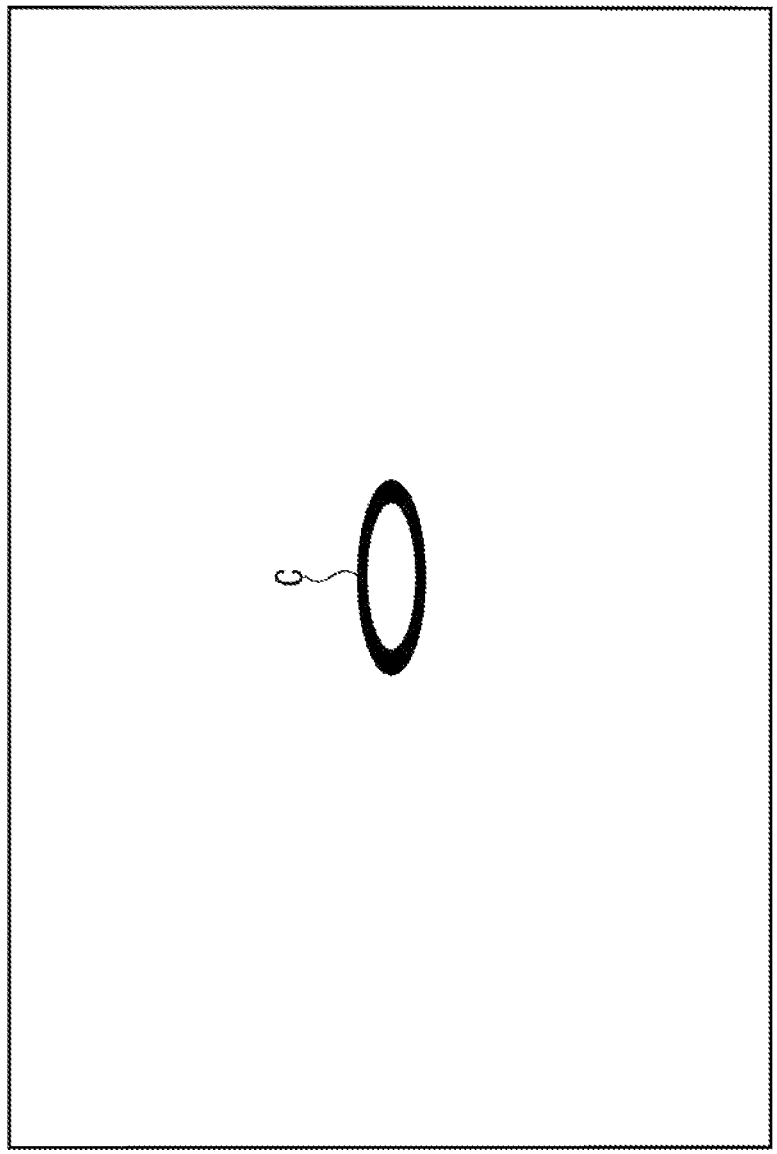
FIG. 28 is a view schematically showing an example of a difference image.

Next, an example of the monitoring of the drying abnormality that occurs after the ejection of the inert gas will be described. The monitoring processor 91 calculates a difference between two pieces of captured image data sequentially acquired after the ejection of the inert gas to acquire difference image data. FIG. 28 is a view schematically showing an example of the difference image data. The difference image data includes a closed curve C corresponding to the peripheral portion of the dry region DR1. When the dry region DR1 expands while maintaining a circular shape, the closed curve C forms an elliptical shape. When the shape of the dry region DR1 is deformed, the closed curve C is distorted from the elliptical shape.

To detect this distortion, a circularity R is introduced. The circularity R is an index indicating how close the closed curve C is to the perfect circle. The circularity R is expressed by the following formula by using a length L of the closed curve C and an area S of the closed curve C.

$$R=2\pi S/L^2 \quad (1)$$

The circularity R of the closed curve C when the closed curve C has an elliptical shape is higher than the circularity R when the closed curve C is distorted from the elliptical shape. Therefore, the monitoring processor 91 determines whether or not the circularity R of the closed curve C is equal to or larger than a predetermined drying reference value, and determines that no drying abnormality has occurred when the circularity R is equal to or larger than the drying reference value. On the other hand, monitoring processor 91 determines that the drying abnormality has occurred when circularity R is less than the drying reference value.

In the drying monitoring process, the resolution of the captured image data may be low because it is not highly necessary to know the exact shape of the dry region DR1 and the exact generation position and shape of the opening DR2. Further, the frame rate may also be low because the occurrence period of the drying abnormality described above is not so short.

Therefore, the condition setter 92 may set the resolution of the captured image data used for the drying monitoring process to the low resolution and set the frame rate to the low frame rate. In other words, the condition setter 92 may set the resolution to the low resolution and the frame rate to the low frame rate as the imaging condition in the execution period of the drying step. Accordingly, the monitoring processor 91 can monitor the drying abnormality with a low processing load.

<Fume Abnormality>

Figure 29:
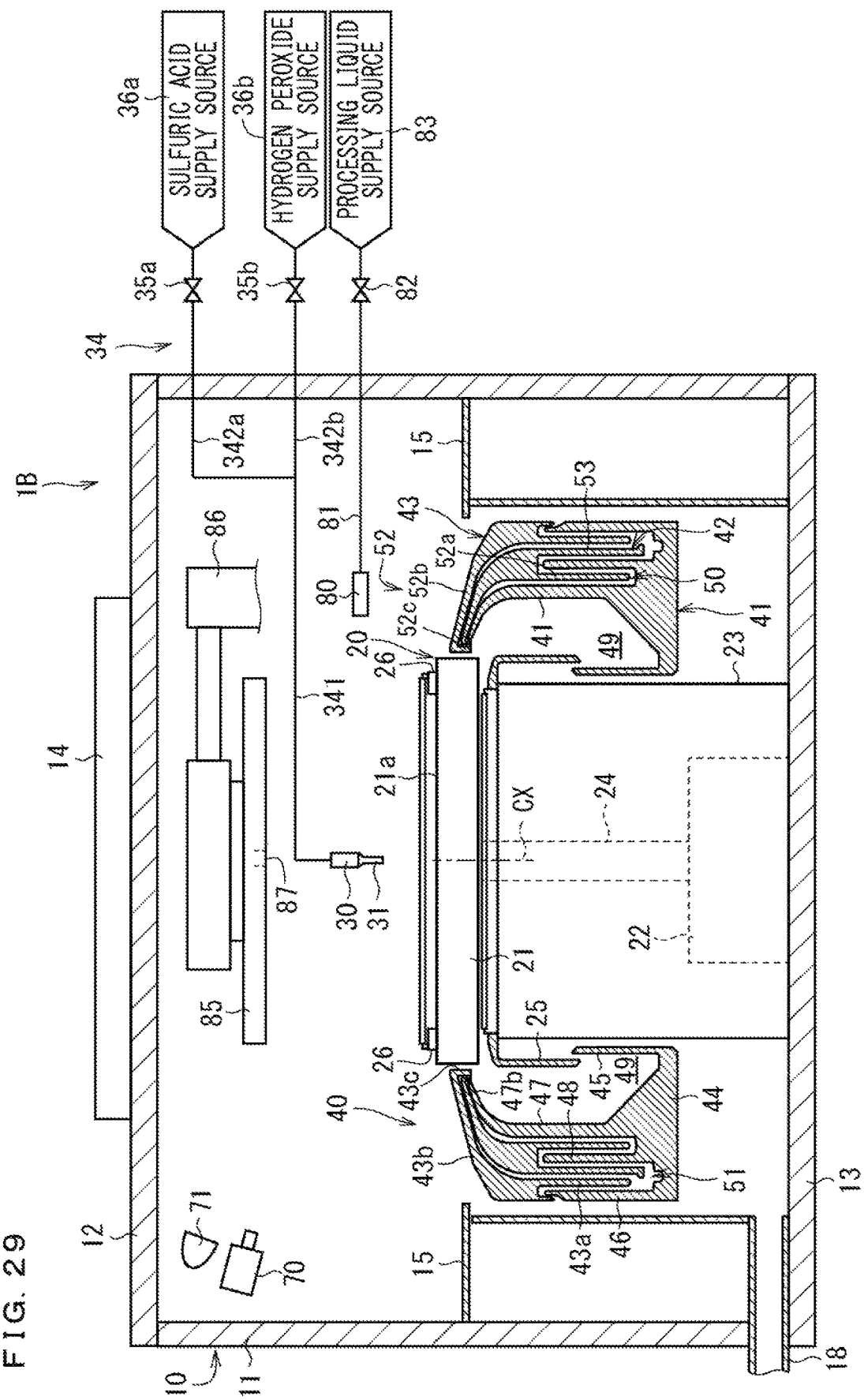
FIG. 29 is a longitudinal sectional view schematically showing an example of the configuration of the processing unit.

FIG. 29 is a view schematically showing an example of a configuration of a processing unit 1B that is another example of the processing unit 1. The processing unit 1B has the same configuration as the processing unit 1 except for the presence or absence of a shielding plate 85.

The shielding plate 85 is a member for suppressing the diffusion of gas in the vicinity of the upper surface of the substrate W. The shielding plate 85 has a disk-shaped outer shape and is horizontally disposed above the spin chuck 20. The shielding plate 85 is connected to a shielding plate lifting mechanism 86. When the shielding plate lifting mechanism 86 is operated, the shielding plate 85 moves up and down between an upper position separated upward from the upper surface of the substrate W held by the spin chuck 20 and a lower position closer to the upper surface of the substrate W than the upper position. For example, a mechanism that converts a rotational motion of a motor into a linear motion with a ball screw is used for the shielding plate lifting mechanism 86.

A blowout port 87 through which the inert gas, such as nitrogen gas, is blown out is provided at the center of the lower surface of the shielding plate 85. The blowout port 87 is connected to an air supply part (not shown) that supplies a drying gas blown to the substrate W in the drying step.

At the time of supplying the processing liquid from each of the first nozzle 30, the second nozzle 60, and the third nozzle 65 to the substrate W, the shielding plate 85 retreats to the upper position. At the time of performing the drying step for the substrate W (step S6) after the end of the processing liquid step using the processing liquid (step S4), the shielding plate 85 is lowered to the lower position by the shielding plate lifting mechanism 86. Then, a drying gas (e.g., heated nitrogen gas) is blown from the blowout port 87 toward the upper surface of the substrate W. At this time, the diffusion of the gas is prevented by the shielding plate 85. As a result, the drying gas is efficiently supplied to the upper surface of the substrate W.

In the processing unit 1B, the first nozzle 30 is connected to a sulfuric acid supply source 36a and a hydrogen peroxide supply source 36b via the supply pipe 34. The supply pipe 34 includes, for example, a junction supply pipe 341, a first supply pipe 342a, and a second supply pipe 342b. The downstream end of the junction supply pipe 341 is connected to the first nozzle 30, and the upstream end of the junction supply pipe 341 is connected to the downstream end of the first supply pipe 342a and the downstream end of the second supply pipe 342b. The upstream end of the first supply pipe 342a is connected to the sulfuric acid supply source 36a, and the upstream end of the second supply pipe 342b is connected to the hydrogen peroxide supply source 36b. The first supply pipe 342a is provided with a first valve 35a, and the second supply pipe 342b is provided with a second valve 35b.

When the first valve 35a and the second valve 35b are opened in a state where the first nozzle 30 is moved to the center position P31, the sulfuric acid supplied from the sulfuric acid supply source 36a to the first supply pipe 342a and the hydrogen peroxide supplied from the hydrogen peroxide supply source 36b to the second supply pipe 342b are merged at the junction supply pipe 341 to become a sulfuric acid and hydrogen peroxide mixture (SPM) liquid.

Then, the SPM liquid is ejected from the first nozzle 30 toward the upper surface of the substrate W held by the spin chuck 20.

<Flow of Substrate Processing>

The flow of the substrate processing by the processing unit 1B is similar to that in FIG. 6, but in the processing liquid step (step S5), the first nozzle 30 ejects a mixed liquid of sulfuric acid and hydrogen peroxide (SPM liquid) as the processing liquid. Specifically, by the processing controller 93 opening the first valve 35a and the second valve 35b, sulfuric acid and hydrogen peroxide are supplied to the first nozzle 30, and the first nozzle 30 ejects the mixed liquid toward the substrate W. The temperature of the SPM liquid is, for example, 150° C. to 200° C. Thereby, for example, a resist formed on the upper surface of the substrate W can be removed.

When the resist is sufficiently removed, the first valve 35a is closed to stop the supply of sulfuric acid. Since the hydrogen peroxide is supplied, the hydrogen peroxide extrudes and discharges sulfuric acid in the junction supply pipe 341 and the first nozzle 30 (extrusion step). This can reduce the possibility that sulfuric acid unintentionally falls from the first nozzle 30 in subsequent steps.

In this extrusion step, since the supply of sulfuric acid is stopped, the proportion of hydrogen peroxide on the upper surface of the substrate W increases. Therefore, a large amount of hydrogen peroxide may react with sulfuric acid to generate an atmosphere composed of a large number of fine particles called fumes. When the amount of fumes generated is a normal amount, the diffusion of fumes is suppressed by downflow in the chamber 10. However, when the amount of fumes generated becomes excessively large, and fumes adhere to the shielding plate 85, for example, the adhering fumes eventually solidify into particles. Then, there is a possibility that the particles scatter from the shielding plate 85 again and adhere to the surface of the substrate W as foreign matter. Hereinafter, an abnormality in which fumes diffuse to a higher position is referred to as a fume abnormality.

Therefore, the fume abnormality may be adopted as the monitoring target. Hereinafter, a specific example of a fume monitoring process for monitoring the occurrence or non-occurrence of the fume abnormality will be described.

Figure 30:
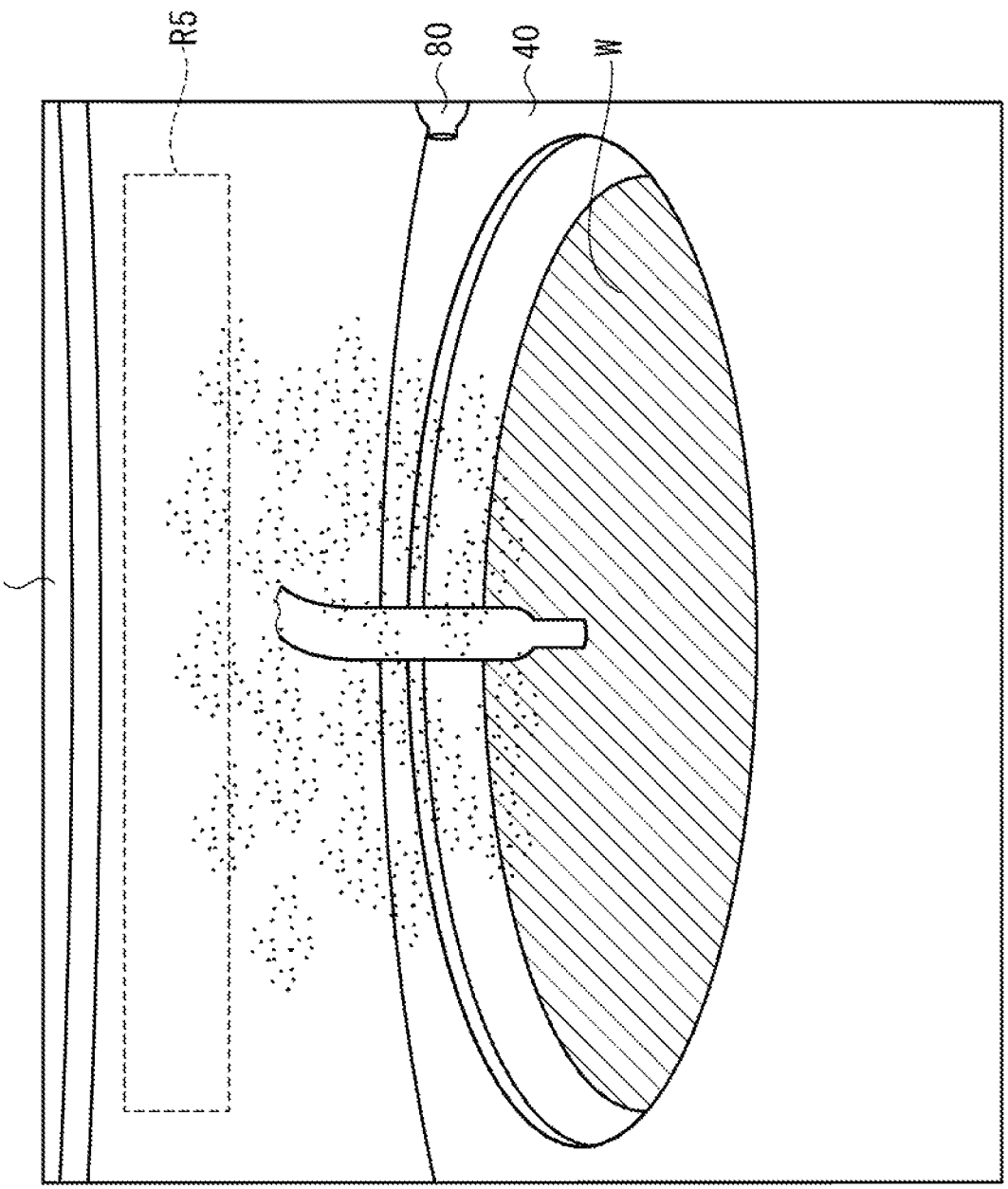
FIG. 30 is a view schematically showing an example of the captured image data.

FIG. 30 is a view schematically showing an example of captured image data acquired in the extrusion step. The captured image data of FIG. 30 includes fumes. In the example of FIG. 30, the fumes have spread to the vicinity of the lower surface of the shielding plate 85. That is, FIG. 30 shows a state where the fume abnormality has occurred.

In the example of FIG. 30, a fume determination region R5 is set in the captured image data. The fume determination region R5 is a region above the substrate W and is a region where the fumes do not reach in the normal extrusion step. The pixel values in the fume determination region R5 are different between when there are fumes and when there are no fumes.

Therefore, the monitoring processor 91 determines whether or not the fume abnormality has occurred based on the pixel value of the fume determination region R5. For example, the monitoring processor 91 calculates a difference between the captured image data acquired before the generation of the fumes and the captured image data acquired during the extrusion step to acquire a difference image. Next, the monitoring processor 91 calculates the average value of the pixel values in the fume determination region R5 in the difference image. When fumes are present in the fume determination region R5, the average value is large.

Therefore, the monitoring processor 91 determines whether or not the average value is equal to or larger than a predetermined first fume reference value, and sets the average value as the integration target value when the average value is equal to or larger than the first fume reference value. Next, the monitoring processor 91 calculates an excess value (=integration target value−first fume reference value) of the average value with respect to the first fume reference value and sequentially integrates the excess value for each captured image data to calculate an integrated value. Next, the monitoring processor 91 determines whether or not the integrated value is equal to or larger than a predetermined second fume reference value, and determines that the fume abnormality has occurred when the integrated value is equal to or larger than the second fume reference value.

In such a fume monitoring process, the resolution of the captured image data may be low because it is not highly necessary to know the accurate position of the fume generation region. Further, the frame rate may also be low because the occurrence period of the fume abnormality is not so short.

Therefore, the condition setter 92 may set the resolution to the low resolution and the frame rate to the low frame rate as the resolution condition of the captured image data used for the fume monitoring process. In other words, the condition setter 92 may set the resolution to the low resolution and the frame rate to the low frame rate as the imaging condition in the execution period of the extrusion step. Accordingly, the monitoring processor 91 can monitor the fume abnormality with a low processing load.

<Crystallization in Chamber 10>

For example, a volatile component or the like of the processing liquid may adhere to each of the component in the chamber 10, and the components in the chamber 10 may be crystallized. Hereinafter, such an abnormality is referred to as a crystal abnormality.

Therefore, the crystal abnormality may be adopted as the monitoring target. Hereinafter, a specific example of a crystal monitoring process for monitoring the occurrence or non-occurrence of the crystal abnormality will be described.

The crystal monitoring process is performed, for example, in a state where the substrate W is not carried into the processing unit 1 and each component in the processing unit 1 is stopped at an initial position. That is, the crystal monitoring process is performed in a standby state where no process is performed on the substrate W. This crystal monitoring process does not need to be performed for each processing of the substrate W but is performed, for example, every time the number of processed substrates W becomes a predetermined number or more, or when a predetermined period has elapsed since the previous crystal monitoring process.

The monitoring processor 91 may determine the occurrence or non-occurrence of the crystal abnormality by comparing reference image data acquired by imaging the inside of the normal chamber 10 in the standby state with captured image data acquired by the camera 70. For example, a crystal determination region to be crystallized may be set in advance, and when the sum of pixel values in a difference image between the reference image and the captured image data in the crystal determination region is large, it may be determined that the crystal abnormality has occurred.

The high resolution is not necessary because the need to accurately detect the position and shape of the crystal abnormality is not so high. Further, the high frame rate is also not necessary because the crystal abnormality occurs continuously once it occurs. Therefore, the condition setter 92 may set the resolution to the low resolution and the frame rate to the low frame rate as the imaging condition of the captured image data used for the crystal monitoring process. In other words, the condition setter 92 may set the resolution to the low resolution and the frame rate to the low frame rate as the imaging condition in the standby period when the processing unit 1 is stopped. Accordingly, the monitoring processor 91 can monitor the occurrence or non-occurrence of the crystal abnormality with a low processing load.

<Long and Short Occurrence Periods of Abnormality Occurs and High and Low Frame Rates>

As described above, the condition setter 92 sets the frame rate to the low frame rate in an execution period of a step in which a first abnormality (e.g., drying abnormality, fume abnormality, crystal abnormality, etc.) that occurs in a first occurrence period is the monitoring target. On the other hand, the condition setter 92 sets the frame rate to the high frame rate in an execution period of a step in which a second abnormality (e.g., liquid splash, dripping, outflow, etc.) that can occur in a second occurrence period shorter than the first occurrence period is the monitoring target.

Thus, for the first abnormality with a longer occurrence period, the frame rate is set to a first frame rate that is low, so that the processing load of the monitoring processor 91 can reduce the processing load. For the second abnormality with a short occurrence period, the frame rate is set to the second frame rate that is high, so that the monitoring processor 91 can appropriately monitor the occurrence or non-occurrence of the second abnormality.

<Cleaning in Chamber 10>

The processing unit 1 may be provided with a chamber nozzle (not shown) for cleaning the inside of the chamber 10. The chamber nozzle discharges a cleaning liquid (e.g., pure water) in the chamber 10 to clean various components in the chamber 10 (chamber cleaning step). The chamber cleaning step is performed in a state where the substrate W is not carried into the processing unit 1. That is, the chamber cleaning step is performed in a standby state where the substrate W is not processed. For example, the processing controller 93 may perform the chamber cleaning step by discharging the cleaning liquid from the chamber nozzle every time the substrate W is carried in, may perform the chamber cleaning step every time the number of processed substrates W becomes a predetermined number or more, or may perform the chamber cleaning step when a predetermined period has elapsed from the previous chamber cleaning step.

As the monitoring target, an ejection abnormality of the cleaning liquid ejected from the tip of the chamber nozzle may be adopted. Hereinafter, a specific example of a chamber cleaning monitoring process will be described.

The camera 70 sequentially acquires captured image data in the chamber cleaning step. The captured image data includes the tip of the chamber nozzle. In the captured image data, an ejection determination region including a region extending in the ejection direction from the tip of the chamber nozzle is set. The monitoring processor 91 determines whether or not the ejection abnormality has occurred based on the pixel values in the ejection determination region in the captured image data. For example, the ejection abnormality may be determined by comparing the ejection determination region of reference image data when the processing liquid is normally ejected with the ejection determination region of the captured image data.

Such an ejection abnormality does not directly affect the processing of the substrate W, and hence the high resolution or the high frame rate is not required. Thus, the condition setter 92 may set the resolution to the low resolution and the frame rate to the low frame rate as the imaging conditions of the captured image data used for the chamber cleaning monitoring process. In other words, the condition setter 92 may set the resolution to the low resolution and the frame rate to the low frame rate as the imaging condition in the execution period of the chamber cleaning step. Accordingly, the monitoring processor 91 can monitor the occurrence or non-occurrence of the ejection abnormality with a low processing load.

<Another Example of Imaging Conditions>

In the above examples, the resolution and the frame rate have been adopted as examples of the imaging conditions. However, the present invention is not necessarily limited thereto. For example, the size of the visual field range appearing in the captured image data may be adopted as the imaging condition. For example, the camera 70 can image the inside of the chamber 10 in a visual field range V1 (cf. FIG. 2) and can image the inside of the chamber 10 in a visual field range V2. The visual field range V1 is wider than the visual field range V2. The viewing angle of the visual field range V1 in a plan view is, for example, 120 degrees, and the viewing angle of the visual field range V2 is, for example, 60 degrees.

The captured image data acquired in the visual field range V2 includes the entire opening of the processing cup 40 but includes only the vicinity of the opening. The captured image data acquired in the visual field range V1 includes the entire opening of the processing cup 40 and a region away from the opening.

Figure 31:
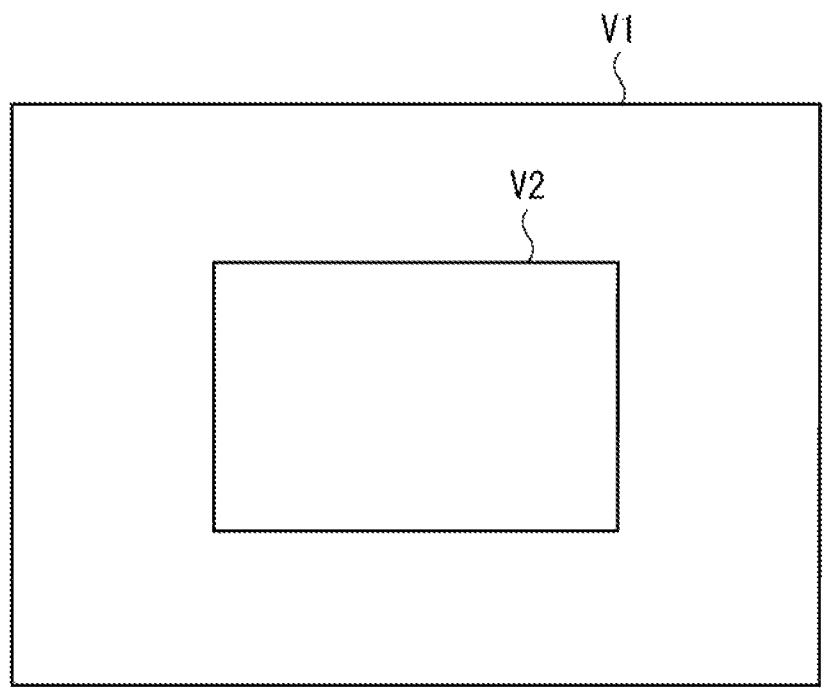
FIG. 31 is a diagram for explaining a visual field range.

FIG. 31 is a view schematically showing an example of captured image data having different visual field ranges. In the example of FIG. 31, captured image data acquired by cutting out a predetermined region as the visual field range V2 in the captured image data acquired in the wide visual field range V1 corresponds to the captured image data acquired in the visual field range V2. Therefore, the data amount of the captured image data in the visual field range V2 is smaller than the data amount of the captured image data in the visual field range V1.

For example, the camera 70 can adjust the visual field range by cutting out a partial region of the image data read from all the light receiving elements. Alternatively, the camera 70 may read data of only the light receiving element in a region designated as the visual field range. This also enables the camera 70 to change the visual field range.

It is not always necessary to use captured image data acquired in the widest visual field range V1 in all the above-described monitoring processes for the monitoring targets. For example, in the position monitoring process for monitoring the position of the nozzle, it is sufficient that the tip of each nozzle is included in the captured image data, and the visual field range V2 is sufficient.

Therefore, the condition setter 92 may set the visual field range in accordance with the monitoring target. FIG. 32 is a table showing an example of the monitoring targets and the imaging conditions. In the example of FIG. 32, the resolution may be set to either the high resolution or the low resolution for the shape abnormality of the substrate W. In the above example, since the algorithms for monitoring the shape abnormality and the holding abnormality of the substrate W are the same, the resolution may be set to the high resolution when the holding abnormality is also monitored.

Further, as an imaging condition in a period when monitoring processes on a plurality of monitoring targets are performed in parallel, the condition setter 92 may adopt an imaging condition with a larger data amount. For example, when both the monitoring process requiring a large visual field range and the monitoring process not requiring a large visual field range are performed in parallel, the condition setter 92 sets the visual field range to a large visual field range as the imaging condition in the step. For example, in the extrusion step of extruding sulfuric acid with hydrogen peroxide and ejecting the sulfuric acid from the first nozzle 30, it is conceivable to perform the monitoring process for both the fume abnormality and the ejection state of the processing liquid. In this case, the condition setter 92 sets the visual field range to a large range, sets the resolution to the low resolution, and sets the frame rate to the high frame rate as the imaging conditions in the extrusion step.

<Image Condition>

In the above example, the condition setter 92 has set the imaging conditions of the camera 70. However, the present invention is not necessarily limited thereto. For example, the camera 70 may acquire captured image data under predetermined imaging conditions. As the predetermined imaging conditions, for example, a visual field range having a large visual field range is set, a resolution is set to the high resolution, and a frame rate is set to the high frame rate. The controller 9 may change the image conditions of the captured image data by performing image processing on the captured image data received from the camera 70. The image conditions here are the same as the imaging conditions. However, the image conditions are not directly used to control the camera 70. The image conditions are, for example, the visual field range, the resolution, and the frame rate of the captured image data.

Figure 33:
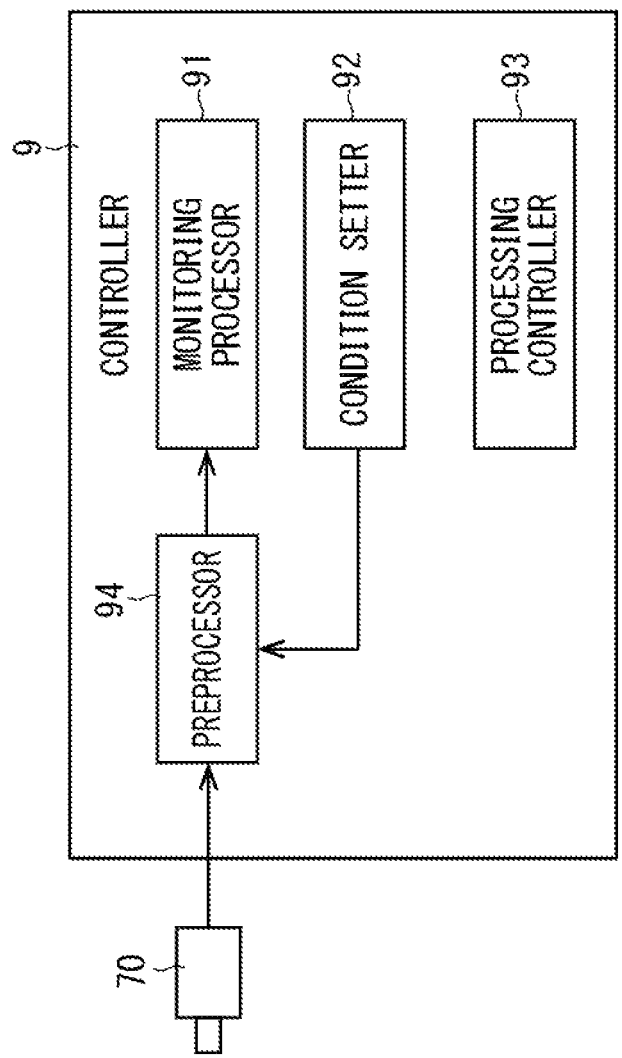
FIG. 33 is a functional block diagram schematically showing an example of the internal configuration of the controller.

FIG. 33 is a functional block diagram schematically showing an example of an internal configuration of the controller 9. The controller 9 includes the monitoring processor 91, the condition setter 92, the processing controller 93, and a preprocessor 94.

The preprocessor 94 changes the image conditions of the captured image data received from the camera 70. For example, the preprocessor 94 acquires captured image data having a small visual field range V2 by cutting out a partial region of the captured image data. Moreover, the preprocessor 94, for example, averages pixel values of adjacent nx vertical×ny horizontal pixels in the captured image data to make these pixels into a single pixel to acquire captured image data with low resolution. Furthermore, the preprocessor 94, for example, skips at least one piece of captured image data sequentially acquired and deletes at least one piece of captured image data to acquire captured image data with a low frame rate.

As described above, the condition setter 92 specifies a monitoring target from monitoring target candidates in the chamber 10 and sets an image condition corresponding to the monitoring target.

The preprocessor 94 performs the processing described above on the captured image data so that the image condition of the captured image data received from the camera 70 matches the image condition set by the condition setter 92.

The monitoring processor 91 executes the monitoring process on the monitoring target based on the captured image data processed by the preprocessor 94.

By also executing this, the monitoring processor 91 can monitor the monitoring target based on the captured image data having the image condition corresponding to the monitoring target. Therefore, even when the camera 70 is used in which the imaging condition cannot be changed, the monitoring processor 91 can monitor the monitoring target based on the captured image data having the image condition corresponding to the monitoring target. Accordingly, as described above, the monitoring target can be monitored with high accuracy. Further, the processing load of the monitoring processor 91 can also be reduced as appropriate.

As described above, the substrate processing method and the substrate processing apparatus 100 have been described in detail, but the above description is exemplification in all aspects, and the substrate processing apparatus is not limited thereto. It is understood that innumerable modifications not exemplified can be assumed without departing from the scope of the present invention. The components described in the above embodiment and modifications can be appropriately combined or omitted so long as the components do not contradict each other.

For example, in the above example, the visual field range, the resolution, and the frame rate are adopted as the image conditions, but the image conditions are not necessarily limited thereto. For example, image conditions such as exposure time and white balance of the camera 70 may be changed in accordance with the monitoring target.

In the above example, the condition setter 92 changes the image condition by binary. For example, the condition setter 92 sets the resolution to either the high resolution or the low resolution in accordance with the monitoring target. However, the condition setter 92 may change the image condition (e.g., resolution) more finely in accordance with the monitoring target.

EXPLANATION OF REFERENCE SIGNS

1: processing unit
10: chamber
20: spin chuck
30: nozzle (first nozzle)
40: processing cup
60: nozzle (second nozzle)
65: nozzle (third nozzle)
80: nozzle (fixed nozzle)
9: controller
70: camera
100: substrate processing apparatus
W: substrate

The invention claimed is:

1. A substrate processing method, comprising:
   carrying a substrate into an inside of a chamber and holding said substrate;
   supplying a fluid to said substrate on the inside of said chamber;
   sequentially imaging the inside of said chamber by a camera to acquire image data;
   specifying a monitoring target based on a procedure of process regarding said substrate and changing an image condition of said image data based on said monitoring target that has been specified; and
   performing a monitoring process on said monitoring target based on said image data having said image condition corresponding to said monitoring target, wherein
   said image condition includes at least one of resolution and a frame rate of said image data and a size of a visual field range projected in said image data.

2. The substrate processing method according to claim 1, wherein
   in changing the image condition,
   said frame rate is set to a first frame rate as said image condition of said image data in a first period when at least one of a shape and a position of an object in said chamber is taken as said monitoring target, and said frame rate is set to a second frame rate higher than said first frame rate as said image condition of said image data in a second period when a state change over time in a processing liquid ejected as said fluid from a nozzle in said chamber is taken as said monitoring target.

3. The substrate processing method according to claim 2, wherein
in changing the image condition, said frame rate is set to said second frame rate as said image condition of said image data in a third period when at least one of a shape and a position of an object in said chamber and a state change over time in said processing liquid are taken as said monitoring target.

4. The substrate processing method according to claim 1, wherein
said resolution is set to a first resolution as said image condition of said image data in a first period when at least one of a shape and a position of an object in said chamber is taken as said monitoring target, and
said resolution is set to a second resolution lower than said first resolution as said image condition of said image data in a second period when a state change over time in a processing liquid ejected as said fluid from a nozzle in said chamber is taken as said monitoring target.

5. The substrate processing method according to claim 4, wherein
in changing the image condition, said resolution is set to said first resolution as said image condition of said image data in a third period when at least one of a shape and a position of an object in said chamber and a state change over time in said processing liquid are taken as said monitoring target.

6. The substrate processing method according to claim 2, wherein
said monitoring target including at least one of the shape and the position of said object includes at least one of:
at least one of a shape and a position of said substrate;
at least one of a shape and a position of said nozzle; and
at least one of a shape and a position of a processing cup that receives said fluid scattered from a periphery of said substrate.

7. The substrate processing method according to claim 2, wherein
said monitoring target including the state change over time in said processing liquid includes at least one of an ejection start timing and an ejection stop timing of said processing liquid, a liquid splash of said processing liquid on said substrate, and dripping and outflow of said processing liquid from said nozzle.

8. The substrate processing method according to claim 1, wherein
in changing the image condition,
said frame rate is set to a first frame rate as said image condition of said image data in a fourth period when occurrence or non-occurrence of a first abnormality occurring in a first occurrence period in said chamber is taken as said monitoring target, and
said frame rate is set to a second frame rate higher than said first frame rate as said image condition of said image data in a fifth period when occurrence or non-occurrence of a second abnormality occurring in a second occurrence period shorter than said first occurrence period in said chamber is taken as said monitoring target.

9. The substrate processing method according to claim 1, wherein
changing the image condition includes a step of setting said image condition as an imaging condition, and
in imaging the inside of said chamber, said camera acquires said image data using said image condition corresponding to said monitoring target as an imaging condition.

10. The substrate processing method according to claim 1, wherein
in imaging the inside of said chamber, said camera acquires said image data under a predetermined imaging condition, and
image processing is performed on said image data acquired by said camera to acquire said image data having said image condition corresponding to said monitoring target.

11. A substrate processing apparatus, comprising:
a substrate holder that holds a substrate on an inside of a chamber;
a nozzle that supplies a fluid to said substrate on the inside of said chamber;
a camera that sequentially images the inside of said chamber to acquire image data; and
a controller that specifies a monitoring target based on a procedure of process regarding said substrate, changes an image condition of said image data based on said monitoring target that has been specified, and performs a monitoring process on said monitoring target based on said image data having said image condition corresponding to said monitoring target, wherein
said image condition includes at least one of resolution and a frame rate of said image data and a size of a visual field range projected in said image data.

* * * * *